(12) United States Patent
Jang

(10) Patent No.: US 11,658,668 B2
(45) Date of Patent: May 23, 2023

(54) SEMICONDUCTOR DEVICE

(71) Applicant: SK hynix Inc., Icheon-si (KR)

(72) Inventor: Sung Chun Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 209 days.

(21) Appl. No.: 16/993,940

(22) Filed: Aug. 14, 2020

(65) Prior Publication Data

US 2020/0373929 A1 Nov. 26, 2020

Related U.S. Application Data

(63) Continuation-in-part of application No. 16/212,421, filed on Dec. 6, 2018, now Pat. No. 10,795,401.

(30) Foreign Application Priority Data

Jun. 14, 2018 (KR) ........................ 10-2018-0068348

(51) Int. Cl.
| | | |
|---|---|---|
| *G06F 1/12* | (2006.01) | |
| *G06F 13/42* | (2006.01) | |
| *H04L 5/00* | (2006.01) | |
| *H04L 7/00* | (2006.01) | |
| *H03L 7/18* | (2006.01) | |
| *H03L 7/081* | (2006.01) | |
| *G06F 1/06* | (2006.01) | |
| *G11C 7/22* | (2006.01) | |

(52) U.S. Cl.
CPC .................. *H03L 7/18* (2013.01); *G06F 1/06* (2013.01); *G06F 1/12* (2013.01); *H03L 7/0812* (2013.01); *G11C 7/222* (2013.01)

(58) Field of Classification Search
CPC ......... H03L 7/18; H03L 7/0812; H03L 7/085; H03L 7/087; H03L 7/091; H03L 7/10; G06F 1/06; G06F 1/12; G11C 7/222
See application file for complete search history.

(56) References Cited

U.S. PATENT DOCUMENTS

| | | | |
|---|---|---|---|
| 6,173,432 B1 | 1/2001 | Harrison | |
| 7,728,636 B2 | 6/2010 | Spirkl et al. | |
| 8,108,709 B2 | 1/2012 | Jang et al. | |
| 9,733,855 B1 * | 8/2017 | Ong .......................... | G06F 1/12 |

(Continued)

FOREIGN PATENT DOCUMENTS

| | | |
|---|---|---|
| CN | 1959838 A | 5/2007 |
| CN | 103516335 A | 1/2014 |

(Continued)

*Primary Examiner* — Xuxing Chen
(74) *Attorney, Agent, or Firm* — William Park & Associates Ltd.

(57) ABSTRACT

A semiconductor device includes an internal command generation circuit configured to generate a synthesized command from a command which is inputted in synchronization with any one of a first internal clock and a third internal clock generated by dividing a frequency of a clock, and configured to generate a first internal command and a second internal command by delaying the synthesized command depending on a detected input time of the command. The semiconductor device also includes a data transmission circuit configured to generate transmission data from data in synchronization with any one of the first internal command and the second internal command.

17 Claims, 52 Drawing Sheets

(56) References Cited

U.S. PATENT DOCUMENTS

| | | | |
|---|---|---|---|
| 9,858,972 B1* | 1/2018 | Kim | G11C 7/222 |
| 10,141,942 B1 | 11/2018 | Satoh | |
| 2003/0174575 A1 | 9/2003 | Kono | |
| 2006/0268655 A1 | 11/2006 | Lin | |
| 2007/0070731 A1 | 3/2007 | Choi | |
| 2009/0290445 A1 | 11/2009 | Kinoshita et al. | |
| 2010/0085824 A1* | 4/2010 | Nagata | G11C 11/4076 |
| | | | 365/194 |
| 2010/0177589 A1 | 7/2010 | Kinoshita et al. | |
| 2011/0085387 A1* | 4/2011 | Lee | G11C 7/1096 |
| | | | 365/189.02 |
| 2014/0340969 A1* | 11/2014 | Jung | G11C 11/4076 |
| | | | 365/189.05 |
| 2015/0009774 A1* | 1/2015 | Ko | G11C 8/06 |
| | | | 365/230.08 |
| 2016/0118094 A1 | 4/2016 | Hyun et al. | |
| 2016/0322964 A1 | 11/2016 | Miyano | |
| 2017/0125077 A1 | 5/2017 | Choi et al. | |
| 2018/0040355 A1* | 2/2018 | Kim | G06F 11/2284 |
| 2018/0053567 A1* | 2/2018 | Kim | G11C 7/1084 |
| 2018/0122439 A1 | 5/2018 | Bell et al. | |
| 2018/0173270 A1 | 6/2018 | Lee | |
| 2018/0286470 A1 | 10/2018 | Miyano et al. | |

FOREIGN PATENT DOCUMENTS

| | | |
|---|---|---|
| KR | 101194380 B1 | 10/2012 |
| KR | 1020180038341 A | 4/2018 |

* cited by examiner

FIG.4

| α | PH<0:1> | DCLK |
|---|---|---|
| '1' | '00' | ICLK |
| '0' | '10' | QCLK |
| '1' | '11' | IBCLK |
| '0' | '01' | QBCLK |

FIG.52

| PH<0:1> | Delay amount |
|---|---|
| '00' | 1st Delay amount |
| '10' | 2nd Delay amount |
| '11' | 3rd Delay amount |
| '01' | 4th Delay amount |

SEMICONDUCTOR DEVICE

CROSS-REFERENCE TO RELATED APPLICATION

This application is a continuation-in-part of U.S. patent application Ser. No. 16/212,421, filed on Dec. 6, 2018, and claims priority under 35 U.S.C. § 119(a) to Korean Patent Application No. 10-2018-0068348, filed on Jun. 14, 2018. Both applications are incorporated herein by reference in their entirety.

BACKGROUND

1. Technical Field

Embodiments of the present disclosure relate to a semiconductor device which inputs and outputs data depending on an input time of a command.

2. Related Art

A semiconductor device performs, after a command is applied and a latency elapses, an internal operation corresponding to the command. The latency is stored in a mode register through a mode register set operation. The semiconductor device may set a delay period corresponding to the latency, by using a delay circuit, when the internal operation is performed after the command is applied.

Meanwhile, the semiconductor device uses a delay-locked loop for synchronization of a clock used in a semiconductor system and an internal clock used in the semiconductor device. The semiconductor device generates a delay-locked clock by delaying an external clock by a preset delay period through using the delay-locked loop, and transmits data by using the delay-locked clock.

SUMMARY

In an embodiment, a semiconductor device may include: an internal command generation circuit configured to generate a synthesized command from a command which is inputted in synchronization with any one of a first internal clock and a third internal clock generated by dividing a frequency of a clock, and generate a first internal command and a second internal command by delaying the synthesized command depending on a detected input time of the command; and a data transmission circuit configured to generate transmission data from data in synchronization with any one of the first internal command and the second internal command.

In an embodiment, a semiconductor device may include: an internal command generation circuit configured to generate a synthesized command from a command in synchronization with any one of a first internal clock and a third internal clock which have different phases, delay the synthesized command by a delay amount set by a phase control signal, and generate a first internal command and a second internal command from the delayed synthesized command; and a data transmission circuit configured to generate transmission data from data in synchronization with any one of the first internal command and the second internal command.

According to some embodiments of the disclosure, a synthesized command is generated by synthesizing first and second latch commands which are selectively generated depending on an input time of a command, and first and second internal commands are generated by delaying the synthesized command through one delay circuit. As a consequence, because delay circuits for delaying the first and second internal commands are merged, an area may be reduced.

Also, according to some embodiments of the disclosure, data is inputted and outputted by detecting an input time of the command and selectively generating the first and second internal commands depending on a detection result. As a consequence, the reliability of data input/output operations may be secured.

Further, according to some embodiments of the disclosure, a delay amount by which a command and internal clocks are delayed may be continuously controlled, and data is inputted and outputted by internal commands generated from the command with a controlled delay amount. As a consequence, the reliability of data input/output operations may be secured.

BRIEF DESCRIPTION OF THE DRAWINGS

FIG. 4 shows a table to assist in the description of the operation of the clock delay circuit shown in FIG. 3.

FIG. 8 shows a circuit diagram illustrating the reset delay circuit included in the latency command generation circuit shown in

FIG. 6.

FIG. 26 shows a circuit diagram illustrating the delay correction circuit included in the command delay circuit shown in

FIG. 18.

FIG. 52 is an example of a table to assist in the description of a delay amount of a delay circuit depending on a phase control signal in accordance with the embodiment.

DETAILED DESCRIPTION

Hereinafter, a semiconductor device is described with reference to the accompanying drawings through various examples of embodiments.

Various embodiments are directed to a semiconductor device capable of generating a latch command by delaying a command by a period set by a latency and transmitting data in synchronization with the latch command.

According to some embodiments, when generating a delay-locked clock by delaying an internal clock in a delay-locked loop, the delay-locked clock is selectively driven by some internal clocks selected from among internal clocks, through using a phase rotator. As a consequence, even though a delay period for delaying an internal clock in the delay-locked loop increases, it is not necessary to add a delay circuit and thus it is possible to prevent power and area consumption from increasing.

Also in accordance with some embodiments, by generating a delay command through latching an internal command sequentially by some internal clocks selected from among the internal clocks, even though a delay period for delaying an internal command increases, it is not necessary to add a delay circuit and thus it is possible to prevent power and area consumption from increasing.

Further in accordance with some embodiments, by adjusting a time at which the delay command is generated, by a correction code, when a phase control signal has a preset logic level combination, it is possible to prevent a time at which the delay command is generated, from being advanced or deferred, when the phase control signal has the preset logic level combination.

Figure 1:
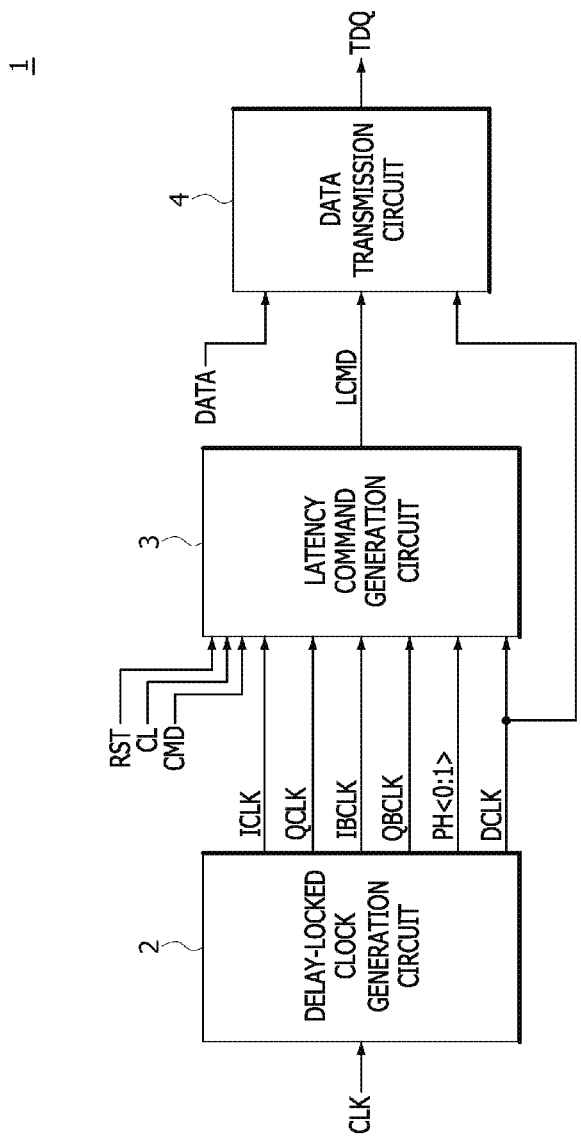
FIG. 1 shows a block diagram illustrating a configuration of a semiconductor device in accordance with an embodiment.

As shown in FIG. 1, a semiconductor device 1 in accordance with an embodiment may include a delay-locked clock generation circuit 2, a latency command generation circuit 3, and a data transmission circuit 4.

The delay-locked clock generation circuit 2 may generate a first internal clock ICLK, a second internal clock QCLK, a third internal clock IBCLK, a fourth internal clock QBCLK, a phase control signal PH<0:1>, and a delay-locked clock DCLK. A clock CLK may be applied from a memory controller (not shown) positioned outside the semiconductor device 1. The delay-locked clock generation circuit 2 may generate the first internal clock ICLK, the second internal clock QCLK, the third internal clock IBCLK, and the fourth internal clock QBCLK by dividing the clock CLK. The cycle of each of the first internal clock ICLK, the second internal clock QCLK, the third internal clock IBCLK, and the fourth internal clock QBCLK may be set to N times the cycle of the clock CLK. N may be set to a natural number. In the present embodiment, N may be set to 2. The second internal clock QCLK may be set to have a phase later by 90 degrees than the first internal clock ICLK. The second internal clock QCLK may be generated by delaying the first internal clock ICLK by a period corresponding to the half cycle of the clock CLK. The third internal clock IBCLK may be set to have a phase later by 90 degrees than the second internal clock QCLK. The third internal clock IBCLK may be generated by delaying the second internal clock QCLK by the period corresponding to the half cycle of the clock CLK. The fourth internal clock QBCLK may be set to have a phase later by 90 degrees than the third internal clock IBCLK. The fourth internal clock QBCLK may be generated by delaying the third internal clock IBCLK by the period corresponding to the half cycle of the clock CLK. For example, the phases of the first internal clock and the third internal clock may be opposite to each other in that the first internal clock and the third internal clock are 180 degrees out of phase. Similarly, the phases of the second internal clock and the fourth internal clock may be opposite to each other in that the second internal clock and the fourth internal clock are 180 degrees out of phase.

The delay-locked clock generation circuit 2 may drive the delay-locked clock DCLK by at least one of the first internal clock ICLK, the second internal clock QCLK, the third internal clock IBCLK, and the fourth internal clock QBCLK depending on the logic level combination of the phase control signal PH<0:1>. The delay-locked clock generation circuit 2 may generate the delay-locked clock DCLK, which is driven to be the same as one of the first internal clock ICLK, the second internal clock QCLK, the third internal clock IBCLK, and the fourth internal clock QBCLK, depending on the logic level combination of the phase control signal PH<0:1>. The delay-locked clock generation circuit 2 may be realized by a phase rotator. The delay-locked clock generation circuit 2 may generate the phase control signal PH<0:1> by delaying the delay-locked clock DCLK by a preset delay period and then comparing the delayed delay-locked clock DCLK with one of the first internal clock ICLK, the second internal clock QCLK, the third internal clock IBCLK, and the fourth internal clock QBCLK. In the present embodiment, the delay-locked clock generation circuit 2 may generate the phase control signal PH<0:1> by delaying the delay-locked clock DCLK by the preset delay period and then comparing the delayed delay-locked clock DCLK with the first internal clock ICLK. The logic level combination of the phase control signal PH<0:1> may be set variously depending on the phases of the delay-locked clock DCLK and the first internal clock ICLK. A detailed configuration and operation of the delay-locked clock generation circuit 2 is described later with reference to FIGS. 2 to 5. In particular, the configuration and operation of the phase rotator included in the delay-locked clock generation circuit 2 is described later in detail with reference to FIGS. 3 to 5. Because the delay-locked clock generation circuit 2 uses the phase rotator, even though a delay period for delaying the first internal clock ICLK increases, it is not necessary to add a delay circuit and thus it is possible to prevent power and area consumption from increasing.

The latency command generation circuit 3 may generate a latency command LCMD from a command CMD in response to a reset signal RST, a column latency signal CL, the first internal clock ICLK, the second internal clock QCLK, the third internal clock IBCLK, the fourth internal clock QBCLK, the phase control signal PH<0:1>, and the delay-locked clock DCLK. The command CMD may be applied from the memory controller (not shown) positioned outside the semiconductor device 1. The latency command generation circuit 3 may generate a delayed command (see the reference symbol DCMD of FIG. 6) through latching an internal command (see the reference symbol ICMD of FIG. 6) sequentially by clocks selected depending on the logic level combination of the phase control signal PH<0:1> from among the first internal clock ICLK, the second internal clock QCLK, the third internal clock IBCLK, and the fourth internal clock QBCLK. The latency command generation circuit 3 may generate the latency command LCMD by delaying the delayed command (see the reference symbol DCMD of FIG. 6) by a period that is determined by the reset signal RST and the column latency signal CL. The latency command generation circuit 3 may include a command delay circuit (see the reference numeral 34 of FIG. 6), which is realized by an equivalent circuit of the phase rotator included in the delay-locked clock generation circuit 2. A detailed configuration and operation of the latency command generation circuit 3 is described later with reference to FIGS. 6 to 40. Because the latency command generation circuit 3 includes the command delay circuit (see the reference numeral 34 of FIG. 6), which is realized by an equivalent circuit of a phase rotator, even though a delay period for delaying the internal command (see the reference symbol ICMD of FIG. 6) increases, it is not necessary to add a delay circuit, and thus it is possible to prevent power and area consumption from increasing.

The data transmission circuit 4 may generate transmission data TDQ from data DATA in synchronization with the delay-locked clock DCLK when the latency command LCMD is generated. The latency command LCMD may be generated to generate the transmission data TDQ when a period set by a latency elapses after the internal command ICMD for a read operation is generated. As used herein, the word "when" does not always imply simultaneity. It can also indicate that a condition is met. For example, as written above, the transmission data TDQ is generated when the condition of the latency command LCMD being generated is true. Use of the word "when" does not necessarily imply that the transmission data TDQ and the latency command LCMD are generated at the same time.

Figure 2:
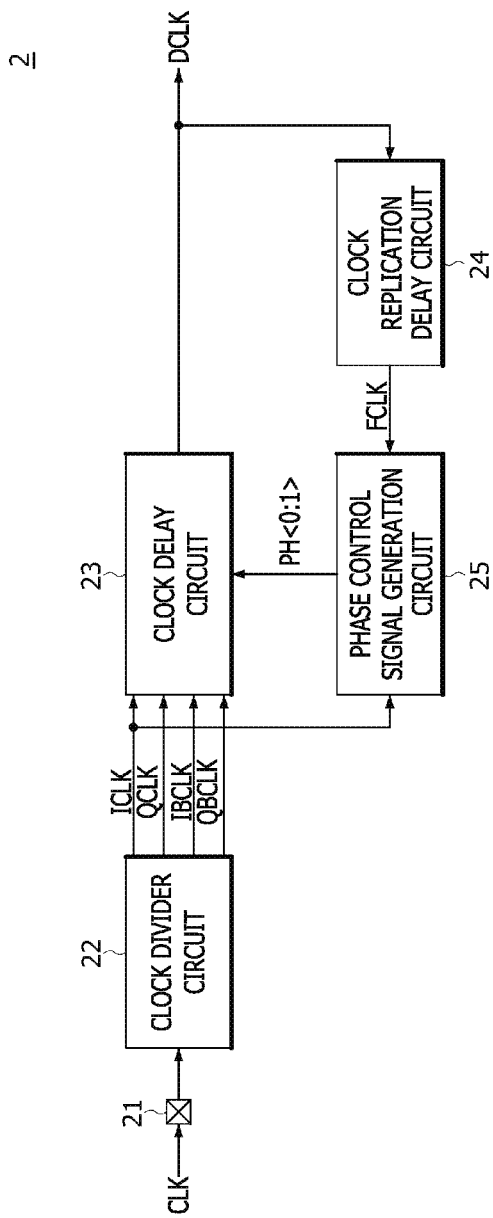
FIG. 2 shows a block diagram illustrating a configuration of the delay-locked clock generation circuit included in the semiconductor device shown in FIG. 1.

Referring to FIG. 2, the delay-locked clock generation circuit 2 may include a clock pad 21, a clock divider circuit 22, a clock delay circuit 23, a clock replication delay circuit 24, and a phase control signal generation circuit 25.

The clock divider circuit 22 may receive the clock CLK through the clock pad 21. The clock divider circuit 22 may generate the first internal clock ICLK, the second internal clock QCLK, the third internal clock IBCLK, and the fourth internal clock QBCLK by dividing the clock CLK. The cycle of each of the first internal clock ICLK, the second internal clock QCLK, the third internal clock IBCLK, and the fourth internal clock QBCLK may be set to two times the cycle of the clock CLK. The second internal clock QCLK may be set to have a phase later by 90 degrees than the first internal clock ICLK. The second internal clock QCLK may be generated by delaying the first internal clock ICLK by the period corresponding to the half cycle of the clock CLK. The third internal clock IBCLK may be set to have a phase later by 90 degrees than the second internal clock QCLK. The third internal clock IBCLK may be generated by delaying the second internal clock QCLK by the period corresponding to the half cycle of the clock CLK. The fourth internal clock QBCLK may be set to have a phase later by 90 degrees than the third internal clock IBCLK. The fourth internal clock QBCLK may be generated by delaying the third internal clock IBCLK by the period corresponding to the half cycle of the clock CLK.

The clock delay circuit 23 may generate the delay-locked clock DCLK by delaying the first internal clock ICLK by a first delay period D1 that is determined depending on the logic level combination of the phase control signal PH<0:1>. The clock delay circuit 23 may drive the delay-locked clock DCLK by at least one of the first internal clock ICLK, the second internal clock QCLK, the third internal clock IBCLK, and the fourth internal clock QBCLK depending on the logic level combination of the phase control signal PH<0:1>. As the clock delay circuit 23 is realized by a phase rotator, even though a delay period for delaying the first internal clock ICLK increases, it is not necessary to add a delay circuit, and thus it is possible to prevent power and area consumption from increasing.

The clock delay circuit 23 may drive the delay-locked clock DCLK in response to the first internal clock ICLK and the third internal clock IBCLK in the case where the logic level combination of the phase control signal PH<0:1> is '00.' The case where the logic level combination of the phase control signal PH<0:1> is '00' means that all of the bits included in the phase control signal PH<0:1> are at logic low levels. In the case where the logic level combination of the phase control signal PH<0:1> is '00,' the clock delay circuit 23 may pull-up drive the delay-locked clock DCLK in synchronization with the rising edge of the first internal clock ICLK and may pull-down drive the delay-locked clock DCLK in synchronization with the rising edge of the third internal clock IBCLK. A rising edge means a time at which a logic low level transitions to a logic high level, pull-up driving means driving to a logic high level, and pull-down driving means driving to a logic low level.

The clock delay circuit 23 may drive the delay-locked clock DCLK in response to the second internal clock QCLK and the fourth internal clock QBCLK in the case where the logic level combination of the phase control signal PH<0:1> is '10.' The case where the logic level combination of the phase control signal PH<0:1> is '10' means that the first bit PH<0> of the phase control signal PH<0:1> is at a logic high level and the second bit PH<1> of the phase control signal PH<0:1> is at a logic low level. In the case where the logic level combination of the phase control signal PH<0:1> is '10,' the clock delay circuit 23 may pull-up drive the delay-locked clock DCLK in synchronization with the rising edge of the second internal clock QCLK and may pull-down drive the delay-locked clock DCLK in synchronization with the rising edge of the fourth internal clock QBCLK. The clock delay circuit 23 may drive the delay-locked clock DCLK in response to the third internal clock IBCLK and the first internal clock ICLK in the case where the logic level combination of the phase control signal PH<0:1> is '11.' The case where the logic level combination of the phase control signal PH<0:1> is '11' means that all of the bits included in the phase control signal PH<0:1> are at logic high levels. In the case where the logic level combination of the phase control signal PH<0:1> is '11,' the clock delay circuit 23 may pull-up drive the delay-locked clock DCLK in synchronization with the rising edge of the third internal clock IBCLK and may pull-down drive the delay-locked clock DCLK in synchronization with the rising edge of the first internal clock ICLK. The clock delay circuit 23 may drive the delay-locked clock DCLK in response to the fourth internal clock QBCLK and the second internal clock QCLK in the case where the logic level combination of the phase control signal PH<0:1> is '01.' The case where the logic level combination of the phase control signal PH<0:1> is '01' means that the first bit PH<0> of the phase control signal PH<0:1> is at a logic low level and the second bit PH<1> of the phase control signal PH<0:1> is at a logic high level. In the case where the logic level combination of the phase control signal PH<0:1> is '01,' the clock delay circuit 23 may pull-up drive the delay-locked clock DCLK in synchronization with the rising edge of the fourth internal clock QBCLK and may pull-down drive the delay-locked clock DCLK in synchronization with the rising edge of the second internal clock QCLK.

The clock replication delay circuit 24 may delay the delay-locked clock DCLK by a second delay period D2 and thereby generate a feedback clock FCLK. The second delay period D2 may be set to a value modeled by a time that is taken for the delay-locked clock DCLK to reach the data transmission circuit 4 from the clock delay circuit 23.

The phase control signal generation circuit 25 may generate the phase control signal PH<0:1> by comparing the feedback clock FCLK and the first internal clock ICLK. The phase control signal generation circuit 25 may adjust the phase control signal PH<0:1> to increase the first delay period D1 of the clock delay circuit 23 in the case where the phase of the first internal clock ICLK is earlier than the phase of the feedback clock FCLK. In the present embodiment, as the logic level combination of the phase control signal PH<0:1> changes in the sequence of '00,' '10,' '11,' '01,' and '00,' the first delay period D1 of the clock delay circuit 23 may be increased. For example, as the logic level combination of the phase control signal PH<0:1> is adjusted from '00' to '10,' the first delay period D1 of the clock delay circuit 23 may be increased by a period corresponding to the half cycle of the clock CLK, and as the logic level combination of the phase control signal PH<0:1> is adjusted from '00' to '11,' the first delay period D1 of the clock delay circuit 23 may be increased by a period corresponding to one cycle of the clock CLK.

Figure 3:
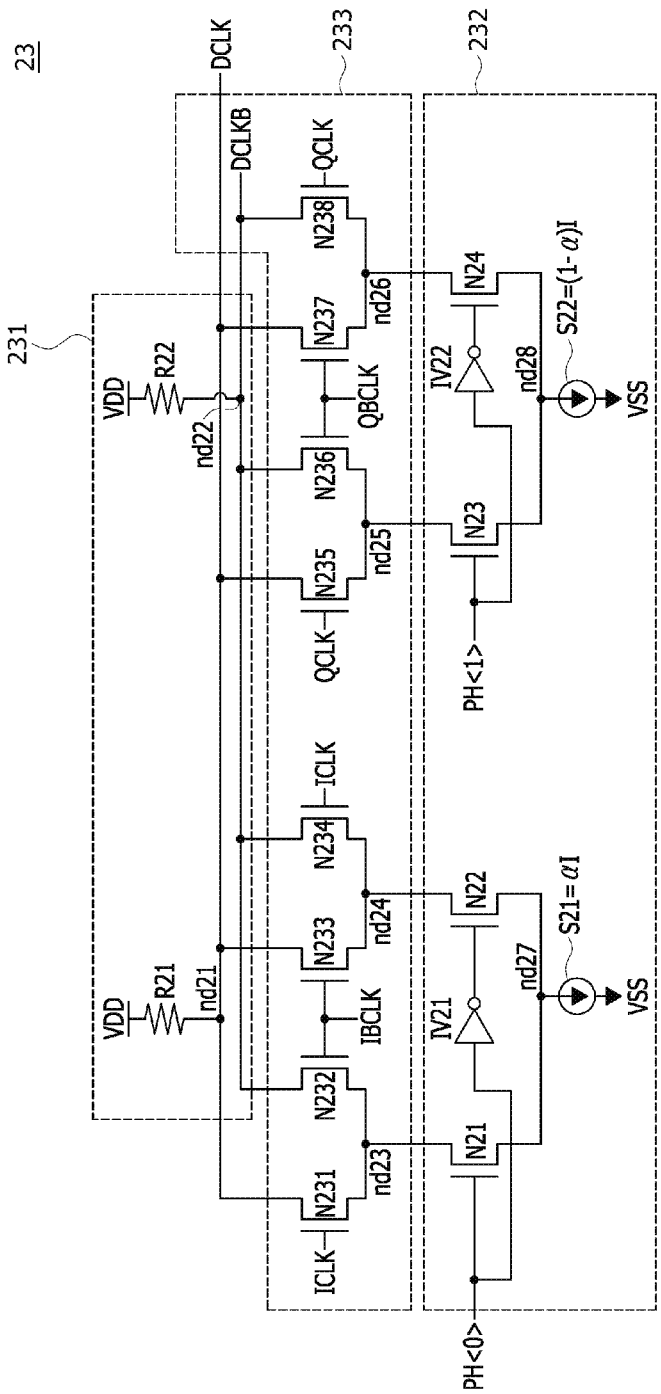
FIG. 3 shows a circuit diagram of the clock delay circuit included in the delay-locked clock generation circuit shown in FIG. 2.

Referring to FIG. 3, the clock delay circuit 23 may include a current supply circuit 231, a current discharge circuit 232, and a clock driving circuit 233.

The current supply circuit 231 may include resistor elements R21 and R22. The resistor element R21 may be coupled between a power supply voltage VDD and a node nd21. The resistor element R22 may be coupled between the power supply voltage VDD and a node nd22. The current supply circuit 231 may supply a current, which is determined by the power supply voltage VDD and the resistor element R21, to the node nd21 from the power supply voltage VDD. The current supply circuit 231 may supply a current, which is determined by the power supply voltage VDD and the resistor element R22, to the node nd22 from the power supply voltage VDD.

The current discharge circuit 232 may include inverters IV21 and IV22; NMOS transistors N21, N22, N23, and N24; a first constant current source S21; and a second constant current source S22. The inverter IV21 may invert the first bit PH<0> of the phase control signal PH<0:1> and output an output signal. The inverter IV22 may invert the second bit PH<1> of the phase control signal PH<0:1> and output an output signal. The NMOS transistor N21 may be coupled between a node nd23 and a node nd27 and be turned on in response to the first bit PH<0> of the phase control signal PH<0:1>. The NMOS transistor N22 may be coupled between a node nd24 and the node nd27 and be turned on in response to the output signal of the inverter IV21. The NMOS transistor N23 may be coupled between a node nd25 and a node nd28 and be turned on in response to the second bit PH<1> of the phase control signal PH<0:1>. The NMOS transistor N24 may be coupled between a node nd26 and the node nd28 and be turned on in response to the output signal of the inverter IV22. The first constant current source S21 may be coupled between the node nd27 and a ground voltage VSS. The current amount of the first constant current source S21 may be set to $\alpha I$. The second constant current source S22 may be coupled between the node nd28 and the ground voltage VSS. The current amount of the second constant current source S22 may be set to $(1-\alpha)I$. The current discharge circuit 232 may selectively discharge a current from the nodes nd23, nd24, nd25, and nd26 depending on the logic level combination of the phase control signal PH<0:1>.

The clock driving circuit 233 may include NMOS transistors N231, N232, N233, N234, N235, N236, N237, and N238. The NMOS transistor N231 may be coupled between the node nd21 and the node nd23 and be turned on in response to the first internal clock ICLK. The NMOS transistor N232 may be coupled between the node nd22 and the node nd23 and be turned on in response to the third internal clock IBCLK. The NMOS transistor N233 may be coupled between the node nd21 and the node nd24 and be turned on in response to the third internal clock IBCLK. The NMOS transistor N234 may be coupled between the node nd22 and the node nd24 and be turned on in response to the first internal clock ICLK. The NMOS transistor N235 may be coupled between the node nd21 and the node nd25 and be turned on in response to the second internal clock QCLK. The NMOS transistor N236 may be coupled between the node nd22 and the node nd25 and be turned on in response to the fourth internal clock QBCLK. The NMOS transistor N237 may be coupled between the node nd21 and the node nd26 and be turned on in response to the fourth internal clock QBCLK. The NMOS transistor N238 may be coupled between the node nd22 and the node nd26 and be turned on in response to the second internal clock QCLK.

In a state in which the first bit PH<0> of the phase control signal PH<0:1> is set to a logic high level and thus the NMOS transistor N21 is turned on, the clock driving circuit 233 may pull-down drive the delay-locked clock DCLK which is outputted to the node nd21, in synchronization with the rising edge of the first internal clock ICLK. In the state in which the first bit PH<0> of the phase control signal PH<0:1> is set to a logic high level and thus the NMOS transistor N21 is turned on, the clock driving circuit 233 may pull-up drive the delay-locked clock DCLK by pull-down driving an inverted delay-locked clock DCLKB which is outputted to the node nd22, in synchronization with the rising edge of the third internal clock IBCLK. In a state in which the first bit PH<0> of the phase control signal PH<0:1> is set to a logic low level and thus the NMOS transistor N22 is turned on, the clock driving circuit 233 may pull-down drive the delay-locked clock DCLK which is outputted to the node nd21, in synchronization with the rising edge of the third internal clock IBCLK. In the state in which the first bit PH<0> of the phase control signal PH<0:1> is set to a logic low level and thus the NMOS transistor N22 is turned on, the clock driving circuit 233 may pull-up drive the delay-locked clock DCLK by pull-down driving the inverted delay-locked clock DCLKB which is outputted to the node nd22, in synchronization with the rising edge of the first internal clock ICLK.

In a state in which the second bit PH<1> of the phase control signal PH<0:1> is set to a logic high level and thus the NMOS transistor N23 is turned on, the clock driving circuit 233 may pull-down drive the delay-locked clock DCLK which is outputted to the node nd21, in synchronization with the rising edge of the second internal clock QCLK. In the state in which the second bit PH<1> of the phase control signal PH<0:1> is set to a logic high level and thus the NMOS transistor N23 is turned on, the clock driving circuit 233 may pull-up drive the delay-locked clock DCLK by pull-down driving the inverted delay-locked clock DCLKB which is outputted to the node nd22, in synchronization with the rising edge of the fourth internal clock QBCLK. In a state in which the second bit PH<1> of the phase control signal PH<0:1> is set to a logic low level and thus the NMOS transistor N24 is turned on, the clock driving circuit 233 may pull-down drive the delay-locked clock DCLK which is outputted to the node nd21, in synchronization with the rising edge of the fourth internal clock QBCLK. In the state in which the second bit PH<1> of the phase control signal PH<0:1> is set to a logic low level and thus the NMOS transistor N24 is turned on, the clock driving circuit 233 may pull-up drive the delay-locked clock DCLK by pull-down driving the inverted delay-locked clock DCLKB which is outputted to the node nd22, in synchronization with the rising edge of the second internal clock QCLK.

As the clock delay circuit 23 is realized by a phase rotator, even though a delay period for delaying the first internal clock ICLK increases, it is not necessary to add a delay circuit and thus it is possible to prevent power and area consumption from increasing.

The operation of the clock delay circuit 23 shown in FIG. 3 is described below with reference to FIGS. 4 and 5.

As shown in FIG. 4, in a state in which α is set to '1' and the logic level combination of the phase control signal PH<0:1> is set to '00,' the NMOS transistor N22 is turned on, and the delay-locked clock DCLK is pull-up driven in synchronization with the rising edge of the first internal clock ICLK and is pull-down driven in synchronization with the rising edge of the third internal clock IBCLK. In the state in which α is set to '1' and the logic level combination of the phase control signal PH<0:1> is set to '00,' the delay-locked clock DCLK is generated as the same waveform as the first internal clock ICLK.

In a state in which α is set to '0' and the logic level combination of the phase control signal PH<0:1> is set to '10,' the NMOS transistor N24 is turned on, and the delay-locked clock DCLK is pull-up driven in synchronization with the rising edge of the second internal clock QCLK and is pull-down driven in synchronization with the rising edge of the fourth internal clock QBCLK. In the state in which α is set to '0' and the logic level combination of the phase control signal PH<0:1> is set to '10,' the delay-locked clock DCLK is generated as the same waveform as the second internal clock QCLK.

In a state in which α is set to '1' and the logic level combination of the phase control signal PH<0:1> is set to '11,' the NMOS transistor N21 is turned on, and the delay-locked clock DCLK is pull-up driven in synchronization with the rising edge of the third internal clock IBCLK and is pull-down driven in synchronization with the rising edge of the first internal clock ICLK. In the state in which α is set to '1' and the logic level combination of the phase control signal PH<0:1> is set to '11,' the delay-locked clock DCLK is generated as the same waveform as the third internal clock IBCLK.

In a state in which α is set to '0' and the logic level combination of the phase control signal PH<0:1> is set to '01,' the NMOS transistor N23 is turned on, and the delay-locked clock DCLK is pull-up driven in synchronization with the rising edge of the fourth internal clock QBCLK and is pull-down driven in synchronization with the rising edge of the second internal clock QCLK. In the state in which α is set to '0' and the logic level combination of the phase control signal PH<0:1> is set to '01,' the delay-locked clock DCLK is generated as the same waveform as the fourth internal clock QBCLK.

Figure 5:
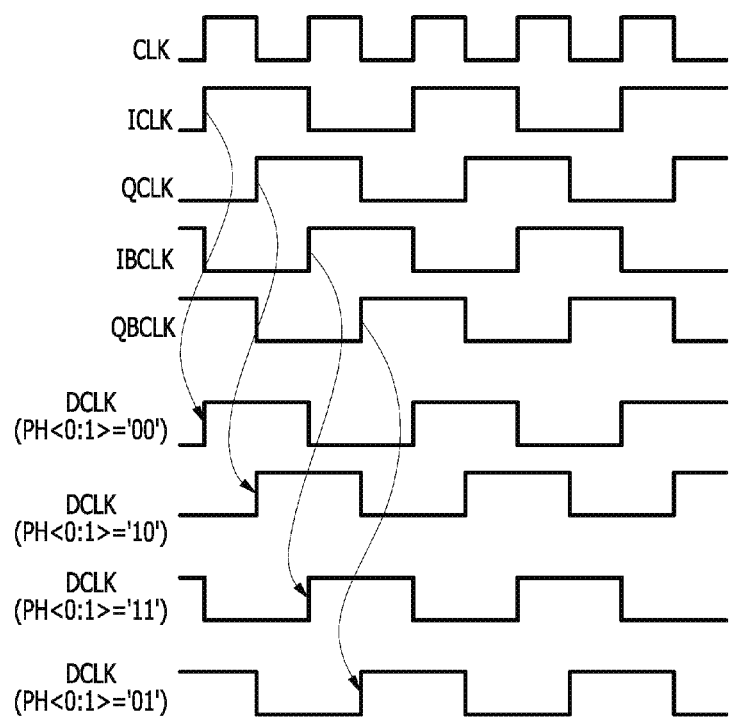
FIG. 5 shows a timing diagram to assist in the description of the operation of the clock delay circuit shown in FIG. 3.

Referring to FIG. 5, it may be seen that, in the state in which α is set to '1' and the logic level combination of the phase control signal PH<0:1> is set to '00,' the delay-locked clock DCLK is generated as the same waveform as the first internal clock ICLK. It may be seen that, in the state in which α is set to '0' and the logic level combination of the phase control signal PH<0:1> is set to '10,' the delay-locked clock DCLK is generated as the same waveform as the second internal clock QCLK. It may be seen that, in the state in which α is set to '1' and the logic level combination of the phase control signal PH<0:1> is set to '11,' the delay-locked clock DCLK is generated as the same waveform as the third internal clock IBCLK. It may be seen that, in the state in which α is set to '0' and the logic level combination of the phase control signal PH<0:1> is set to '01,' the delay-locked clock DCLK is generated as the same waveform as the fourth internal clock QBCLK.

Figure 6:
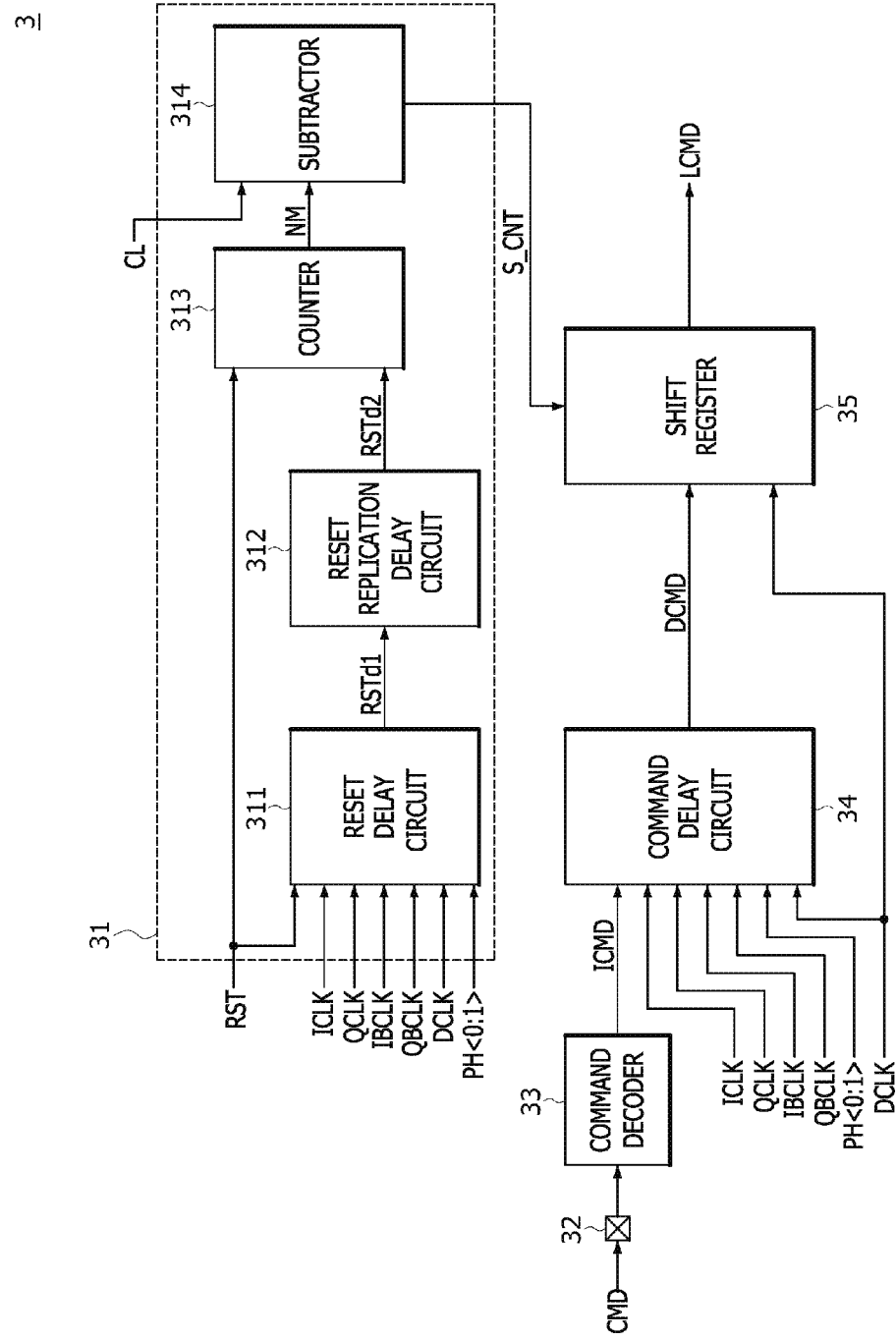
FIG. 6 shows a block diagram illustrating a configuration of the latency command generation circuit included in the semiconductor device shown in FIG. 1.

Referring to FIG. 6, the latency command generation circuit 3 may include a shifting control signal generation circuit 31, a command pad 32, a command decoder 33, a command delay circuit 34, and a shift register 35.

The shifting control signal generation circuit 31 may include a reset delay circuit 311, a reset replication delay circuit 312, a counter 313, and a subtractor 314. The shifting control signal generation circuit 31 may generate a first delayed reset signal RSTd1 by delaying the reset signal RST by a first delay period D1 in response to the first internal clock ICLK, the second internal clock QCLK, the third internal clock IBCLK, the fourth internal clock QBCLK, the phase control signal PH<0:1>, and the delay-locked clock DCLK. The first delay period D1 may be set to be the same as the first delay period D1 of the clock delay circuit 23 (see FIG. 2). The shifting control signal generation circuit 31 may generate a second delayed reset signal RSTd2 by delaying the first delayed reset signal RSTd1 by a second delay period D2. The second delay period D2 may be set to be the same as the second delay period D2 of the clock replication delay circuit 24 (see FIG. 2). The shifting control signal generation circuit 31 may generate a shifting control signal S_CNT including information on a period that is obtained by subtracting the first delay period D1 and the second delay period D2 from a period set by the latency signal CL. The reset signal RST may be enabled to a logic high level for the initialization operation of the semiconductor device 1. The period set by the latency signal CL may be set to a period from a time when the command CMD is inputted to a time when data is outputted, that is, a period corresponding to a latency. A detailed configuration and operation of the shifting control signal generation circuit 31 is described later with reference to FIG. 7.

The reset delay circuit 311 may generate the first delayed reset signal RSTd1 by delaying the reset signal RST by the first delay period D1 in response to the first internal clock ICLK, the second internal clock QCLK, the third internal clock IBCLK, the fourth internal clock QBCLK, the phase control signal PH<0:1>, and the delay-locked clock DCLK. The first delay period D1 may be set to be the same as the first delay period D1 of the clock delay circuit 23 (see FIG. 2). The reset delay circuit 311 may output the first delayed reset signal RSTd1 by latching the reset signal RST sequentially by clocks selected from among the first internal clock ICLK, the second internal clock QCLK, the third internal clock IBCLK, and the fourth internal clock QBCLK, depending on the logic level combination of the phase control signal PH<0:1>, and by then latching the sequentially latched reset signal RST in synchronization with the delay-locked clock DCLK. As the reset delay circuit 311 is realized by an equivalent circuit of a phase rotator, even though a delay period for delaying the reset signal RST increases, it is not necessary to add a delay circuit, and thus it is possible to prevent power and area consumption from increasing. A detailed configuration and operation of the reset delay circuit 311 is described later with reference to FIGS. 8 to 12.

The reset replication delay circuit 312 may generate the second delayed reset signal RSTd2 by delaying the first delayed reset signal RSTd1 by the second delay period D2. The second delay period D2 may be set to be the same as the second delay period D2 of the clock replication delay circuit 24 (see FIG. 2). The counter 313 may generate a counting number NM by detecting that a period obtained by summing the first delay period D1 and the second delay period D2 corresponds to which number of cycles of the clock CLK. The counter 313 may generate the counting number NM which is set to 3, in the case where a period obtained by summing the first delay period D1 and the second delay period D2 corresponds to three cycles of the clock CLK. The subtractor 314 may generate the shifting control signal S_CNT including information on a period that is obtained by subtracting a period corresponding to the counting number NM from the period set by the latency signal CL. In the case where the latency signal CL includes information corresponding to eight cycles of the clock CLK and the counting number NM includes information corresponding to three cycles of the clock CLK, the shifting control signal S_CNT may be generated to include information corresponding to five cycles of the clock CLK that is obtained by subtracting a period corresponding to the information of the counting number NM from a period corresponding to the information of the latency signal CL.

The command decoder 33 may receive the command CMD through the command pad 32. The command decoder 33 may decode the command CMD and thereby generate the internal command ICMD. In the present embodiment, the internal command ICMD may be set as a read command which is generated to perform a read operation in which the data DATA stored in the semiconductor device 1 is outputted as the transmission data TDQ. The command CMD may be realized as a signal which includes a plurality of bits, depending on an embodiment.

The command delay circuit 34 may generate the delayed command DCMD by delaying the internal command ICMD by a first delay period D1 in response to the first internal clock ICLK, the second internal clock QCLK, the third internal clock IBCLK, the fourth internal clock QBCLK, the phase control signal PH<0:1>, and the delay-locked clock DCLK. The first delay period D1 may be set to be the same as the first delay period D1 of the reset delay circuit 311. The command delay circuit 34 may output the delayed command DCMD by latching the internal command ICMD sequentially by clocks selected from among the first internal clock ICLK, the second internal clock QCLK, the third internal clock IBCLK, and the fourth internal clock QBCLK, depending on the logic level combination of the phase control signal PH<0:1>, and by then latching the sequentially latched internal command ICMD in synchronization with the delay-locked clock DCLK. As the command delay circuit 34 is realized to include an equivalent circuit of a phase rotator, even though a delay period for delaying the internal command ICMD increases, it is not necessary to add a delay circuit and thus it is possible to prevent power and area consumption from increasing. A detailed configuration and operation of the command delay circuit 34 is described later with reference to FIGS. 13 to 40.

The shift register 35 may shift the delayed command DCMD in response to the delay-locked clock DCLK and thereby generate the latency command LCMD. A period in which the delayed command DCMD is shifted in the shift register 35 to generate the latency command LCMD may be set to a period corresponding to the information included in the shifting control signal S_CNT. That is to say, the shift register 35 may generate the latency command LCMD by shifting the delayed command DCMD by the period corresponding to the information included in the shifting control signal S_CNT.

Figure 7:
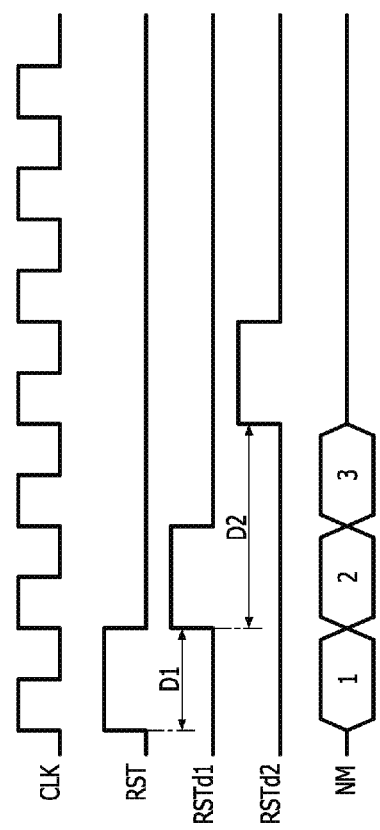
FIG. 7 shows a timing diagram to assist in the description of the operation of the shifting control signal generation circuit shown in FIG. 6.

A detailed operation of the shifting control signal generation circuit 31 is described hereunder with reference to FIG. 7.

As shown in FIG. 7, in the case where the first delayed reset signal RSTd1 is generated by delaying the reset signal RST by the first delay period D1 set to a period corresponding to one cycle of the clock CLK and the second delayed reset signal RSTd2 is generated by delaying the first delayed reset signal RSTd1 by a period corresponding to two cycles of the clock CLK, the counting number NM may be generated to include information corresponding to three cycles of the clock CLK. The counting number NM may include bits which have a logic level combination of '011' corresponding to 3. A scheme in which the counting number NM includes information may be set variously depending on an embodiment. The shifting control signal S_CNT may include information corresponding to a period obtained by subtracting a period corresponding to the information of the counting number NM from a period corresponding to the information of the latency signal CL.

Figure 8:
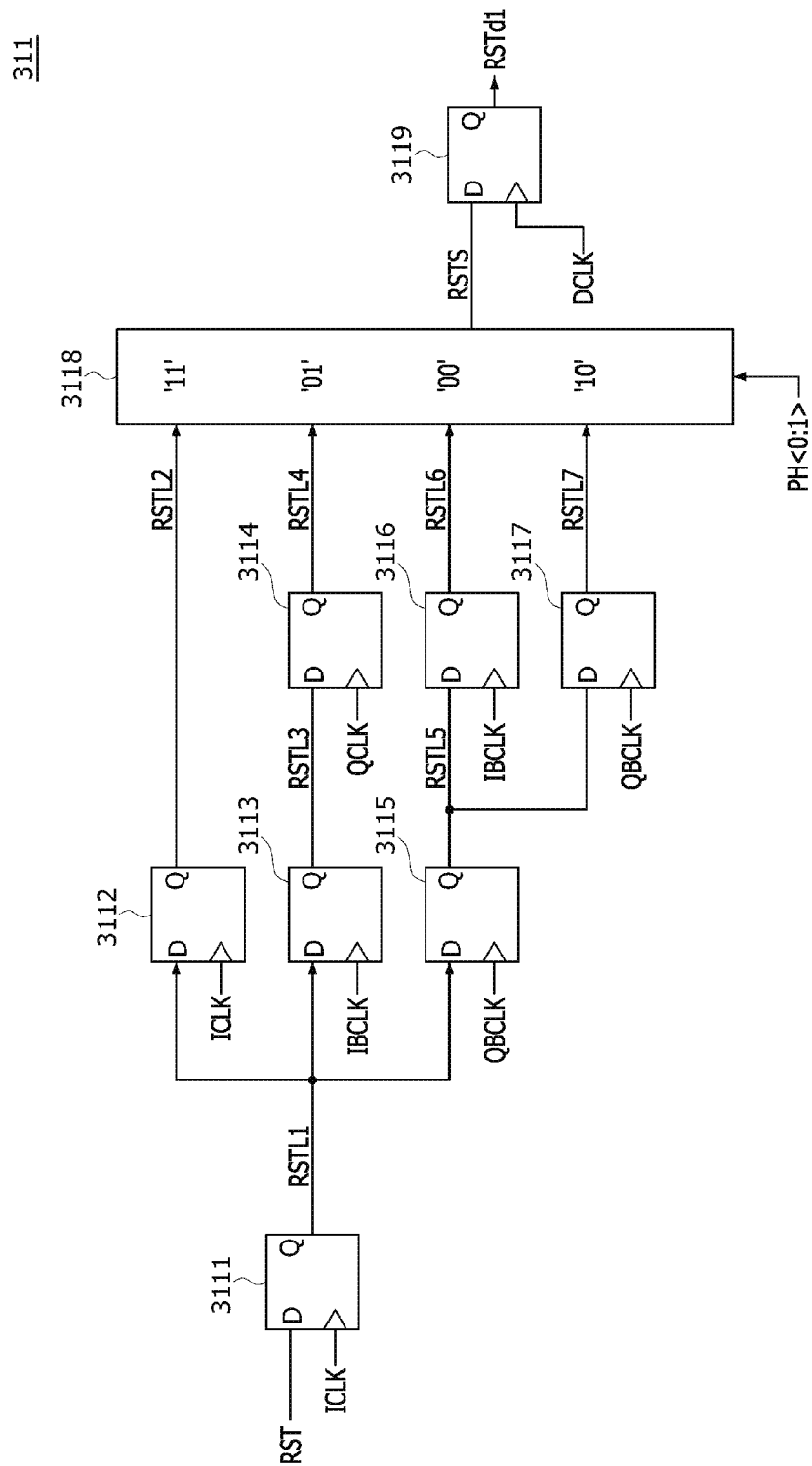

Referring to FIG. 8, the reset delay circuit 311 may include a first clock latch 3111, a second clock latch 3112, a third clock latch 3113, a fourth clock latch 3114, a fifth clock latch 3115, a sixth clock latch 3116, a seventh clock latch 3117, a clock selector 3118, and a reset signal output latch 3119.

The first clock latch 3111 may latch the reset signal RST in synchronization with the first internal clock ICLK and output the latched reset signal RST as a first latched reset signal RSTL1. The second clock latch 3112 may latch the first latched reset signal RSTL1 in synchronization with the first internal clock ICLK and output the latched first latched reset signal RSTL1 as a second latched reset signal RSTL2. The third clock latch 3113 may latch the first latched reset signal RSTL1 in synchronization with the third internal clock IBCLK and output the latched first latched reset signal RSTL1 as a third latched reset signal RSTL3. The fourth clock latch 3114 may latch the third latched reset signal RSTL3 in synchronization with the second internal clock QCLK and output the latched third latched reset signal RSTL3 as a fourth latched reset signal RSTL4. The fifth clock latch 3115 may latch the first latched reset signal RSTL1 in synchronization with the fourth internal clock QBCLK and output the latched first latched reset signal RSTL1 as a fifth latched reset signal RSTL5. The sixth clock latch 3116 may latch the fifth latched reset signal RSTL5 in synchronization with the third internal clock IBCLK and output the latched fifth latched reset signal RSTL5 as a sixth latched reset signal RSTL6. The seventh clock latch 3117 may latch the fifth latched reset signal RSTL5 in synchronization with the fourth internal clock QBCLK and output the latched fifth latched reset signal RSTL5 as a seventh latched reset signal RSTL7. In the present embodiment, each of the first clock latch 3111, the second clock latch 3112, the third clock latch 3113, the fourth clock latch 3114, the fifth clock latch 3115, the sixth clock latch 3116, and the seventh clock latch 3117 may be realized by a D flip-flop.

The clock selector 3118 may generate a selected reset signal RSTS from the second latched reset signal RSTL2, the fourth latch reset signal RSTL4, the sixth latched reset signal RSTL6, and the seventh latched reset signal RSTL7 in response to the phase control signal PH<0:1>. The clock selector 3118 may output the selected reset signal RSTS by selecting one from among the second latched reset signal RSTL2, the fourth latch reset signal RSTL4, the sixth latched reset signal RSTL6, and the seventh latched reset signal RSTL7 depending on the logic level combination of the phase control signal PH<0:1>. The clock selector 3118 may output the second latched reset signal RSTL2 as the selected reset signal RSTS in the case where the logic level combination of the phase control signal PH<0:1> is '11.' The clock selector 3118 may output the selected reset signal RSTS by selecting the fourth latched reset signal RSTL4 in the case where the logic level combination of the phase control signal PH<0:1> is '01.' The clock selector 3118 may output the selected reset signal RSTS by selecting the sixth latched reset signal RSTL6 in the case where the logic level combination of the phase control signal PH<0:1> is '00.' The clock selector 3118 may output the selected reset signal RSTS by selecting the seventh latched reset signal RSTL7 in the case where the logic level combination of the phase control signal PH<0:1> is '10.' The reset signal output latch 3119 may latch the selected reset signal RSTS in synchronization with the delay-locked clock DCLK, and output the latched selected reset signal RSTS as the first delayed reset signal RSTd1.

In the case where the logic level combination of the phase control signal PH<0:1> is '11,' the reset delay circuit 311 may generate the selected reset signal RSTS by latching the reset signal RST in synchronization with the first internal clock ICLK and then latching the latched reset signal RST in synchronization with the first internal clock ICLK, and may generate the first delayed reset signal RSTd1 by latching the selected reset signal RSTS in synchronization with the delay-locked clock DCLK. In the case where the logic level combination of the phase control signal PH<0:1> is '01,' the reset delay circuit 311 may generate the selected reset signal RSTS by latching the reset signal RST sequentially in synchronization with the first internal clock ICLK, the third internal clock IBCLK, and the second internal clock QCLK, and may generate the first delayed reset signal RSTd1 by latching the selected reset signal RSTS in synchronization with the delay-locked clock DCLK. In the case where the logic level combination of the phase control signal PH<0:1> is '00,' the reset delay circuit 311 may generate the selected reset signal RSTS by latching the reset signal RST sequentially in synchronization with the first internal clock ICLK, the fourth internal clock QBCLK, and the third internal clock IBCLK, and may generate the first delayed reset signal RSTd1 by latching the selected reset signal RSTS in synchronization with the delay-locked clock DCLK. In the case where the logic level combination of the phase control signal PH<0:1> is '10,' the reset delay circuit 311 may generate the selected reset signal RSTS by latching the reset signal RST sequentially in synchronization with the first internal clock ICLK, and the fourth internal clock QBCLK, and may generate the first delayed reset signal RSTd1 by latching the selected reset signal RSTS in synchronization with the delay-locked clock DCLK.

Hereunder, the operation of the reset delay circuit 311 is described in detail with reference to FIGS. 9 to 12.

Figure 9:
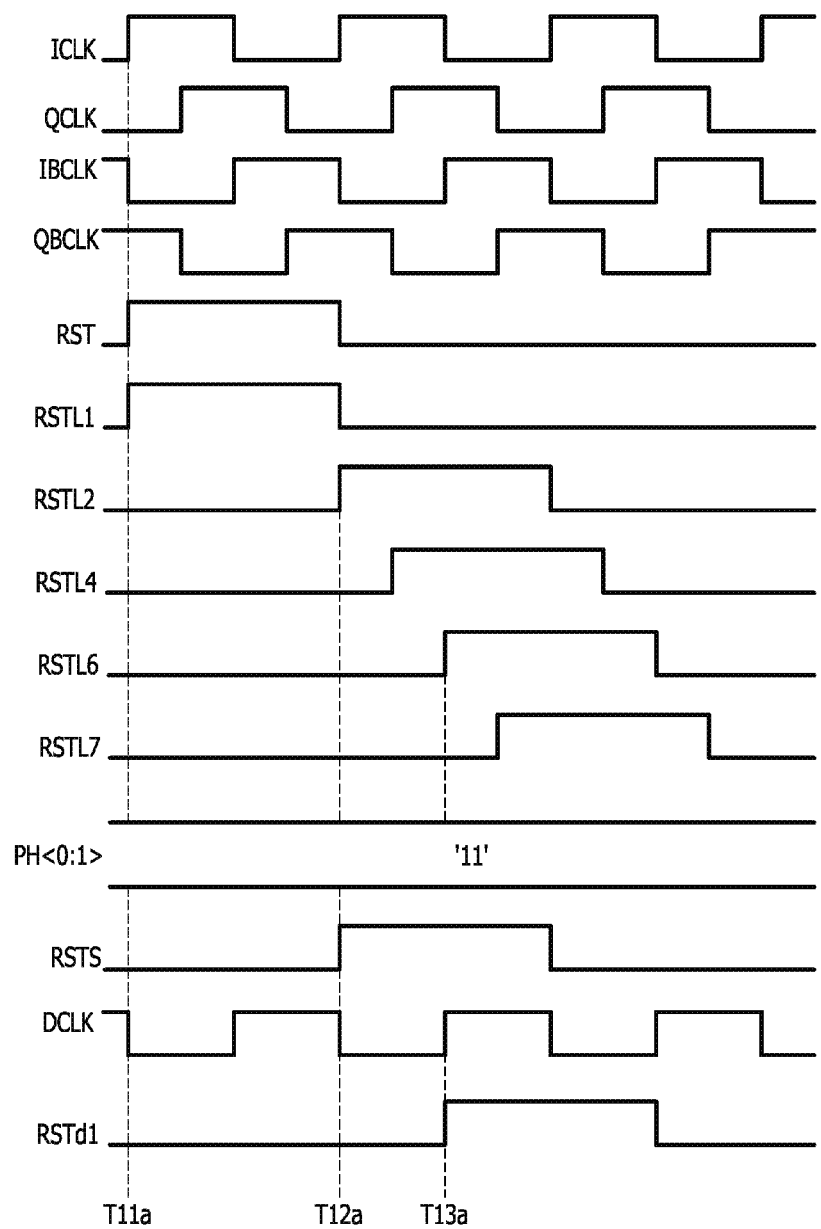
FIGS. 9 to 12 show timing diagrams to assist in the description of the operation of the reset delay circuit shown in FIG. 8.

As shown in FIG. 9, when the reset signal RST is generated at a time T11a, the first latched reset signal RSTL1 is generated at the time T11a in synchronization with the first internal clock ICLK. The second latched reset signal RSTL2 is generated in synchronization with the first internal clock ICLK, the fourth latched reset signal RSTL4 is generated in synchronization with the second internal clock QCLK, the sixth latched reset signal RSTL6 is generated in synchronization with the third internal clock IBCLK, and the seventh latched reset signal RSTL7 is generated in synchronization with the fourth internal clock QBCLK. In the case where the logic level combination of the phase control signal PH<0:1> is '11,' the second latched reset signal RSTL2 is selected and outputted as the selected reset signal RSTS at a time T12a. At a time T13a, the selected reset signal RSTS is latched in synchronization with the delay-locked clock DCLK and is outputted as the first delayed reset signal RSTd1. In the case where the logic level combination of the phase control signal PH<0:1> is '11,' the first delay period D1 of the reset delay circuit 311 is set as a period from the time T11a to the time T13a.

Figure 10:
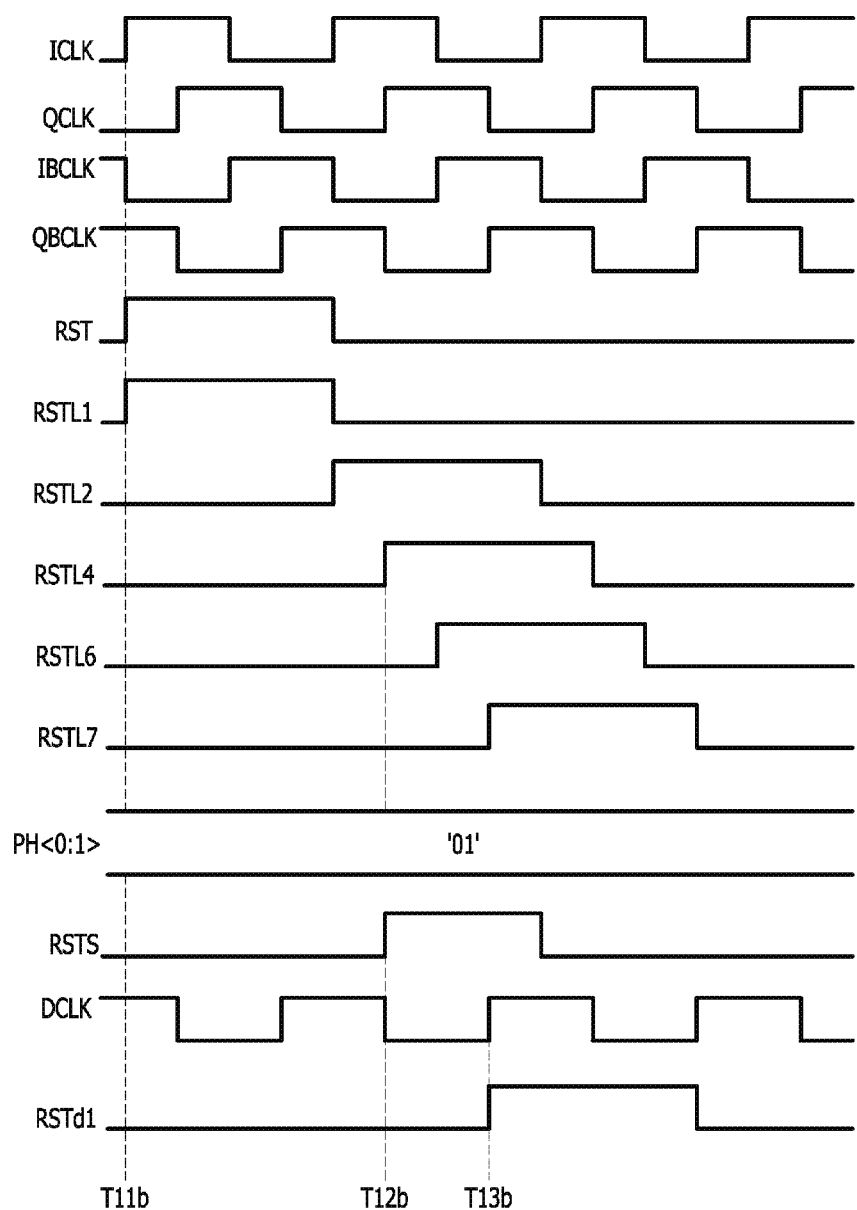

As shown in FIG. 10, when the reset signal RST is generated at a time T11b, the first latched reset signal RSTL1 is generated at the time T11b in synchronization with the first internal clock ICLK. The second latched reset signal RSTL2 is generated in synchronization with the first internal clock ICLK, the fourth latched reset signal RSTL4 is generated in synchronization with the second internal clock QCLK, the sixth latched reset signal RSTL6 is generated in synchronization with the third internal clock IBCLK, and the seventh latched reset signal RSTL7 is generated in synchronization with the fourth internal clock QBCLK. In the case where the logic level combination of the phase control signal PH<0:1> is '01,' the fourth latched reset signal RSTL4 is selected and outputted as the selected reset signal RSTS at a time T12b. At a time T13b, the selected reset signal RSTS is latched in synchronization with the delay-locked clock DCLK and is outputted as the first delayed reset signal RSTd1. In the case where the logic level combination of the phase control signal PH<0:1> is '01,' the first delay period D1 of the reset delay circuit 311 is set as a period from the time T11b to the time T13b.

Figure 11:
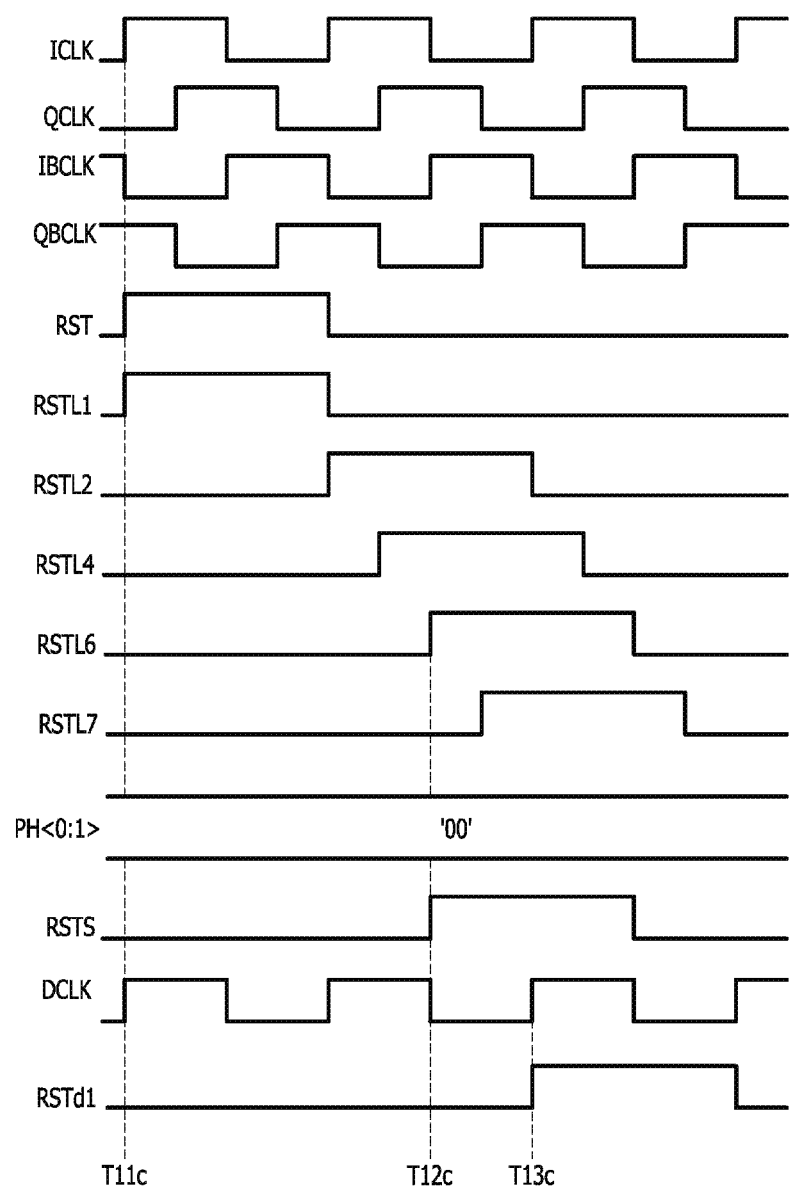

As shown in FIG. 11, when the reset signal RST is generated at a time T11c, the first latched reset signal RSTL1 is generated at the time T11c in synchronization with the first internal clock ICLK. The second latched reset signal RSTL2 is generated in synchronization with the first internal clock ICLK, the fourth latched reset signal RSTL4 is generated in synchronization with the second internal clock QCLK, the sixth latched reset signal RSTL6 is generated in synchronization with the third internal clock IBCLK, and the seventh latched reset signal RSTL7 is generated in synchronization with the fourth internal clock QBCLK. In the case where the logic level combination of the phase control signal PH<0:1> is '00,' the sixth latched reset signal RSTL6 is selected and outputted as the selected reset signal RSTS at a time T12c. At a time T13c, the selected reset signal RSTS is latched in synchronization with the delay-locked clock DCLK and is outputted as the first delayed reset signal RSTd1. In the case where the logic level combination of the phase control signal PH<0:1> is '00,' the first delay period D1 of the reset delay circuit 311 is set as a period from the time T11c to the time T13c.

Figure 12:
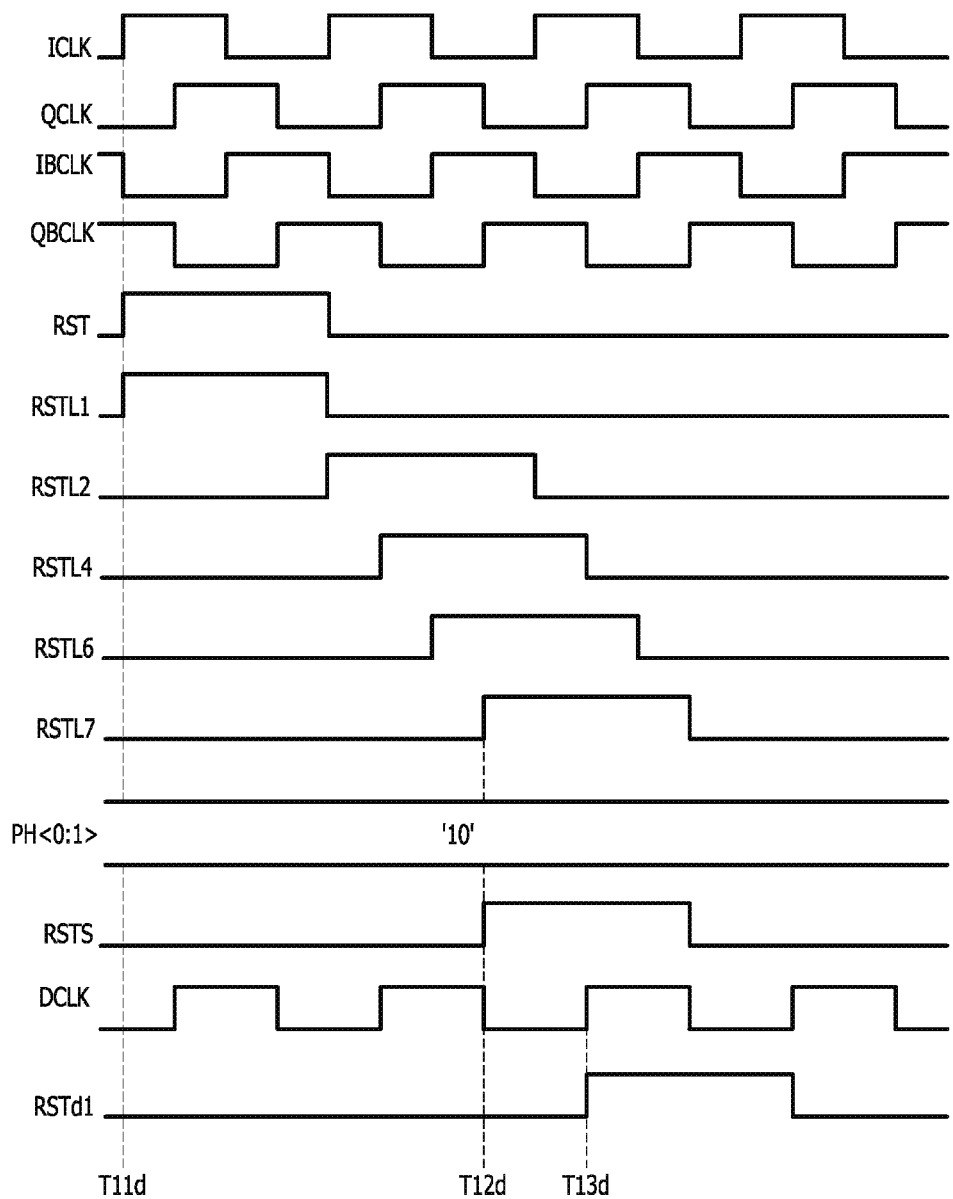

As shown in FIG. 12, when the reset signal RST is generated at a time T11d, the first latched reset signal RSTL1 is generated at the time T11d in synchronization with the first internal clock ICLK. The second latched reset signal RSTL2 is generated in synchronization with the first internal clock ICLK, the fourth latched reset signal RSTL4 is generated in synchronization with the second internal clock QCLK, the sixth latched reset signal RSTL6 is generated in synchronization with the third internal clock IBCLK, and the seventh latched reset signal RSTL7 is generated in synchronization with the fourth internal clock QBCLK. In the case where the logic level combination of the phase control signal PH<0:1> is '10,' the seventh latched reset signal RSTL7 is selected and outputted as the selected reset signal RSTS at a time T12d. At a time T13d, the selected reset signal RSTS is latched in synchronization with the delay-locked clock DCLK and is outputted as the first delayed reset signal RSTd1. In the case where the logic level combination of the phase control signal PH<0:1> is '10,' the first delay period D1 of the reset delay circuit 311 is set as a period from the time T11d to the time T13d.

Summarizing these, it may be seen that each time the logic level combination of the phase control signal PH<0:1> changes in the sequence of '11,' '01,' 00,' and '10,' the first delay period D1 of the reset delay circuit 311 increases by a period corresponding to a quarter (¼) cycle of the first internal clock ICLK (a period corresponding to a half (½) cycle of the clock CLK).

Figure 13:
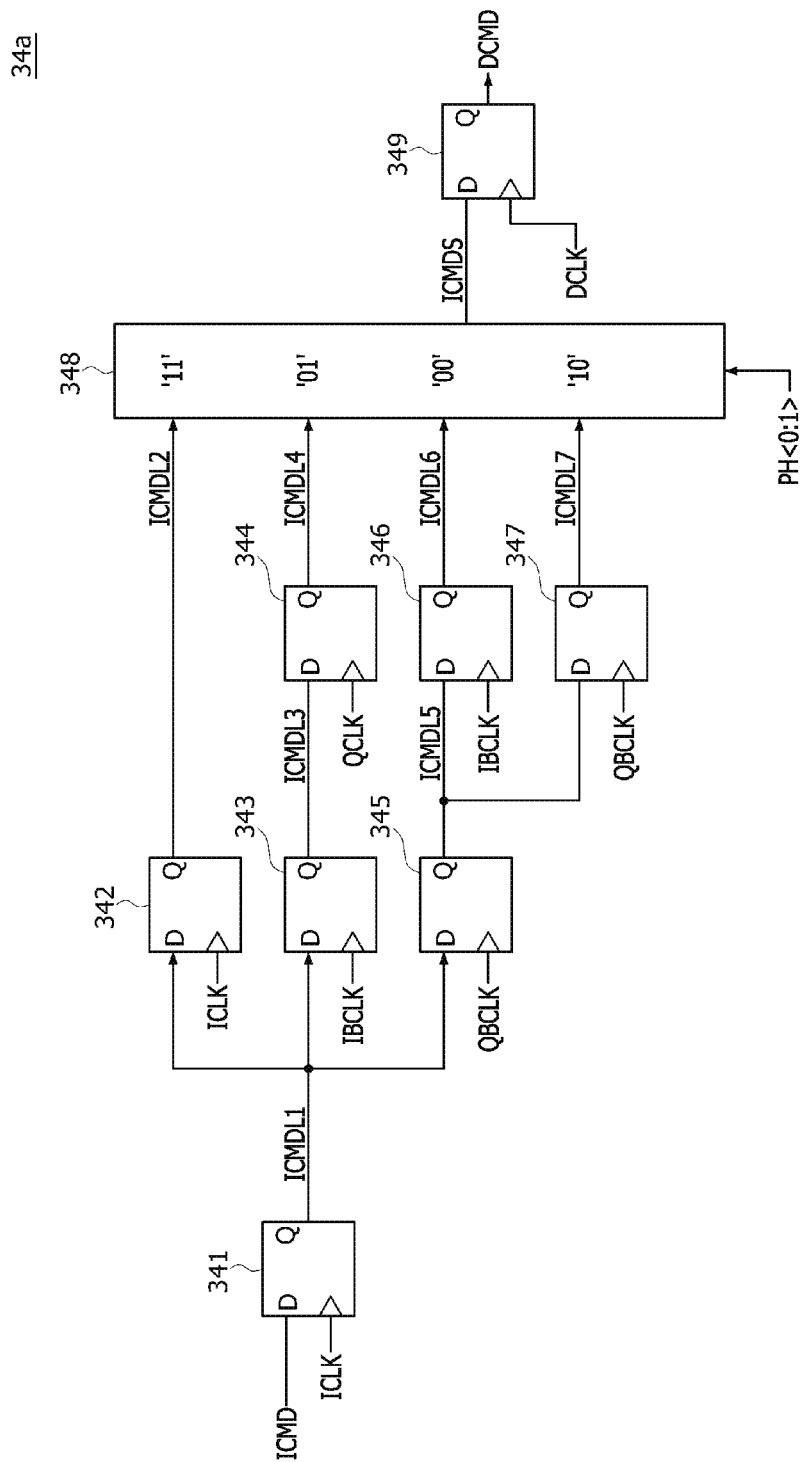
FIG. 13 shows a circuit diagram illustrating the command delay circuit included in the latency command generation circuit shown in FIG. 6.

Referring to FIG. 13, a command delay circuit 34a in accordance with an embodiment may include a first command latch 341, a second command latch 342, a third command latch 343, a fourth command latch 344, a fifth command latch 345, a sixth command latch 346, a seventh command latch 347, a command selector 348, and a command output latch 349.

The first command latch 341 may latch the internal command ICMD in synchronization with the first internal clock ICLK and output the latched internal command ICMD as a first latched command ICMDL1. The second command latch 342 may latch the first latched command ICMDL1 in synchronization with the first internal clock ICLK and output the latched first latched command ICMDL1 as a second latched command ICMDL2. The third command latch 343 may latch the first latched command ICMDL1 in synchronization with the third internal clock IBCLK and output the latched first latched command ICMDL1 as a third latched command ICMDL3. The fourth command latch 344 may latch the third latched command ICMDL3 in synchronization with the second internal clock QCLK and output the latched third latched command ICMDL3 as a fourth latched command ICMDL4. The fifth command latch 345 may latch the first latched command ICMDL1 in synchronization with the fourth internal clock QBCLK and output the latched first latched command ICMDL1 as a fifth latched command ICMDL5. The sixth command latch 346 may latch the fifth latched command ICMDL5 in synchronization with the third internal clock IBCLK and output the latched fifth latched command ICMDL5 as a sixth latched command ICMDL6. The seventh command latch 347 may latch the fifth latched command ICMDL5 in synchronization with the fourth internal clock QBCLK and output the latched fifth latched command ICMDL5 as a seventh latched command ICMDL7. In the present embodiment, each of the first command latch 341, the second command latch 342, the third command latch 343, the fourth command latch 344, the fifth command latch 345, the sixth command latch 346, and the seventh command latch 347 may be realized by a D flip-flop.

The command selector 348 may generate a selected command ICMDS from the second latched command ICMDL2, the fourth latched command ICMDL4, the sixth latched command ICMDL6, and the seventh latched command ICMDL7 in response to the phase control signal PH<0:1>. The command selector 348 may output the selected command ICMDS by selecting one from among the second latched command ICMDL2, the fourth latched command ICMDL4, the sixth latched command ICMDL6, and the seventh latched command ICMDL7 depending on the logic level combination of the phase control signal PH<0:1>. The command selector 348 may output the second latched command ICMDL2 as the selected command ICMDS in the case where the logic level combination of the phase control signal PH<0:1> is '11.' The command selector 348 may output the selected command ICMDS by selecting the fourth latched command ICMDL4 in the case where the logic level combination of the phase control signal PH<0:1> is '01.' The command selector 348 may output the selected command ICMDS by selecting the sixth latched command ICMDL6 in the case where the logic level combination of the phase control signal PH<0:1> is '00.' The command selector 348 may output the selected command ICMDS by selecting the seventh latched command ICMDL7 in the case where the logic level combination of the phase control signal PH<0:1> is '10.' The command output latch 349 may latch the selected command ICMDS in synchronization with the delay-locked clock DCLK and output the latched selected command ICMDS as the delayed command DCMD.

In the case where the logic level combination of the phase control signal PH<0:1> is '11,' the command delay circuit 34a may generate the selected command ICMDS by latching the internal command ICMD in synchronization with the first internal clock ICLK and then latching the latched internal command ICMD in synchronization with the first internal clock ICLK, and may generate the delayed command DCMD by latching the selected command ICMDS in synchronization with the delay-locked clock DCLK. In the case where the logic level combination of the phase control signal PH<0:1> is '01,' the command delay circuit 34a may generate the selected command ICMDS by latching the internal command ICMD sequentially in synchronization with the first internal clock ICLK, the third internal clock IBCLK, and the second internal clock QCLK, and may generate the delayed command DCMD by latching the selected command ICMDS in synchronization with the delay-locked clock DCLK. In the case where the logic level combination of the phase control signal PH<0:1> is '00,' the command delay circuit 34a may generate the selected command ICMDS by latching the internal command ICMD sequentially in synchronization with the first internal clock ICLK, the fourth internal clock QBCLK, and the third internal clock IBCLK, and may generate the delayed command DCMD by latching the selected command ICMDS in synchronization with the delay-locked clock DCLK. In the case where the logic level combination of the phase control signal PH<0:1> is '10,' the command delay circuit 34a may generate the selected command ICMDS by latching the internal command ICMD sequentially in synchronization with the first internal clock ICLK, the fourth internal clock QBCLK, and the fourth internal clock QBCLK, and may generate the delayed command DCMD by latching the selected command ICMDS in synchronization with the delay-locked clock DCLK.

Hereunder, the operation of the command delay circuit 34a is described in detail with reference to FIGS. 14 to 17.

Figure 14:
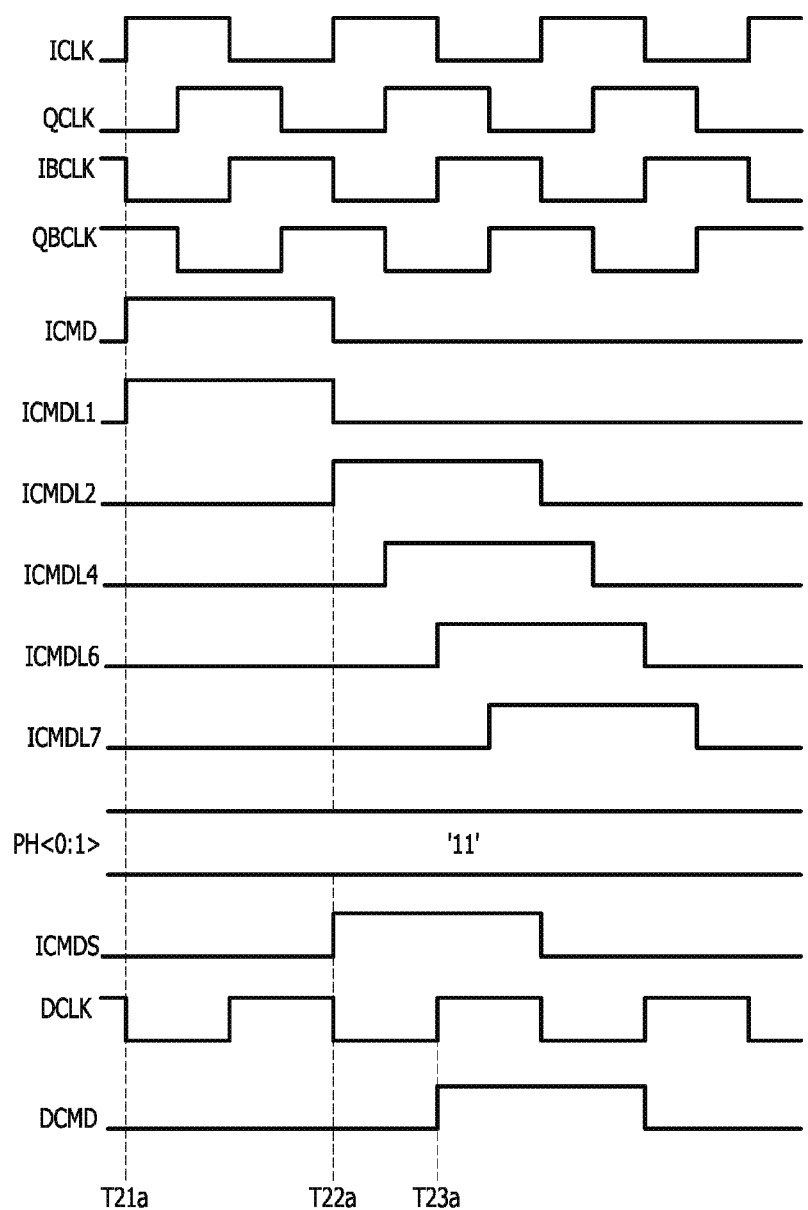
FIGS. 14 to 17 show timing diagrams to assist in the description of the operation of the command delay circuit shown in FIG. 13.

As shown in FIG. 14, when the internal command ICMD is generated at a time T21a, the first latched command ICMDL1 is generated at the time T21a in synchronization with the first internal clock ICLK. The second latched command ICMDL2 is generated in synchronization with the first internal clock ICLK, the fourth latched command ICMDL4 is generated in synchronization with the second internal clock QCLK, the sixth latched command ICMDL6 is generated in synchronization with the third internal clock IBCLK, and the seventh latched command ICMDL7 is generated in synchronization with the fourth internal clock QBCLK. In the case where the logic level combination of the phase control signal PH<0:1> is '11,' the second latched command ICMDL2 is selected and outputted as the selected command ICMDS at a time T22a. At a time T23a, the selected command ICMDS is latched in synchronization with the delay-locked clock DCLK and is outputted as the delayed command DCMD. In the case where the logic level combination of the phase control signal PH<0:1> is '11,' the first delay period D1 of the command delay circuit 34a is set as a period from the time T21a to the time T23a.

Figure 15:
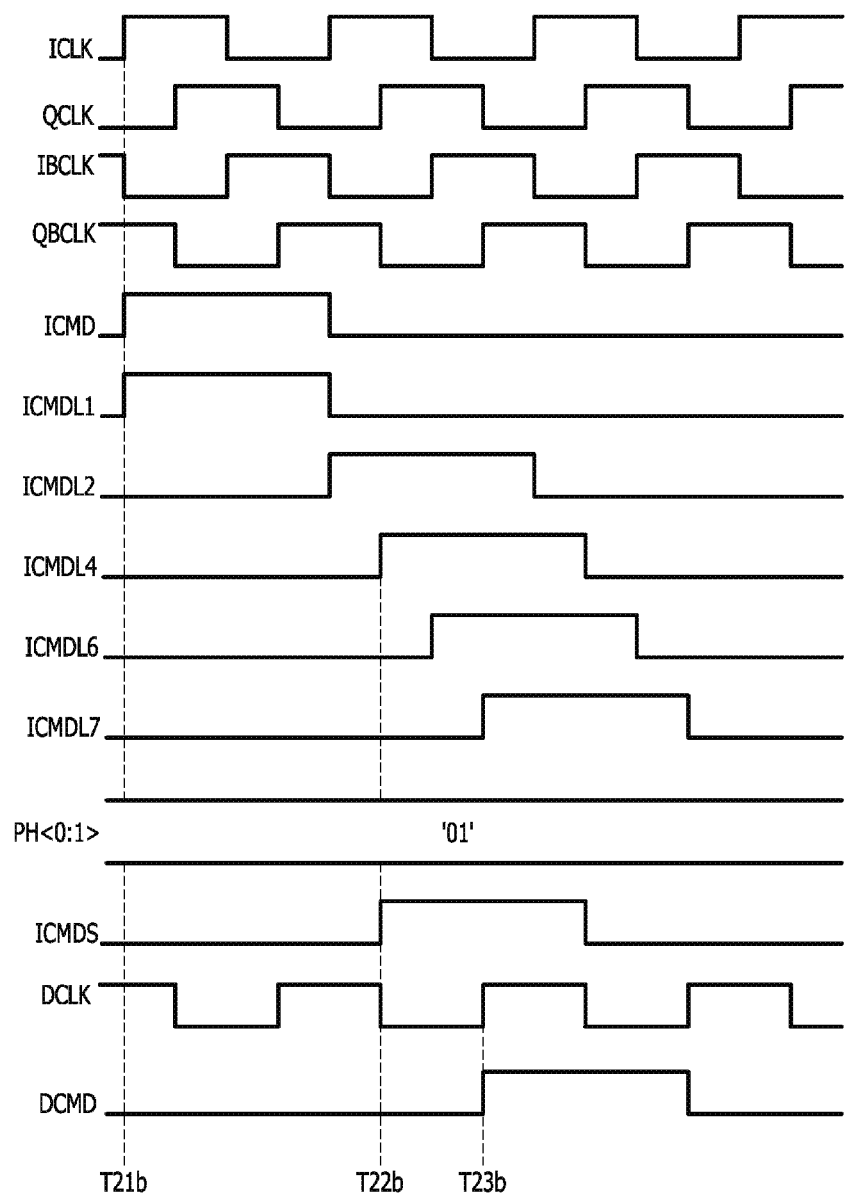

As shown in FIG. 15, when the internal command ICMD is generated at a time T21b, the first latched command ICMDL1 is generated at the time T21b in synchronization with the first internal clock ICLK. The second latched command ICMDL2 is generated in synchronization with the first internal clock ICLK, the fourth latched command ICMDL4 is generated in synchronization with the second internal clock QCLK, the sixth latched command ICMDL6 is generated in synchronization with the third internal clock IBCLK, and the seventh latched command ICMDL7 is generated in synchronization with the fourth internal clock QBCLK. In the case where the logic level combination of the phase control signal PH<0:1> is '01,' the fourth latched command ICMDL4 is selected and outputted as the selected command ICMDS at a time T22b. At a time T23b, the selected command ICMDS is latched in synchronization with the delay-locked clock DCLK and is outputted as the delayed command DCMD. In the case where the logic level combination of the phase control signal PH<0:1> is '01,' the first delay period D1 of the command delay circuit 34a is set as a period from the time T21b to the time T23b.

Figure 16:
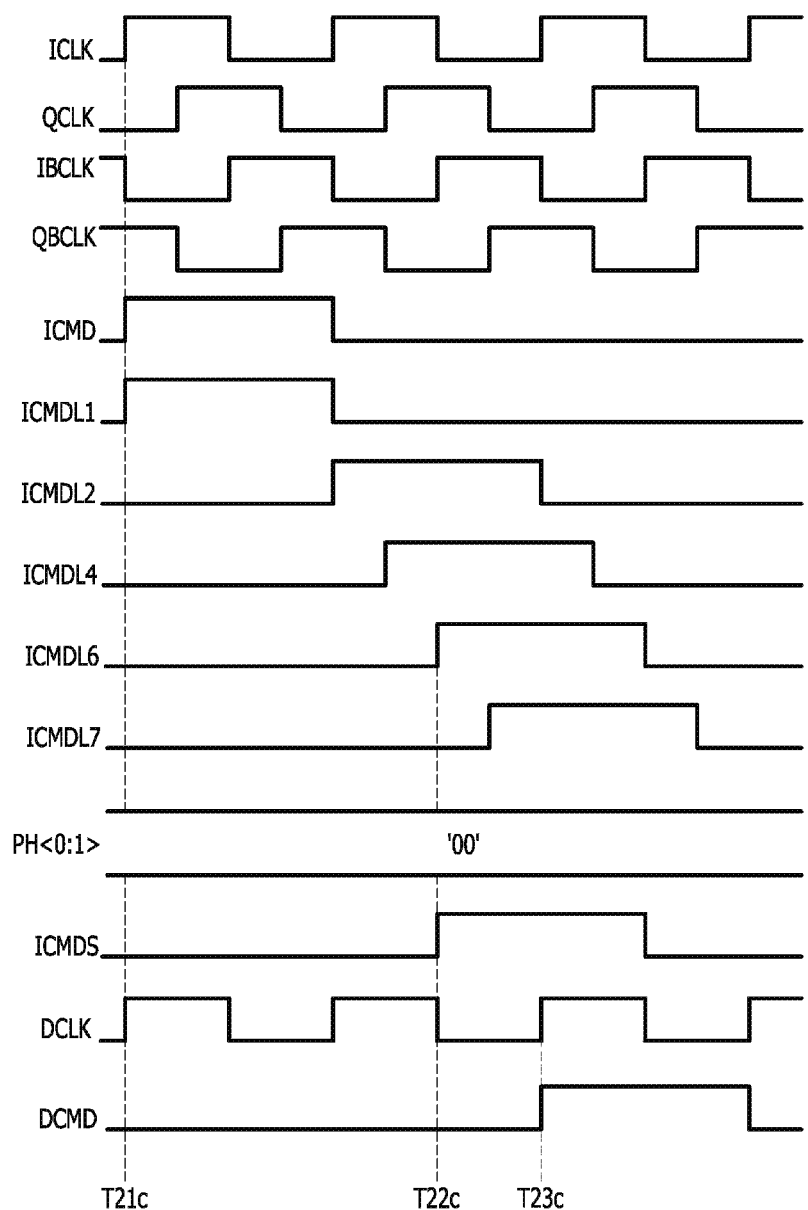

As shown in FIG. 16, when the internal command ICMD is generated at a time T21c, the first latched command ICMDL1 is generated at the time T21c in synchronization with the first internal clock ICLK. The second latched command ICMDL2 is generated in synchronization with the first internal clock ICLK, the fourth latched command ICMDL4 is generated in synchronization with the second internal clock QCLK, the sixth latched command ICMDL6 is generated in synchronization with the third internal clock IBCLK, and the seventh latched command ICMDL7 is generated in synchronization with the fourth internal clock QBCLK. In the case where the logic level combination of the phase control signal PH<0:1> is '00,' the sixth latched command ICMDL6 is selected and outputted as the selected command ICMDS at a time T22c. At a time T23c, the selected command ICMDS is latched in synchronization with the delay-locked clock DCLK and is outputted as the delayed command DCMD. In the case where the logic level combination of the phase control signal PH<0:1> is '00,' the first delay period D1 of the command delay circuit 34a is set as a period from the time T21c to the time T23c.

Figure 17:
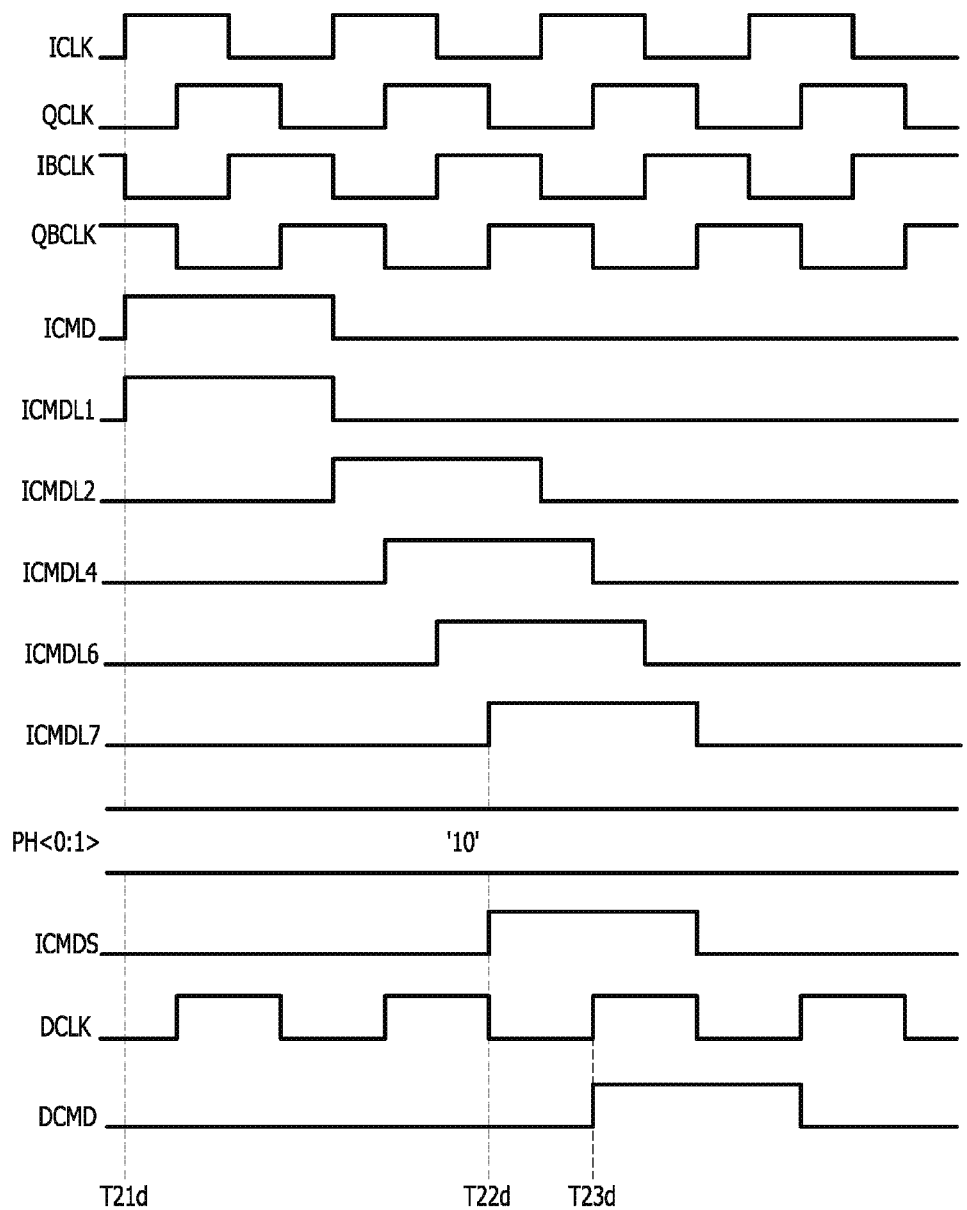

As shown in FIG. 17, when the internal command ICMD is generated at a time T21d, the first latched command ICMDL1 is generated at the time T21d in synchronization with the first internal clock ICLK. The second latched command ICMDL2 is generated in synchronization with the first internal clock ICLK, the fourth latched command ICMDL4 is generated in synchronization with the second internal clock QCLK, the sixth latched command ICMDL6 is generated in synchronization with the third internal clock IBCLK, and the seventh latched command ICMDL7 is generated in synchronization with the fourth internal clock QBCLK. In the case where the logic level combination of the phase control signal PH<0:1> is '10,' the seventh latched command ICMDL7 is selected and outputted as the selected command ICMDS at a time T22d. At a time T23d, the selected command ICMDS is latched in synchronization with the delay-locked clock DCLK and is outputted as the delayed command DCMD. In the case where the logic level combination of the phase control signal PH<0:1> is '10,' the first delay period D1 of the command delay circuit 34a is set as a period from the time T21d to the time T23d.

Summarizing these, it may be seen that each time the logic level combination of the phase control signal PH<0:1> changes in the sequence of '11,' '01,' 00,' and '10,' the first delay period D1 of the command delay circuit 34a increases by a period corresponding to a quarter (¼) cycle of the first internal clock ICLK (a period corresponding to a half (½) cycle of the clock CLK).

Figure 18:
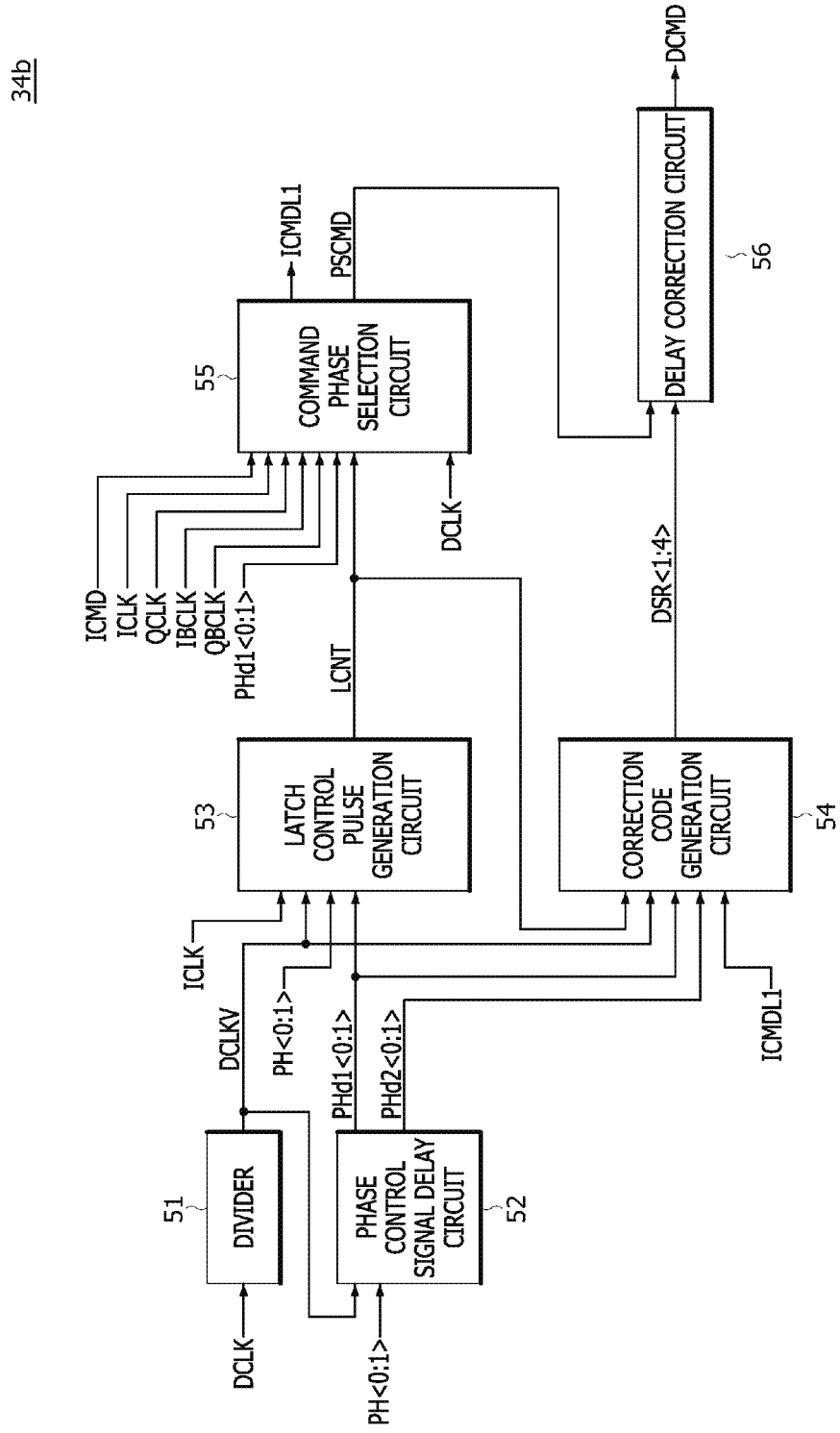
FIG. 18 shows a block diagram illustrating a configuration of the command delay circuit included in the latency command generation circuit shown in FIG. 6.

Referring to FIG. 18, a command delay circuit 34b in accordance with an embodiment may include a divider 51, a phase control signal delay circuit 52, a latch control pulse generation circuit 53, a correction code generation circuit 54, a command phase selection circuit 55, and a delay correction circuit 56.

The divider 51 may divide the delay-locked clock DCLK and thereby generate a divided delay clock DCLKV. The cycle of the divided delay clock DCLKV may be set to be K times greater than the cycle of the delay-locked clock DCLK. K may be set to a natural number of 2 or more.

The phase control signal delay circuit 52 may delay the phase control signal PH<0:1> in response to the divided delay clock DCLKV and thereby generate a first delayed phase control signal PHd1<0:1> and a second delayed phase control signal PHd2<0:1>. The phase control signal delay circuit 52 may generate the first delayed phase control signal PHd1<0:1> and the second delayed phase control signal PHd2<0:1> by latching the phase control signal PH<0:1> sequentially in synchronization with the divided delay clock DCLKV. A detailed configuration and operation of the phase control signal delay circuit 52 is described later with reference to FIG. 19.

The latch control pulse generation circuit 53 may generate a latch control pulse LCNT in response to the first internal clock ICLK, the divided delay clock DCLKV, the phase control signal PH<0:1>, and the first delayed phase control signal PHd1<0:1>. The latch control pulse generation circuit 53 may output the latch control pulse LCNT by latching a pulse, which is generated in the case where the phase control signal PH<0:1> and the first delayed phase control signal PHd1<0:1> are different, in synchronization with the divided delay clock DCLKV, and by then latching the latched pulse in synchronization with the first internal clock ICLK. In the case where the logic level combination of the phase control signal PH<0:1> changes, the phase control signal PH<0:1> and the first delayed phase control signal PHd1<0:1> may become different. A detailed configuration and operation of the latch control pulse generation circuit 53 is described later with reference to FIG. 20.

The correction code generation circuit 54 may generate a correction code DSR<1:4> in response to the latch control pulse LCNT, the divided delay clock DCLKV, a first latched command ICMDL1, the first delayed phase control signal PHd1<0:1>, and the second delayed phase control signal PHd2<0:1>. The correction code generation circuit 54 may generate the correction code DSR<1:4> by generating a shifting code (see the reference symbol SR<1:4> of FIG. 21) for which a logic level combination is set depending on the divided delay clock DCLKV, the first delayed phase control signal PHd1<0:1>, and the second delayed phase control signal PHd2<0:1> and by then latching the shifting code SR<1:4> sequentially by the latch control pulse LCNT and the first latched command ICMDL1.

In the case where the logic level combination of the second bit PHd1<1> of the first delayed phase control signal PHd1<0:1> and the second delayed phase control signal PHd2<0:1> is a first combination, the correction code generation circuit 54 may shift the correction code DSR<1:4> to increase the delay period of the delay correction circuit 56. For example, in the case where the correction code DSR<1:4> is shifted from '0001' to '0010,' the delay period of the delay correction circuit 56 is increased. The case where the logic level combination of the second bit PHd1<1> of the first delayed phase control signal PHd1<0:1> and the second delayed phase control signal PHd2<0:1> is the first combination means a state in which the second bit PHd1<1> of the first delayed phase control signal PHd1<0:1> is at a logic high level and the logic level combination of the second delayed phase control signal PHd2<0:1> is set to '10.' The state in which the logic level combination of the second delayed phase control signal PHd2<0:1> is set to '10' means a state in which the first bit PHd2<0> of the second delayed phase control signal PHd2<0:1> is at a logic high level and the second bit PHd2<1> of the second delayed phase control signal PHd2<0:1> is at a logic low level. In the case where the logic level combination of the phase control signal PH<0:1> changes from '11' to '01,' the logic level combination of the second bit PHd1<1> of the first delayed phase control signal PHd1<0:1> and the second delayed phase control signal PHd2<0:1> may be set to the first combination.

In the case where the logic level combination of the second bit PHd1<1> of the first delayed phase control signal PHd1<0:1> and the second delayed phase control signal PHd2<0:1> is a second combination, the correction code generation circuit 54 may shift the correction code DSR<1:4> to decrease the delay period of the delay correction circuit 56. For example, in the case where the correction code DSR<1:4> is shifted from '0010' to '0001,' the delay period of the delay correction circuit 56 is decreased. The case where the logic level combination of the second bit PHd1<1> of the first delayed phase control signal PHd1<0:1> and the second delayed phase control signal PHd2<0:1> is the second combination means a state in which the second bit PHd1<1> of the first delayed phase control signal PHd1<0:1> is at a logic low level and the logic level combination of the second delayed phase control signal PHd2<0:1> is set to '11.' In the case where the logic level combination of the phase control signal PH<0:1> changes from '01' to '11,' the logic level combination of the second bit PHd1<1> of the first delayed phase control signal PHd1<0:1> and the second delayed phase control signal PHd2<0:1> may be set to the second combination. A detailed configuration and operation of the correction code generation circuit 54 is described later with reference to FIGS. 21 to 24.

The command phase selection circuit 55 may generate a phase selection command PSCMD by delaying the internal command ICMD in response to the first internal clock ICLK, the second internal clock QCLK, the third internal clock IBCLK, the fourth internal clock QBCLK, the first delayed phase control signal PHd1<0:1>, the latch control pulse LCNT, and the delay-locked clock DCLK. The command phase selection circuit 55 may output the phase selection command PSCMD by latching the internal command ICMD sequentially by clocks selected from among the first internal clock ICLK, the second internal clock QCLK, the third internal clock IBCLK, and the fourth internal clock QBCLK, depending on the logic level combination of the first delayed phase control signal PHd1<0:1>, and by then latching the sequentially latched internal command ICMD in synchronization with the delay-locked clock DCLK. A detailed configuration and operation of the command phase selection circuit 55 is described later with reference to FIG. 25.

The delay correction circuit 56 may delay the phase selection command PSCMD in response to the correction code DSR<1:4> and thereby generate the delayed command DCMD. The delay correction circuit 56 may generate the delayed command DCMD by delaying the phase selection command PSCMD by a delay period set depending on the logic level combination of the correction code DSR<1:4>. A detailed configuration and operation of the delay correction circuit 56 is described later with reference to FIGS. 26 to 30.

Figure 19:
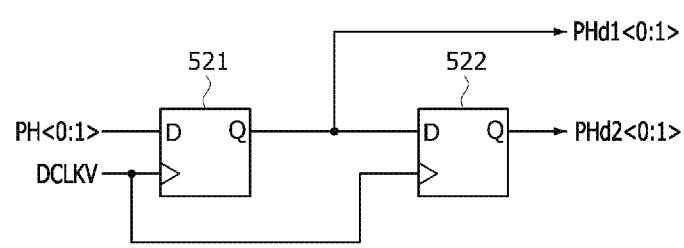
FIG. 19 shows a circuit diagram illustrating the phase control signal delay circuit included in the command delay circuit shown in FIG. 18.

Referring to FIG. 19, the phase control signal delay circuit 52 may include a first phase latch 521 and a second phase latch 522. The first phase latch 521 may latch the phase control signal PH<0:1> in synchronization with the divided delay clock DCLKV, and output the latched phase control signal PH<0:1> as the first delayed phase control signal PHd1<0:1>. The second phase latch 522 may latch the first delayed phase control signal PHd1<0:1> in synchronization with the divided delay clock DCLKV, and output the latched first delayed phase control signal PHd1<0:1> as the second delayed phase control signal PHd2<0:1>.

Figure 20:
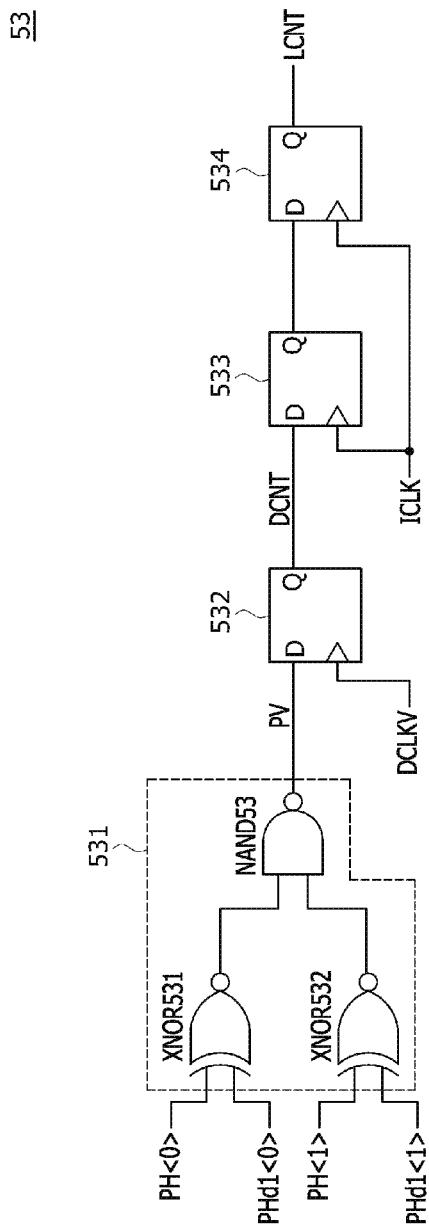
FIG. 20 shows a circuit diagram illustrating the latch control pulse generation circuit included in the command delay circuit shown in FIG. 18.

Referring to FIG. 20, the latch control pulse generation circuit 53 may include a phase variable signal generation circuit 531, a first pulse latch 532, a second pulse latch 533, and a third pulse latch 534. The phase variable signal generation circuit 531 may include XNOR gates XNOR531 and XNOR532 and a NAND gate NAND53. The XNOR gate XNOR531 may receive the first bit PH<0> of the phase control signal PH<0:1> and the first bit PHd1<0> of the first delayed phase control signal PHd1<0:1>, and perform an XNOR logic operation. The XNOR gate XNOR531 may output a logic low level in the case where the first bit PH<0> of the phase control signal PH<0:1> and the first bit PHd1<0> of the first delayed phase control signal PHd1<0:1> have different logic levels. The XNOR gate XNOR532 may receive the second bit PH<1> of the phase control signal PH<0:1> and the second bit PHd1<1> of the first delayed phase control signal PHd1<0:1>, and perform an XNOR logic operation. The XNOR gate XNOR532 may output a logic low level in the case where the second bit PH<1> of the phase control signal PH<0:1> and the second bit PHd1<1> of the first delayed phase control signal PHd1<0:1> have different logic levels. The NAND gate NAND53 may receive the output signals of the XNOR gates XNOR531 and XNOR532 and perform a NAND logic operation. The NAND gate NAND53 may generate a phase variable signal PV which is enabled to a logic high level, in the case where at least one of the output signals of the XNOR gates XNOR531 and XNOR532 is at a logic low level. The first pulse latch 532 may latch the phase variable signal PV in synchronization with the divided delay clock DCLKV, and thereby output a divided control pulse DCNT. The second phase latch 533 may latch the divided control pulse DCNT in synchronization with the first internal clock ICLK, and output the latched divided control pulse DCNT. The third pulse latch 534 may latch the output signal of the second pulse latch 533 in synchronization with the first internal clock ICLK, and output the latched output signal of the second pulse latch 533, as the latch control pulse LCNT.

The latch control pulse generation circuit 53 may generate the phase variable signal PV, which is enabled to a logic high level, in the case where the phase control signal PH<0:1> and the first delayed phase control signal PHd1<0:1> are different. The latch control pulse generation circuit 53 may latch and output the phase variable signal PV in synchronization with the divided delay clock DCLKV. The latch control pulse generation circuit 53 may output the latch control pulse LCNT by latching the phase variable signal PV which is latched in synchronization with the divided delay clock DCLKV, in synchronization with the first internal clock ICLK.

Figure 21:
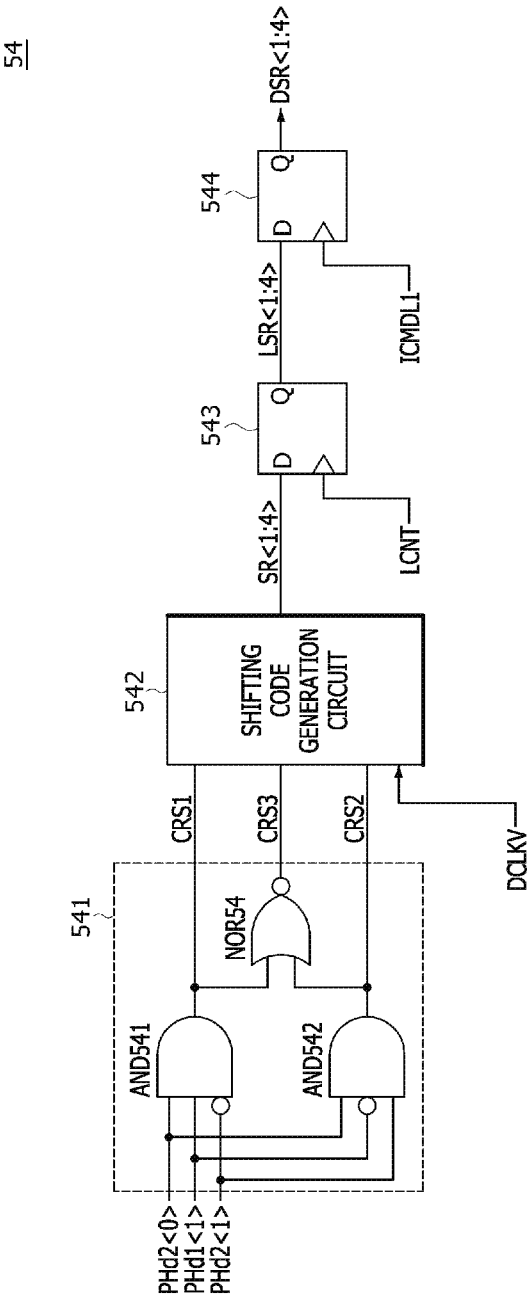
FIG. 21 shows a diagram illustrating the correction code generation circuit included in the command delay circuit shown in FIG. 18.

Referring to FIG. 21, the correction code generation circuit 54 may include a code adjustment signal generation circuit 541, a shifting code generation circuit 542, a first code latch 543, and a second code latch 544.

The code adjustment signal generation circuit 541 may include AND gates AND541 and AND542 and a NOR gate NOR54. The AND gate AND541 may receive the first bit PHd2<0> of the second delayed phase control signal PHd2<0:1>, the second bit PHd1<1> of the first delayed phase control signal PHd1<0:1>, and an inverted signal of the second bit PHd2<1> of the second delayed phase control signal PHd2<0:1>, and perform an AND logic operation. The AND gate AND541 may generate a first code adjustment signal CRS1, which is enabled to a logic high level, in the case where the logic level combination of the second bit PHd1<1> of the first delayed phase control signal PHd1<0:1> and the second delayed phase control signal PHd2<0:1> is a first combination. The case where the logic level combination of the second bit PHd1<1> of the first delayed phase control signal PHd1<0:1> and the second delayed phase control signal PHd2<0:1> is the first combination means a state in which the second bit PHd1<1> of the first delayed phase control signal PHd1<0:1> is at a logic high level and the logic level combination of the second delayed phase control signal PHd2<0:1> is set to '10.' The AND gate AND542 may receive the first bit PHd2<0> of the second delayed phase control signal PHd2<0:1>, an inverted signal of the second bit PHd1<1> of the first delayed phase control signal PHd1<0:1> and the second bit PHd2<1> of the second delayed phase control signal PHd2<0:1>, and perform an AND logic operation. The AND gate AND542 may generate a second code adjustment signal CRS2 which is enabled to a logic high level, in the case where the logic level combination of the second bit PHd1<1> of the first delayed phase control signal PHd1<0:1> and the second delayed phase control signal PHd2<0:1> is a second combination. The case where the logic level combination of the second bit PHd1<1> of the first delayed phase control signal PHd1<0:1> and the second delayed phase control signal PHd2<0:1> is the second combination means a state in which the second bit PHd1<1> of the first delayed phase control signal PHd1<0:1> is at a logic low level and the logic level combination of the second delayed phase control signal PHd2<0:1> is set to '11.' The NOR gate NOR54 may receive the first code adjustment signal CRS1 and the second code adjustment signal CRS2, and perform a NOR logic operation. The NOR gate NOR54 may generate a third code adjustment signal CRS3 which is enabled to a logic high level, in the case where both the first code adjustment signal CRS1 and the second code adjustment signal CRS2 are disabled to logic low levels. The NOR gate NOR54 may generate the third code adjustment signal CRS3 which is disabled to a logic low level, in the case where the first code adjustment signal CRS1 or the second code adjustment signal CRS2 is enabled to a logic high level.

The shifting code generation circuit 542 may generate the shifting code SR<1:4> in response to the first code adjustment signal CRS1, the second code adjustment signal CRS2, and the third code adjustment signal CRS3. The shifting code generation circuit 542 may store the shifting code SR<1:4>, which has an initialized logic level combination. The initialized logic level combination of the shifting code SR<1:4> may be set variously depending on an embodiment. In the case where the first code adjustment signal CRS1 is enabled to a logic high level, the shifting code generation circuit 542 may shift the shifting code SR<1:4> to increase the delay period of the delay correction circuit 56. For example, in the case where the shifting code SR<1:4> is shifted from '0001' to '0010,' the delay period of the delay correction circuit 56 is increased. In the case where the second code adjustment signal CRS2 is enabled to a logic high level, the shifting code generation circuit 542 may shift the shifting code SR<1:4> to decrease the delay period of the delay correction circuit 56. For example, in the case where the shifting code SR<1:4> is shifted from '0010' to '0001,' the delay period of the delay correction circuit 56 is decreased. In the case where the third code adjustment signal CRS3 is enabled to a logic high level, the shifting code generation circuit 542 may generate the shifting code SR<1:4> which holds a constant logic level combination to allow the delay period of the delay correction circuit 56 to be constantly held. The first code latch 543 may latch the shifting code SR<1:4> in synchronization with the latch control pulse LCNT, and output the latched shifting code SR<1:4> as a latched shifting code LSR<1:4>. The second code latch 544 may latch the latched shifting code LSR<1:4> in synchronization with the first latched command ICMDL1, and output the latched shifting code LSR<1:4> as the correction code DSR<1:4>.

The operation of the correction code generation circuit 54 shown in FIG. 21 is described below with reference to FIGS. 22 to 24.

Figure 22:
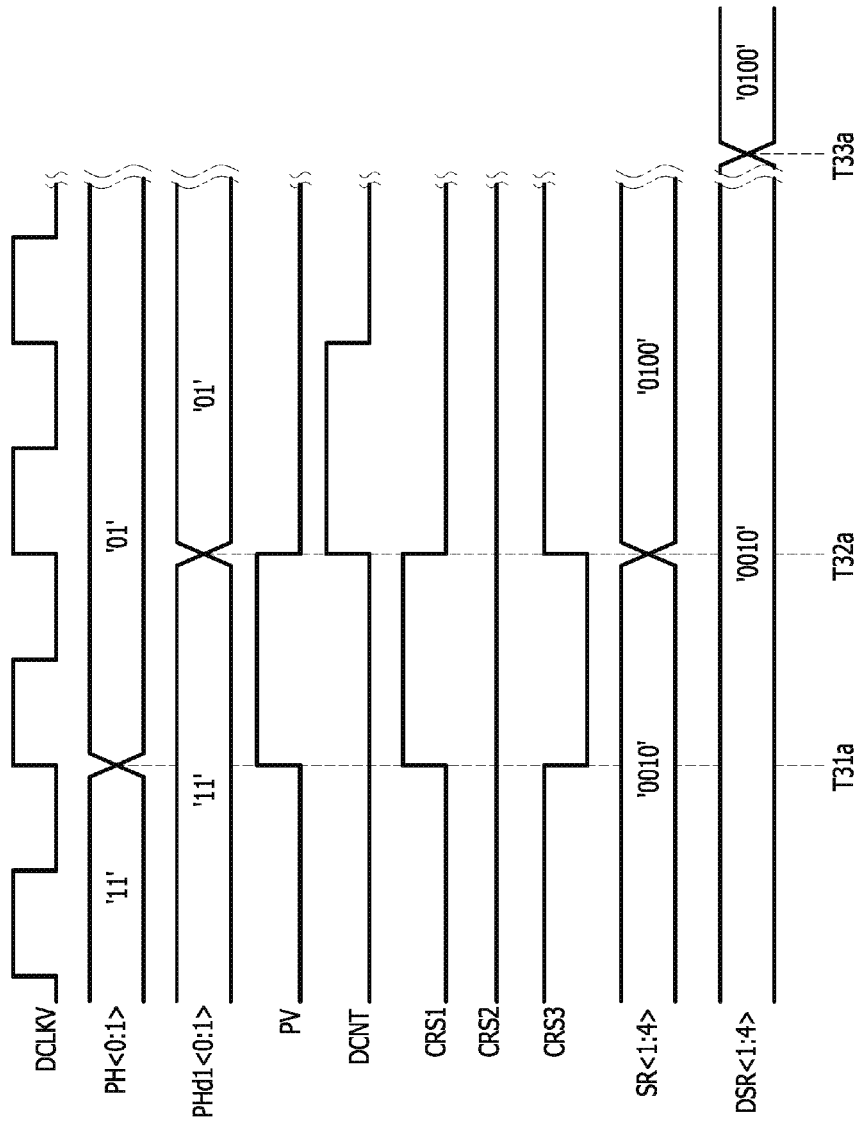
FIGS. 22 to 24 show timing diagrams to assist in the description of the operation of the correction code generation circuit shown in FIG. 21.

As shown in FIG. 22, in the case where the logic level combination of the phase control signal PH<0:1> changes from '11' to '01' at a time T31a, the logic level combination of the first delayed phase control signal PHd1<0:1> changes from '11' to '01' at a time T32a. The phase variable signal PV is enabled to a logic high level in synchronization with the divided delay clock DCLKV during a period from the time T31a to the time T32a in which the logic level combinations of the phase control signal PH<0:1> and the first delayed phase control signal PHd1<0:1> are different. Because the logic level combination of the second bit PHd1<1> of the first delayed phase control signal PHd1<0:1> and the second delayed phase control signal PHd2<0:1> is the first combination during the period from the time T31a to the time T32a, the first code adjustment signal CRS1 is enabled to a logic high level, and the second code adjustment signal CRS2 and the third code adjustment signal CRS3 are disabled to logic low levels. The divided control pulse DCNT is generated at the time T32a as the phase variable signal PV is latched in synchronization with the divided delay clock DCLKV. At the time T32a, the shifting code SR<1:4> is shifted from '0010' to '0100' in synchronization with the divided control pulse DCNT such that the delay period of the delay correction circuit 56 is increased. The correction code DSR<1:4> is generated as the shifting code SR<1:4> is latched sequentially in synchronization with the latch control pulse LCNT and the first latched command ICMDL1. The correction code DSR<1:4> is shifted from '0010' to '0100' at a time T33a.

Figure 23:
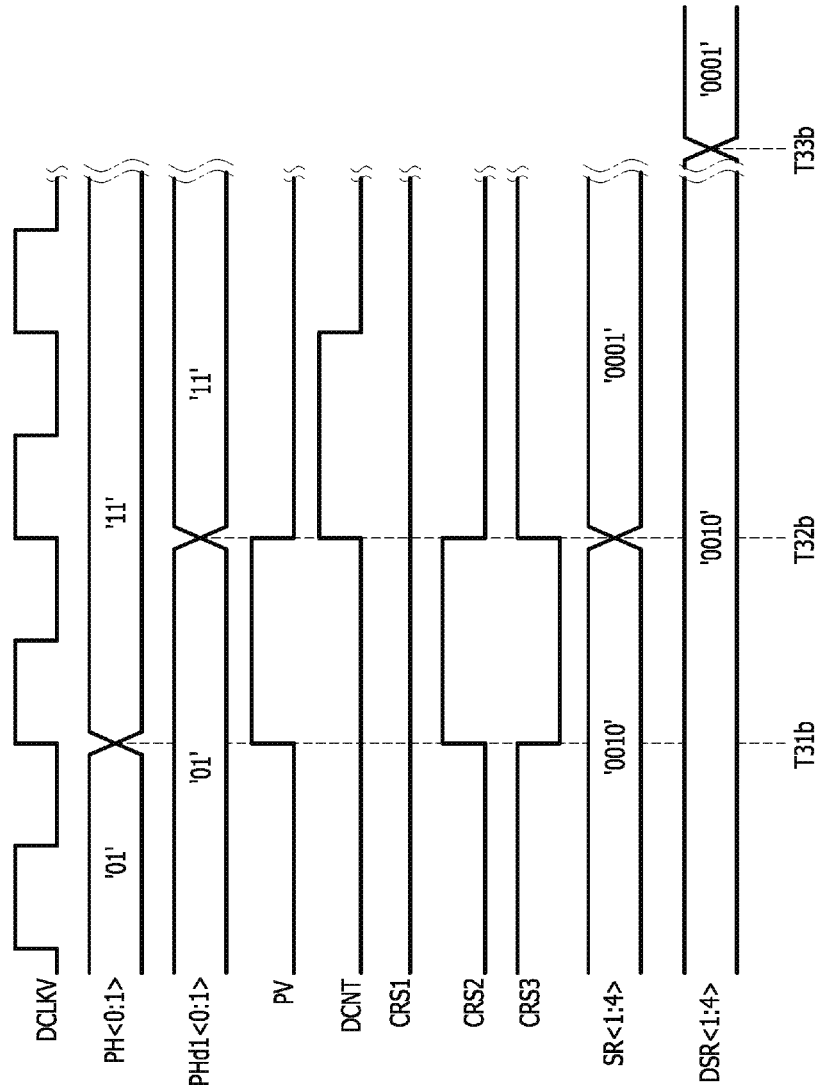

As shown in FIG. 23, in the case where the logic level combination of the phase control signal PH<0:1> changes from '01' to '11' at a time T31b, the logic level combination of the first delayed phase control signal PHd1<0:1> changes from '01' to '11' at a time T32b. The phase variable signal PV is enabled to a logic high level in synchronization with the divided delay clock DCLKV during a period from the time T31b to the time T32b in which the logic level combinations of the phase control signal PH<0:1> and the first delayed phase control signal PHd1<0:1> are different. Because the logic level combination of the second bit PHd1<1> of the first delayed phase control signal PHd1<0:1> and the second delayed phase control signal PHd2<0:1> is the second combination during the period from the time T31b to the time T32b, the second code adjustment signal CRS2 is enabled to a logic high level, and the first code adjustment signal CRS1 and the third code adjustment signal CRS3 are disabled to logic low levels. The divided control pulse DCNT is generated at the time T32b as the phase variable signal PV is latched in synchronization with the divided delay clock DCLKV. At the time T32b, the shifting code SR<1:4> is shifted from '0010' to '0001' in synchronization with the divided control pulse DCNT such that the delay period of the delay correction circuit 56 is decreased. The correction code DSR<1:4> is generated as the shifting code SR<1:4> is latched sequentially in synchronization with the latch control pulse LCNT and the first latched command ICMDL1. The correction code DSR<1:4> is shifted from '0010' to '0001' at a time T33b.

Figure 24:
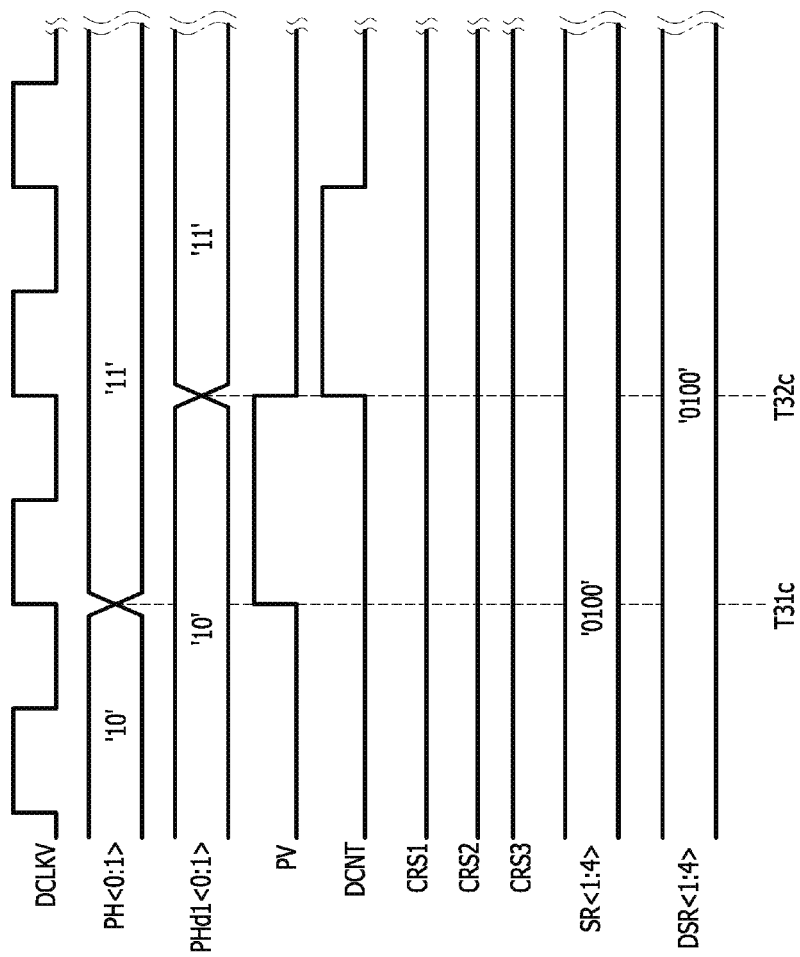

As shown in FIG. 24, in the case where the logic level combination of the phase control signal PH<0:1> changes from '10' to '11' at a time T31c, the logic level combination of the first delayed phase control signal PHd1<0:1> changes from '10' to '11' at a time T32c. The phase variable signal PV is enabled to a logic high level in synchronization with the divided delay clock DCLKV during a period from the time T31c to the time T32c in which the logic level combinations of the phase control signal PH<0:1> and the first delayed phase control signal PHd1<0:1> are different. Because the logic level combination of the second bit PHd1<1> of the first delayed phase control signal PHd1<0:1> and the second delayed phase control signal PHd2<0:1> is not the first combination or the second combination during the period from the time T31c to the time T32c, the third code adjustment signal CRS3 is enabled to a logic high level, and the first code adjustment signal CRS1 and the second code adjustment signal CRS2 are disabled to logic low levels. The divided control pulse DCNT is generated at the time T32c as the phase variable signal PV is latched in synchronization with the divided delay clock DCLKV. At the time T32c, the shifting code SR<1:4> holds '0010' in synchronization with the divided control pulse DCNT such that the delay period of the delay correction circuit 56 is held. The correction code DSR<1:4> is generated as the shifting code SR<1:4> is latched sequentially in synchronization with the latch control pulse LCNT and the first latched command ICMDL1. The correction code DSR<1:4> holds '0010.'

Figure 25:
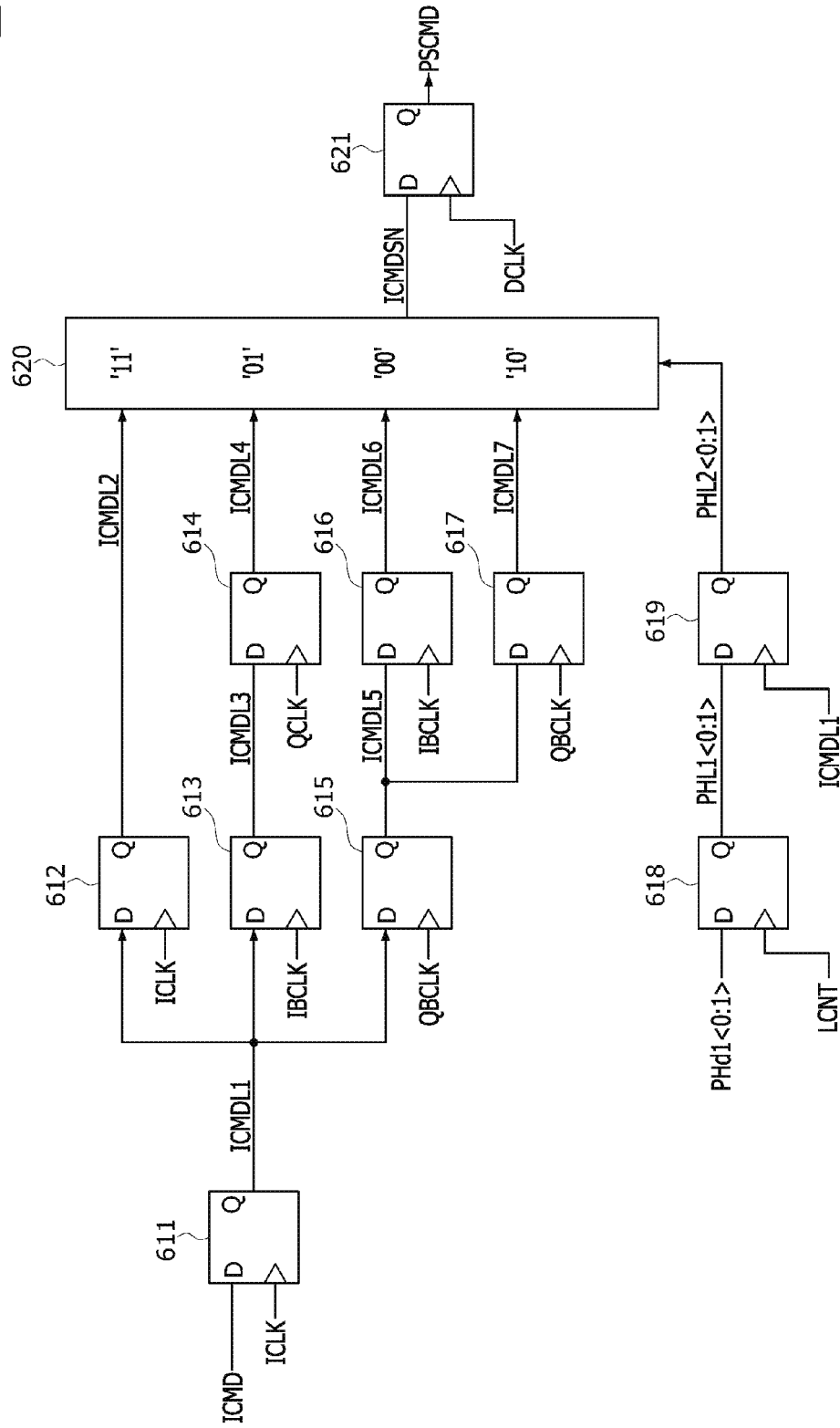
FIG. 25 shows a circuit diagram illustrating the command phase selection circuit included in the command delay circuit shown in FIG. 18.

Referring to FIG. 25, the command phase selection circuit 55 in accordance with an embodiment may include a first command latch 611, a second command latch 612, a third command latch 613, a fourth command latch 614, a fifth command latch 615, a sixth command latch 616, a seventh command latch 617, a first phase control signal latch 618, a second phase control signal latch 619, a command selector 620, and a command output latch 621.

The first command latch 611 may latch the internal command ICMD in synchronization with the first internal clock ICLK and output the latched internal command ICMD as the first latched command ICMDL1. The second command latch 612 may latch the first latched command ICMDL1 in synchronization with the first internal clock ICLK and output the latched first latched command ICMDL1 as a second latched command ICMDL2. The third command latch 613 may latch the first latched command ICMDL1 in synchronization with the third internal clock IBCLK and output the latched first latched command ICMDL1 as a third latched command ICMDL3. The fourth command latch 614 may latch the third latched command ICMDL3 in synchronization with the second internal clock QCLK and output the latched third latched command ICMDL3 as a fourth latched command ICMDL4. The fifth command latch 615 may latch the first latched command ICMDL1 in synchronization with the fourth internal clock QBCLK and output the latched first latched command ICMDL1 as a fifth latched command ICMDL5. The sixth command latch 616 may latch the fifth latched command ICMDL5 in synchronization with the third internal clock IBCLK and output the latched fifth latched command ICMDL5 as a sixth latched command ICMDL6. The seventh command latch 617 may latch the fifth latched command ICMDL5 in synchronization with the fourth internal clock QBCLK and output the latched fifth latched command ICMDL5 as a seventh latched command ICMDL7. The first phase control signal latch 618 may latch the first delayed phase control signal PHd1<0:1> in synchronization with the latch control pulse LCNT, and output the latched first delayed phase control signal PHd1<0:1> as a first latched phase control signal PHL1<0:1>. The second phase control signal latch 619 may latch the first latched phase control signal PHL1<0:1> in synchronization with the first latched command ICMDL1, and output the latched first latched phase control signal PHL1<0:1> as a second latched phase control signal PHL2<0:1>. In the present embodiment, each of the first command latch 611, the second command latch 612, the third command latch 613, the fourth command latch 614, the fifth command latch 615, the sixth command latch 616, the seventh command latch 617, the first phase control signal latch 618 and the second phase control signal latch 619 may be realized by a D flip-flop.

The command selector 620 may generate a selected command ICMDSN from the second latched command ICMDL2, the fourth latched command ICMDL4, the sixth latched command ICMDL6 and the seventh latched command ICMDL7 in response to the second latched phase control signal PHL2<0:1>. The command selector 620 may output the selected command ICMDSN by selecting one from among the second latched command ICMDL2, the fourth latched command ICMDL4, the sixth latched command ICMDL6 and the seventh latched command ICMDL7 depending on the logic level combination of the second latched phase control signal PHL2<0:1>. The command selector 620 may output the second latched command ICMDL2 as the selected command ICMDSN in the case where the logic level combination of the second latched phase control signal PHL2<0:1> is '11.' The command selector 620 may output the selected command ICMDSN by selecting the fourth latched command ICMDL4 in the case where the logic level combination of the second latched phase control signal PHL2<0:1> is '01.' The command selector 620 may output the selected command ICMDSN by selecting the sixth latched command ICMDL6 in the case where the logic level combination of the second latched phase control signal PHL2<0:1> is '00.' The command selector 620 may output the selected command ICMDSN by selecting the seventh latched command ICMDL7 in the case where the logic level combination of the second latched phase control signal PHL2<0:1> is '10.' The command output latch 621 may latch the selected command ICMDSN in synchronization with the delay-locked clock DCLK, and output the latched selected command ICMDSN as the phase selection command PSCMD.

In the case where the logic level combination of the second latched phase control signal PHL2<0:1> is '11,' the command phase selection circuit 55 may generate the phase selection command PSCMD by generating the selected command ICMDSN through latching the internal command ICMD in synchronization with the first internal clock ICLK and then latching the latched internal command ICMD in synchronization with the first internal clock ICLK and by then latching the selected command ICMDSN in synchronization with the delay-locked clock DCLK. In the case where the logic level combination of the second latched phase control signal PHL2<0:1> is '01,' the command phase selection circuit 55 may generate the phase selection command PSCMD by generating the selected command ICMDSN through latching the internal command ICMD sequentially in synchronization with the first internal clock ICLK, the third internal clock IBCLK and the second internal clock QCLK and by then latching the selected command ICMDSN in synchronization with the delay-locked clock DCLK. In the case where the logic level combination of the second latched phase control signal PHL2<0:1> is '00,' the command phase selection circuit 55 may generate the phase selection command PSCMD by generating the selected command ICMDSN through latching the internal command ICMD sequentially in synchronization with the first internal clock ICLK, the fourth internal clock QBCLK and the third internal clock IBCLK and by then latching the selected command ICMDSN in synchronization with the delay-locked clock DCLK. In the case where the logic level combination of the second latched phase control signal PHL2<0:1> is '10,' the command phase selection circuit 55 may generate the phase selection command PSCMD by generating the selected command ICMDSN through latching the internal command ICMD sequentially in synchronization with the first internal clock ICLK, the fourth internal clock QBCLK and the fourth internal clock QBCLK and by then latching the selected command ICMDSN in synchronization with the delay-locked clock DCLK.

Figure 26:
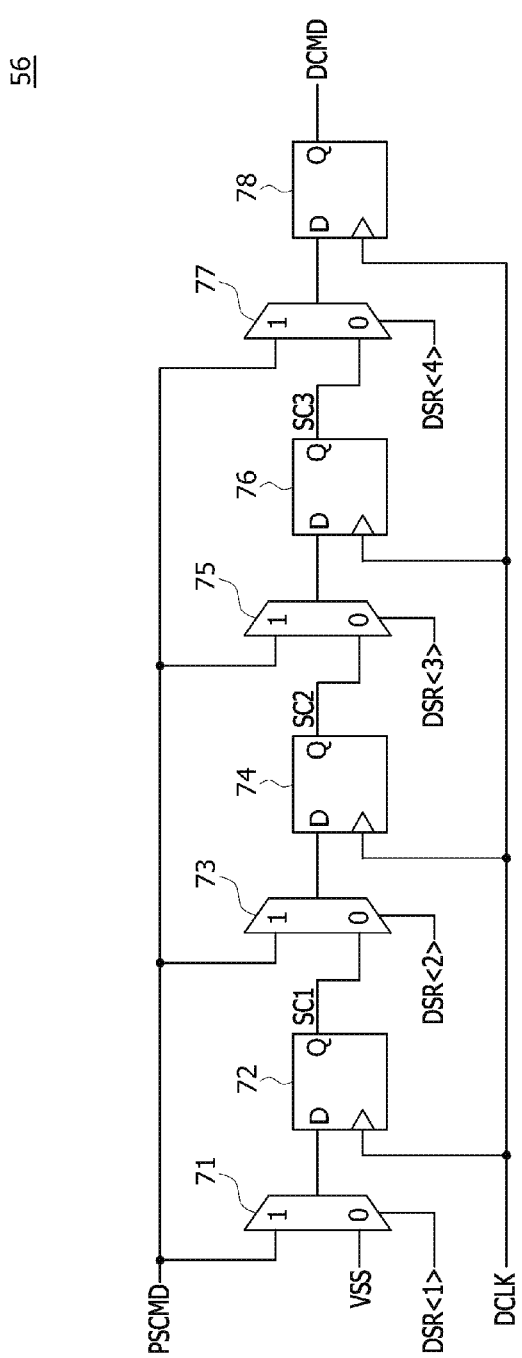

Referring to FIG. 26, the delay correction circuit 56 may include a first selector 71, a first selected command latch 72, a second selector 73, a second selected command latch 74, a third selector 75, a third selected command latch 76, a fourth selector 77, and a delayed command latch 78.

The first selector 71 may selectively output the phase selection command PSCMD or the ground voltage VSS in response to the first bit DSR<1> of the correction code DSR<1:4>. The first selector 71 may output the phase selection command PSCMD in the case where the first bit DSR<1> of the correction code DSR<1:4> is at a logic high level. The first selector 71 may output the ground voltage VSS in the case where the first bit DSR<1> of the correction code DSR<1:4> is at a logic low level. The first selected command latch 72 may latch the output signal of the first selector 71 in synchronization with the delay-locked clock DCLK, and output the latched output signal of the first selector 71 as a first selected command SC1.

The second selector 73 may selectively output the phase selection command PSCMD or the first selected command SC1 in response to the second bit DSR<2> of the correction code DSR<1:4>. The second selector 73 may output the phase selection command PSCMD in the case where the second bit DSR<2> of the correction code DSR<1:4> is at a logic high level. The second selector 73 may output the first selected command SC1 in the case where the second bit DSR<2> of the correction code DSR<1:4> is at a logic low level. The second selected command latch 74 may latch the output signal of the second selector 73 in synchronization with the delay-locked clock DCLK, and output the latched output signal of the second selector 73 as a second selected command SC2.

The third selector 75 may selectively output the phase selection command PSCMD or the second selected command SC2 in response to the third bit DSR<3> of the correction code DSR<1:4>. The third selector 75 may output the phase selection command PSCMD in the case where the third bit DSR<3> of the correction code DSR<1:4> is at a logic high level. The third selector 75 may output the second selected command SC2 in the case where the third bit DSR<3> of the correction code DSR<1:4> is at a logic low level. The third selected command latch 76 may latch the output signal of the third selector 75 in synchronization with the delay-locked clock DCLK, and output the latched output signal of the third selector 75 as a third selected command SC3.

The fourth selector 77 may selectively output the phase selection command PSCMD or the third selected command SC3 in response to the fourth bit DSR<4> of the correction code DSR<1:4>. The fourth selector 77 may output the phase selection command PSCMD in the case where the fourth bit DSR<4> of the correction code DSR<1:4> is at a logic high level. The fourth selector 77 may output the third selected command SC3 in the case where the fourth bit DSR<4> of the correction code DSR<1:4> is at a logic low level. The delayed command latch 78 may latch the output signal of the fourth selector 77 in synchronization with the delay-locked clock DCLK, and output the latched output signal of the fourth selector 77 as the delayed command DCMD.

The delay correction circuit 56 may generate the delayed command DCMD by delaying the phase selection command PSCMD by a delay period determined depending on the logic level combination of the correction code DSR<1:4>. In the case where the logic level combination of the correction code DSR<1:4> is '1000,' the delayed command DCMD may be generated by delaying the phase selection command PSCMD through the first selector 71, the first selected command latch 72, the second selector 73, the second selected command latch 74, the third selector 75, the third selected command latch 76, the fourth selector 77, and the delayed command latch 78. The case where the logic level combination of the correction code DSR<1:4> is '1000' means that the first bit DSR<1> of the correction code DSR<1:4> is at a logic high level and all of the second bit DSR<2> of the correction code DSR<1:4>, the third bit DSR<3> of the correction code DSR<1:4> and the fourth bit DSR<4> of the correction code DSR<1:4> are at logic low levels. In the case where the logic level combination of the correction code DSR<1:4> is '0100,' the delayed command DCMD may be generated by delaying the phase selection command PSCMD through the second selector 73, the second selected command latch 74, the third selector 75, the third selected command latch 76, the fourth selector 77, and the delayed command latch 78. The case where the logic level combination of the correction code DSR<1:4> is '0100' means that the second bit DSR<2> of the correction code DSR<1:4> is at a logic high level and all of the first bit DSR<1> of the correction code DSR<1:4>, the third bit DSR<3> of the correction code DSR<1:4> and the fourth bit DSR<4> of the correction code DSR<1:4> are at logic low levels. In the case where the logic level combination of the correction code DSR<1:4> is '0010,' the delayed command DCMD may be generated by delaying the phase selection command PSCMD through the third selector 75, the third selected command latch 76, the fourth selector 77, and the delayed command latch 78. The case where the logic level combination of the correction code DSR<1:4> is '0010' means that the third bit DSR<3> of the correction code DSR<1:4> is at a logic high level and all of the first bit DSR<1> of the correction code DSR<1:4>, the second bit DSR<2> of the correction code DSR<1:4> and the fourth bit DSR<4> of the correction code DSR<1:4> are at logic low levels. In the case where the logic level combination of the correction code DSR<1:4> is '0001,' the delayed command DCMD may be generated by delaying the phase selection command PSCMD through the fourth selector 77 and the delayed command latch 78. The case where the logic level combination of the correction code DSR<1:4> is '0001' means that the fourth bit DSR<4> of the correction code DSR<1:4> is at a logic high level and all of the first bit DSR<1> of the correction code DSR<1:4>, the second bit DSR<2> of the correction code DSR<1:4> and the third bit DSR<3> of the correction code DSR<1:4> are at logic low levels.

The operation of the delay correction circuit 56 shown in FIG. 26 is described below in detail with reference to FIGS. 27 to 30.

Figure 27:
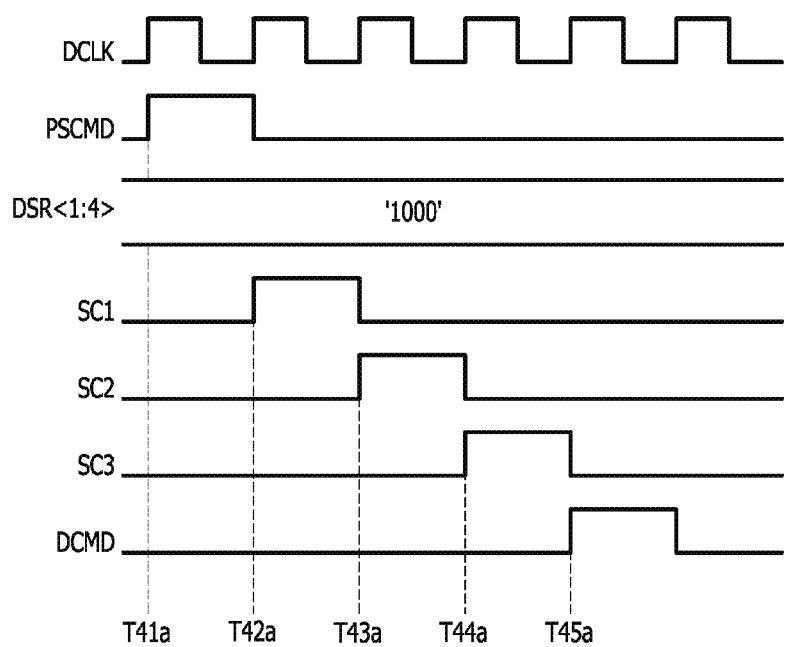
FIGS. 27 to 30 show timing diagrams to assist in the description of the operation of the delay correction circuit shown in FIG. 26.

As shown in FIG. 27, in the case where the phase selection command PSCMD is generated at a time T41a in a state in which the logic level combination of the correction code DSR<1:4> is set to '1000,' the first selected command SC1 is generated at a time T42a when a period corresponding to one cycle of the delay-locked clock DCLK elapses from the time T41a. The second selected command SC2 is generated at a time T43a when a period corresponding to one cycle of the delay-locked clock DCLK elapses from the time T42a, and the third selected command SC3 is generated at a time T44a when a period corresponding to one cycle of the delay-locked clock DCLK elapses from the time T43a. The delayed command DCMD is generated at a time T45a when a period corresponding to one cycle of the delay-locked clock DCLK elapses from the time T44a. In other words, the delayed command DCMD is generated at the time T45a when a period corresponding to four cycles of the delay-locked clock DCLK elapses from the time T41a when the phase selection command PSCMD is generated in the state in which the logic level combination of the correction code DSR<1:4> is set to '1000.'

Figure 28:
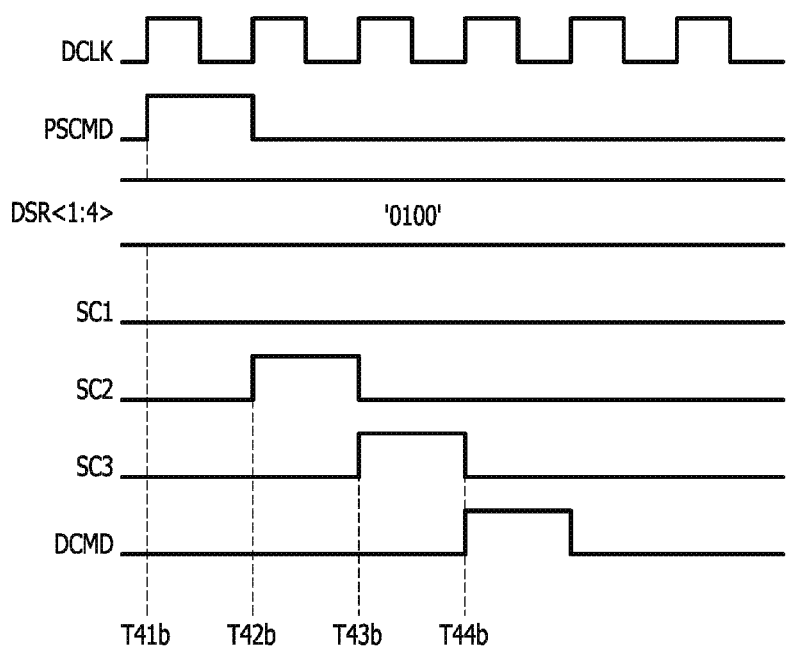

As shown in FIG. 28, in the case where the phase selection command PSCMD is generated at a time T41b in a state in which the logic level combination of the correction code DSR<1:4> is set to '0100,' the second selected command SC2 is generated at a time T42b when a period corresponding to one cycle of the delay-locked clock DCLK elapses from the time T41b. The third selected command SC3 is generated at a time T43b when a period corresponding to one cycle of the delay-locked clock DCLK elapses from the time T42b, and the delayed command DCMD is generated at a time T44b when a period corresponding to one cycle of the delay-locked clock DCLK elapses from the time T43b. In other words, the delayed command DCMD is generated at the time T44b when a period corresponding to three cycles of the delay-locked clock DCLK elapses from the time T41b when the phase selection command PSCMD is generated in the state in which the logic level combination of the correction code DSR<1:4> is set to '0100.'

Figure 29:
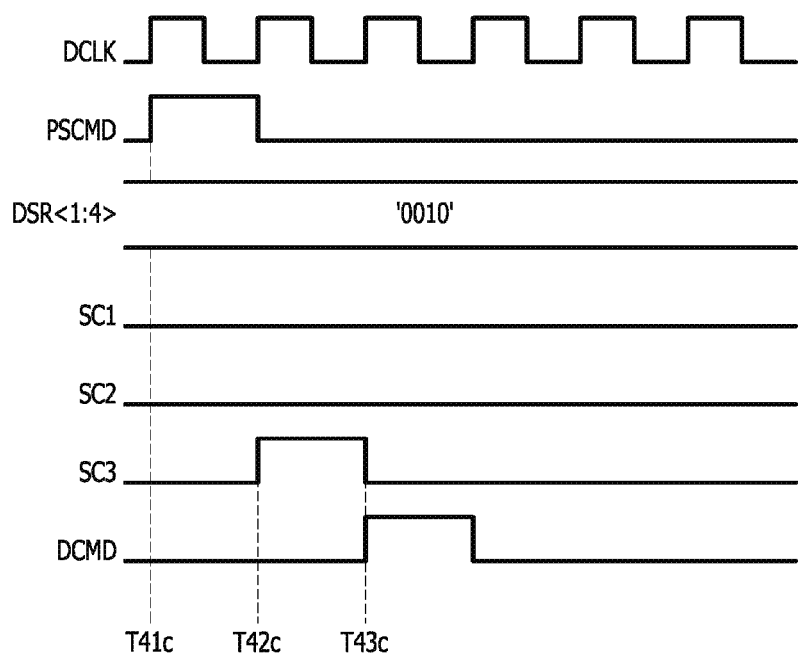

As shown in FIG. 29, in the case where the phase selection command PSCMD is generated at a time T41c in a state in which the logic level combination of the correction code DSR<1:4> is set to '0010,' the third selected command SC3 is generated at a time T42c when a period corresponding to one cycle of the delay-locked clock DCLK elapses from the time T41c. The delayed command DCMD is generated at a time T43c when a period corresponding to one cycle of the delay-locked clock DCLK elapses from the time T42c. In other words, the delayed command DCMD is generated at the time T43c when a period corresponding to two cycles of the delay-locked clock DCLK elapses from the time T41c when the phase selection command PSCMD is generated in the state in which the logic level combination of the correction code DSR<1:4> is set to '0010.'

Figure 30:
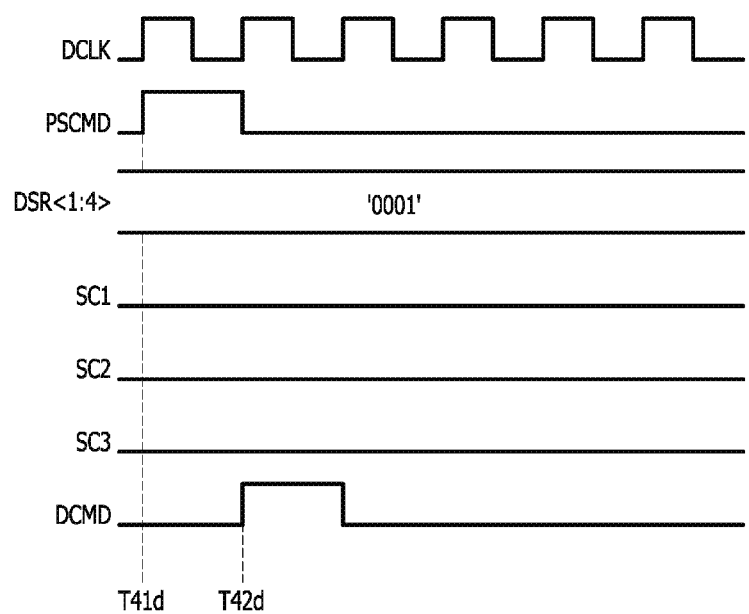

As shown in FIG. 30, in the case where the phase selection command PSCMD is generated at a time T41d in a state in which the logic level combination of the correction code DSR<1:4> is set to '0001,' the delayed command DCMD is generated at a time T42d when a period corresponding to one cycle of the delay-locked clock DCLK elapses from the time T41d. In other words, the delayed command DCMD is generated at the time T42d when a period corresponding to one cycle of the delay-locked clock DCLK elapses from the time T41d when the phase selection command PSCMD is generated in the state in which the logic level combination of the correction code DSR<1:4> is set to '0001.'

The operation of the command delay circuit 34b shown in FIG. 18 in the case where the logic level combination of the phase control signal PH<0:1> is set in the sequence of '01,' '00,' '10,' '11,' and '01' is described below with reference to FIGS. 31 to 35.

Figure 31:
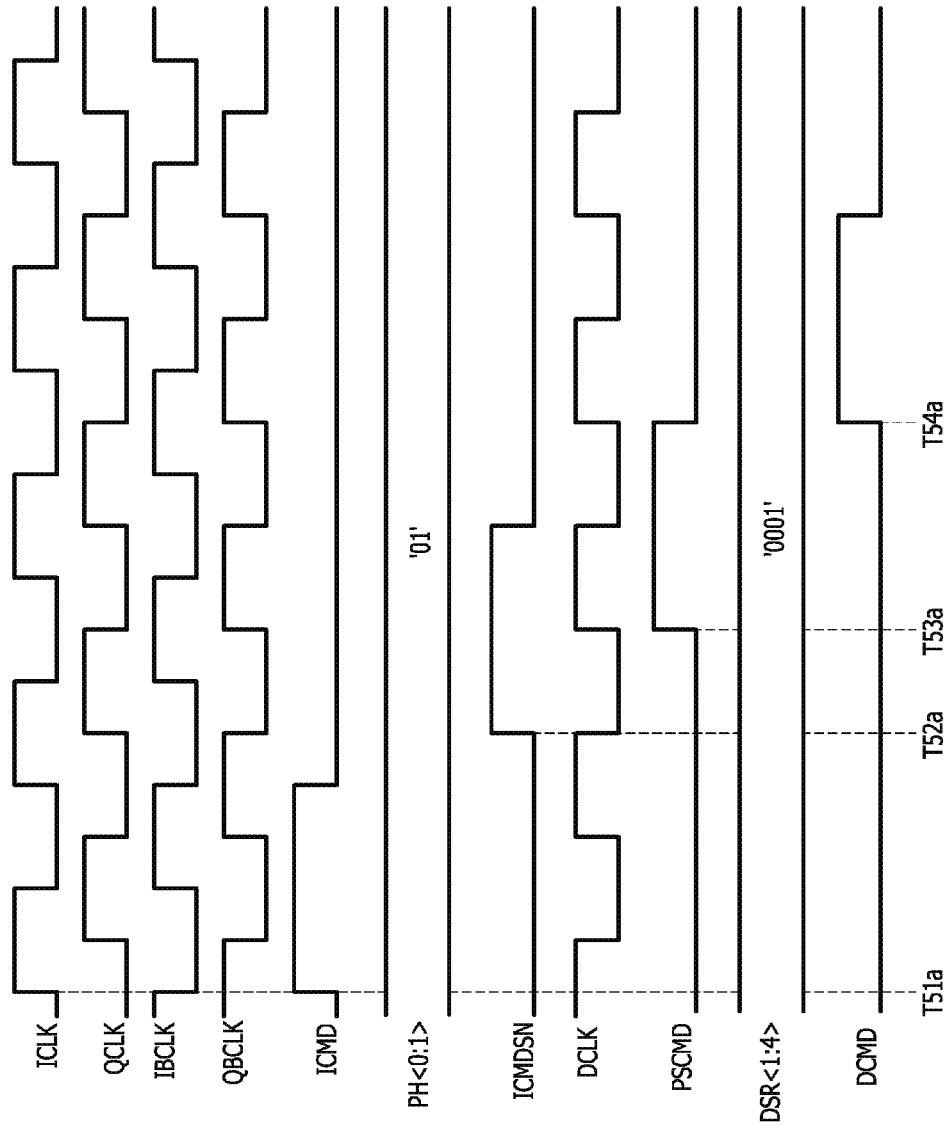
FIGS. 31 to 40 show timing diagrams to assist in the description of the operation of the latency command generation circuit shown in FIG. 6.

As shown in FIG. 31, in the case where the internal command ICMD is generated at a time T51a in a state in which the logic level combination of the phase control signal PH<0:1> is set to '01,' the selected command ICMDSN is generated in synchronization with the second internal clock QCLK at a time T52a. At a time T53a, the phase selection command PSCMD is outputted as the selected command ICMDSN and is latched in synchronization with the delay-locked clock DCLK. In a state in which the logic level combination of the correction code DSR<1:4> is set to '0001,' the delayed command DCMD is generated at a time T54a that is delayed by a period corresponding to one cycle of the delay-locked clock DCLK from the time T53a at which the phase selection command PSCMD is generated.

Figure 32:
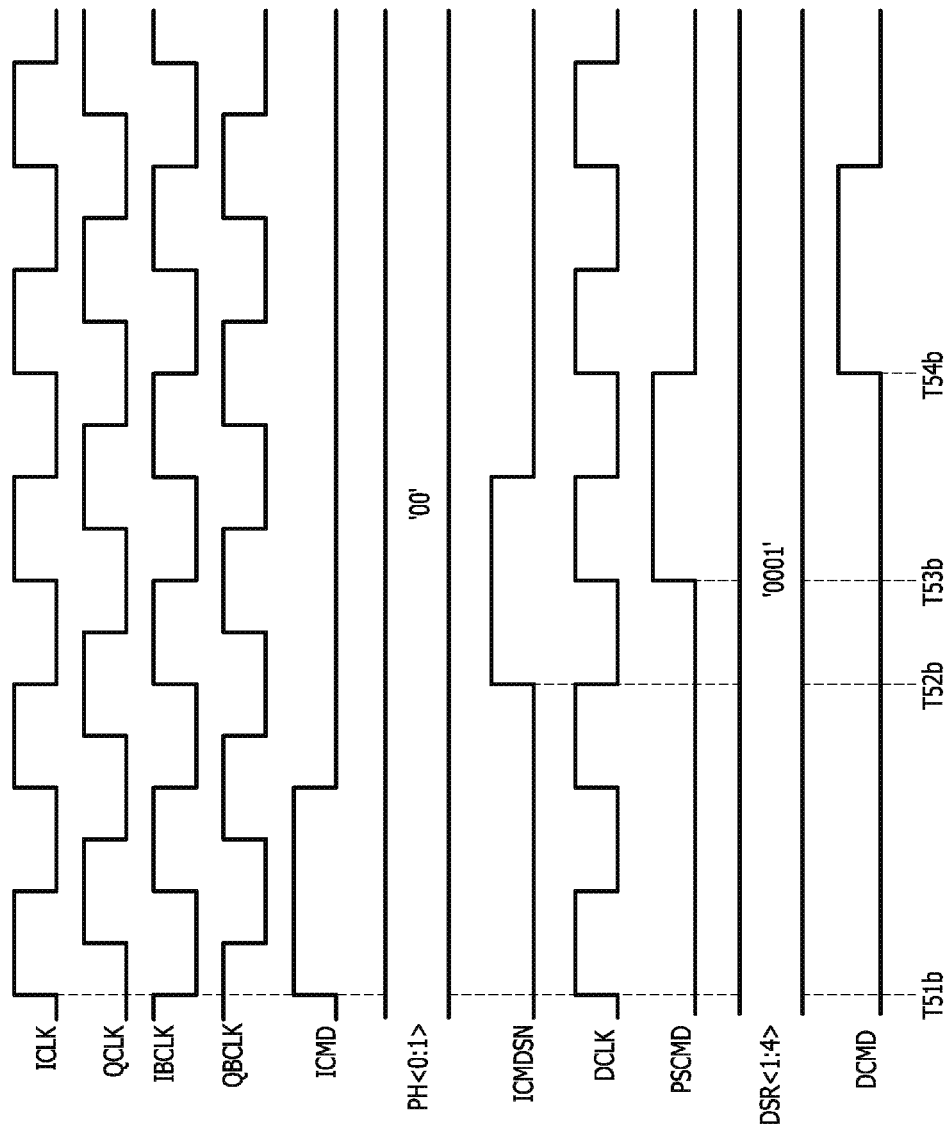

As shown in FIG. 32, in the case where the internal command ICMD is generated at a time T51b after the logic level combination of the phase control signal PH<0:1> changes from '01' to '00,' the selected command ICMDSN is generated in synchronization with the third internal clock IBCLK at a time T52b. At a time T53b, the phase selection command PSCMD is outputted as the selected command ICMDSN and is latched in synchronization with the delay-locked clock DCLK. In the state in which the logic level combination of the correction code DSR<1:4> is set to '0001,' the delayed command DCMD is generated at a time T54b that is delayed by a period corresponding to one cycle of the delay-locked clock DCLK from the time T53b at which the phase selection command PSCMD is generated.

Figure 33:
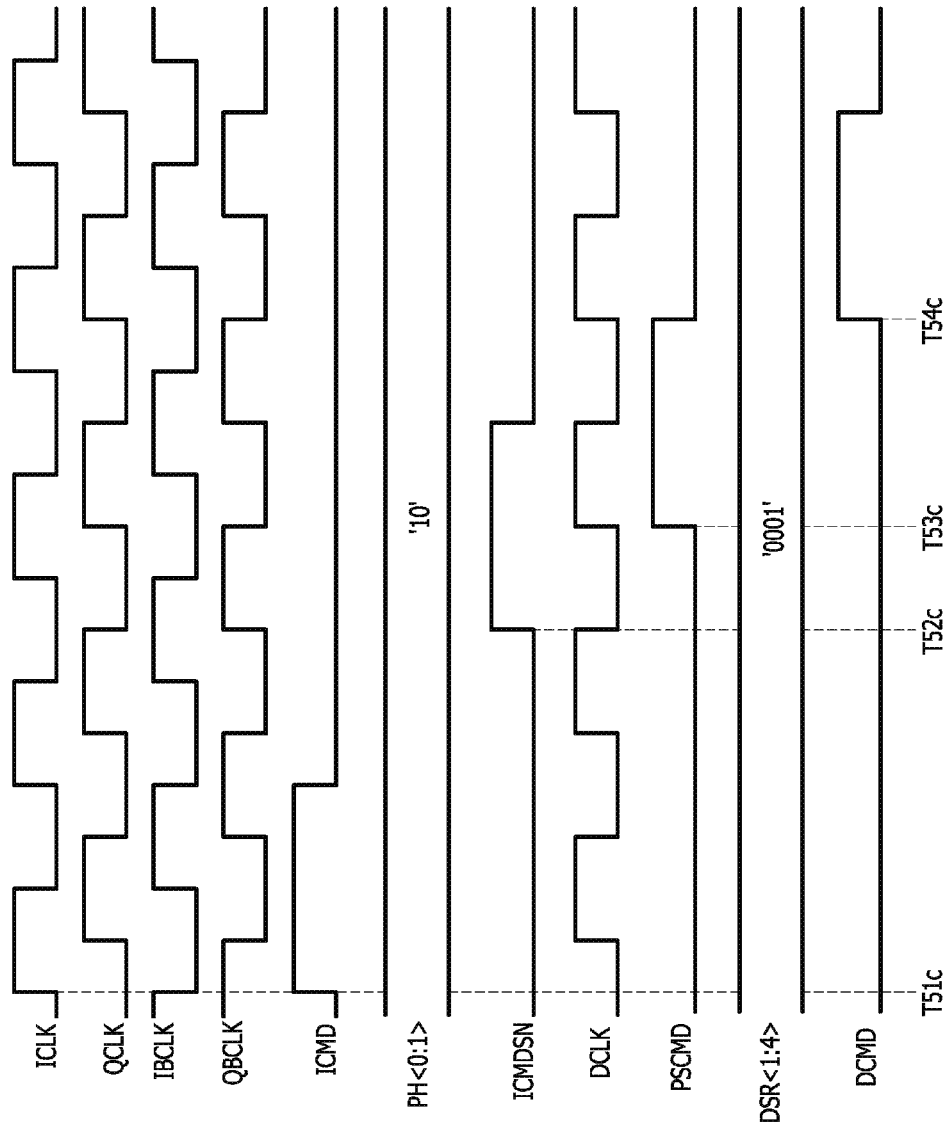

As shown in FIG. 33, in the case where the internal command ICMD is generated at a time T51c after the logic level combination of the phase control signal PH<0:1> changes from '00' to '10,' the selected command ICMDSN is generated in synchronization with the fourth internal clock QBCLK at a time T52c. At a time T53c, the phase selection command PSCMD is outputted as the selected command ICMDSN and is latched in synchronization with the delay-locked clock DCLK. In the state in which the logic level combination of the correction code DSR<1:4> is set to '0001,' the delayed command DCMD is generated at a time T54c that is delayed by a period corresponding to one cycle of the delay-locked clock DCLK from the time T53c at which the phase selection command PSCMD is generated.

Figure 34:
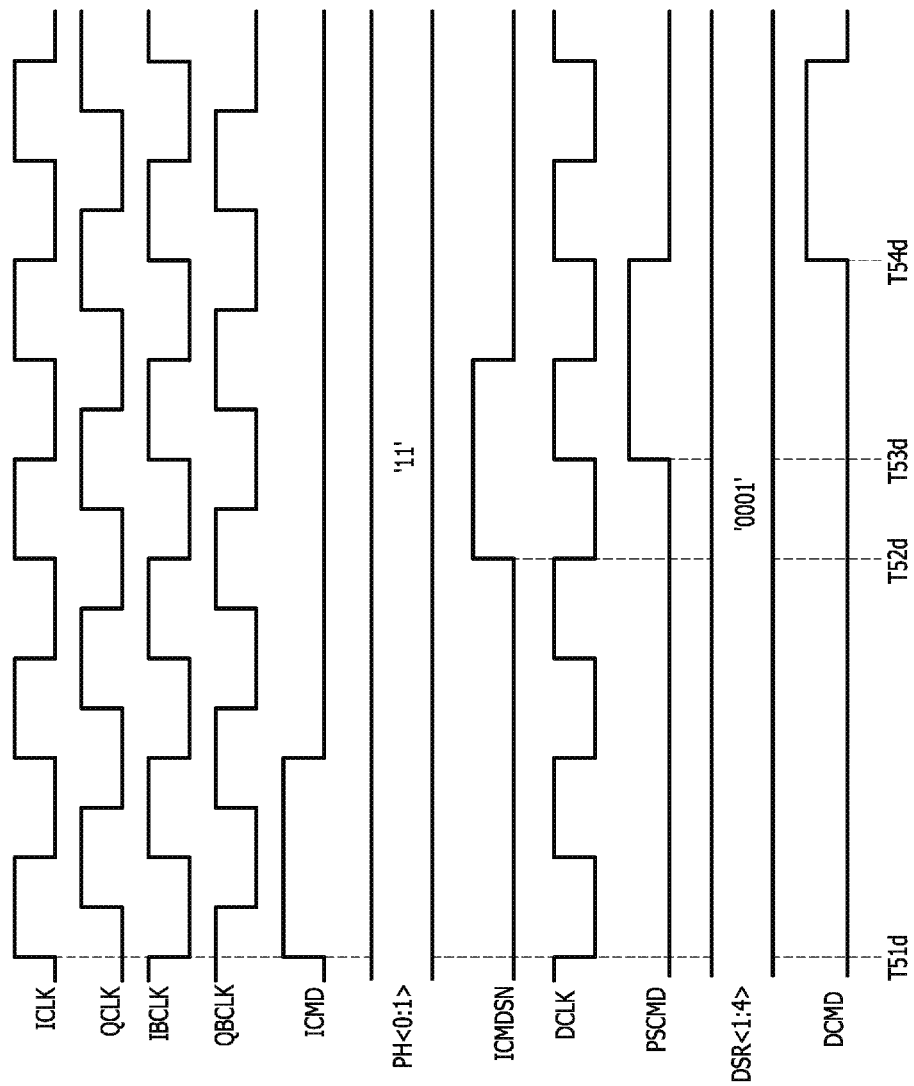

As shown in FIG. 34, in the case where the internal command ICMD is generated at a time T51d after the logic level combination of the phase control signal PH<0:1> changes from '10' to '11,' the selected command ICMDSN is generated in synchronization with the first internal clock ICLK at a time T52d. At a time T53d, the phase selection command PSCMD is outputted as the selected command ICMDSN and is latched in synchronization with the delay-locked clock DCLK. In the state in which the logic level combination of the correction code DSR<1:4> is set to '0001,' the delayed command DCMD is generated at a time T54d that is delayed by a period corresponding to one cycle of the delay-locked clock DCLK from the time T53d at which the phase selection command PSCMD is generated.

Figure 35:
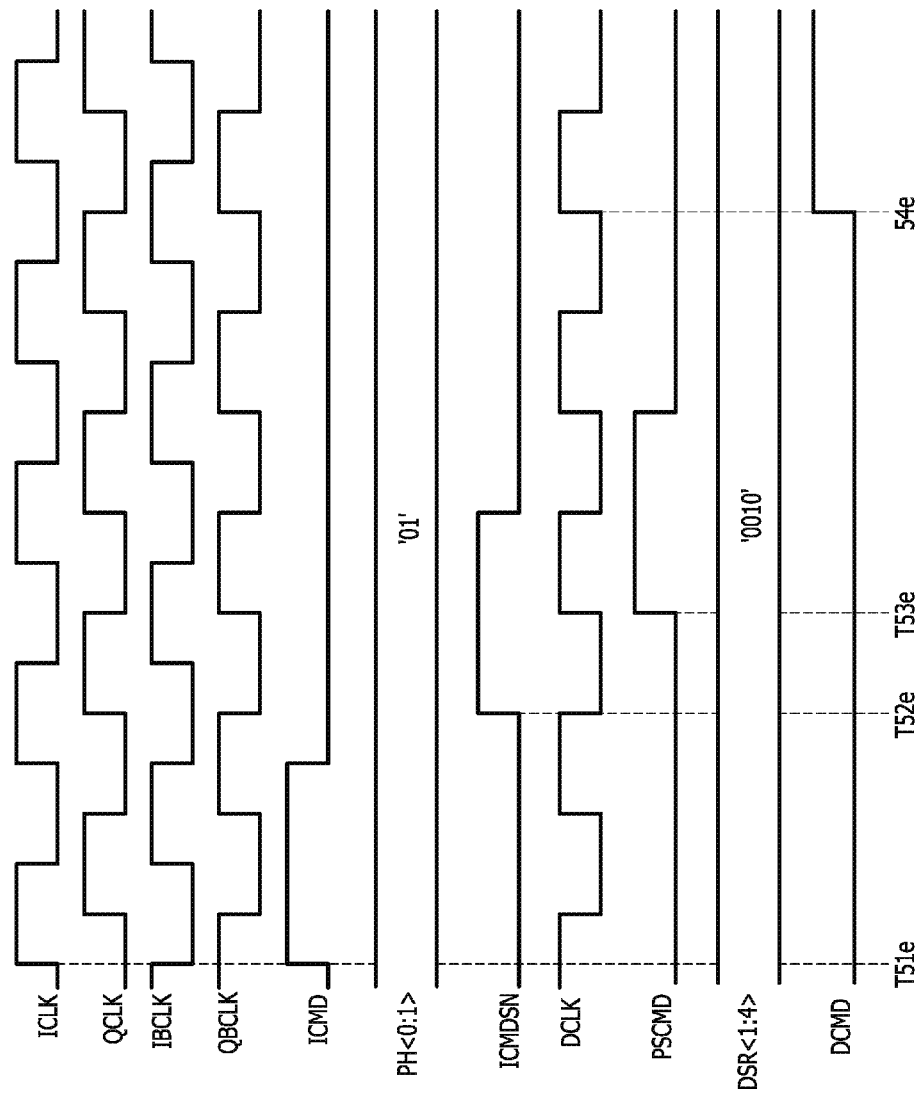

As shown in FIG. 35, in the case where the internal command ICMD is generated at a time T51e after the logic level combination of the phase control signal PH<0:1> changes from '11' to '01,' the selected command ICMDSN is generated in synchronization with the second internal clock QCLK at a time T52e. At a time T53e, the phase selection command PSCMD is outputted as the selected command ICMDSN and is latched in synchronization with the delay-locked clock DCLK. If the logic level combination of the phase control signal PH<0:1> changes from '11' to '01,' the logic level combination of the correction code DSR<1:4> is shifted from '0001' to '0010.' If the logic level combination of the correction code DSR<1:4> is shifted to '0010,' the delayed command DCMD is generated at a time T54e that is delayed by a period corresponding to two cycles of the delay-locked clock DCLK from the time T53e at which the phase selection command PSCMD is generated.

As is apparent from the above descriptions, in the semiconductor device 1 in accordance with the embodiment, when generating the delayed command DCMD, in the case where the logic level combination of the phase control signal PH<0:1> has a predetermined logic level combination, a period to be shifted is corrected by the correction code DSR<1:4>. In the semiconductor device 1 in accordance with the embodiment, when generating the delayed command DCMD in such a way as to latch the internal command ICMD sequentially by clocks selected from among the first internal clock ICLK, the second internal clock QCLK, the third internal clock IBCLK, and the fourth internal clock QBCLK depending on the logic level combination of the phase control signal PH<0:1>, in the case where the logic level combination of the phase control signal PH<0:1> has a predetermined logic level combination, the delayed command DCMD is shifted by the correction code DSR<1:4>, whereby it is possible to prevent a phenomenon in which the delayed command DCMD becomes earlier by a period corresponding to one cycle of the delay-locked clock DCLK, from occurring. For example, in the case where the logic level combination of the phase control signal PH<0:1> changes from '11' to '01,' the delayed command DCMD is corrected by the correction code DSR<1:4> to be generated by being additionally deferred by a period corresponding to one cycle of the delay-locked clock DCLK.

The operation of the command delay circuit 34b shown in FIG. 18 in the case where the logic level combination of the phase control signal PH<0:1> is set in the sequence of '11,' '10,' '00,' '01,' and '11' is described below with reference to FIGS. 36 to 40.

Figure 36:
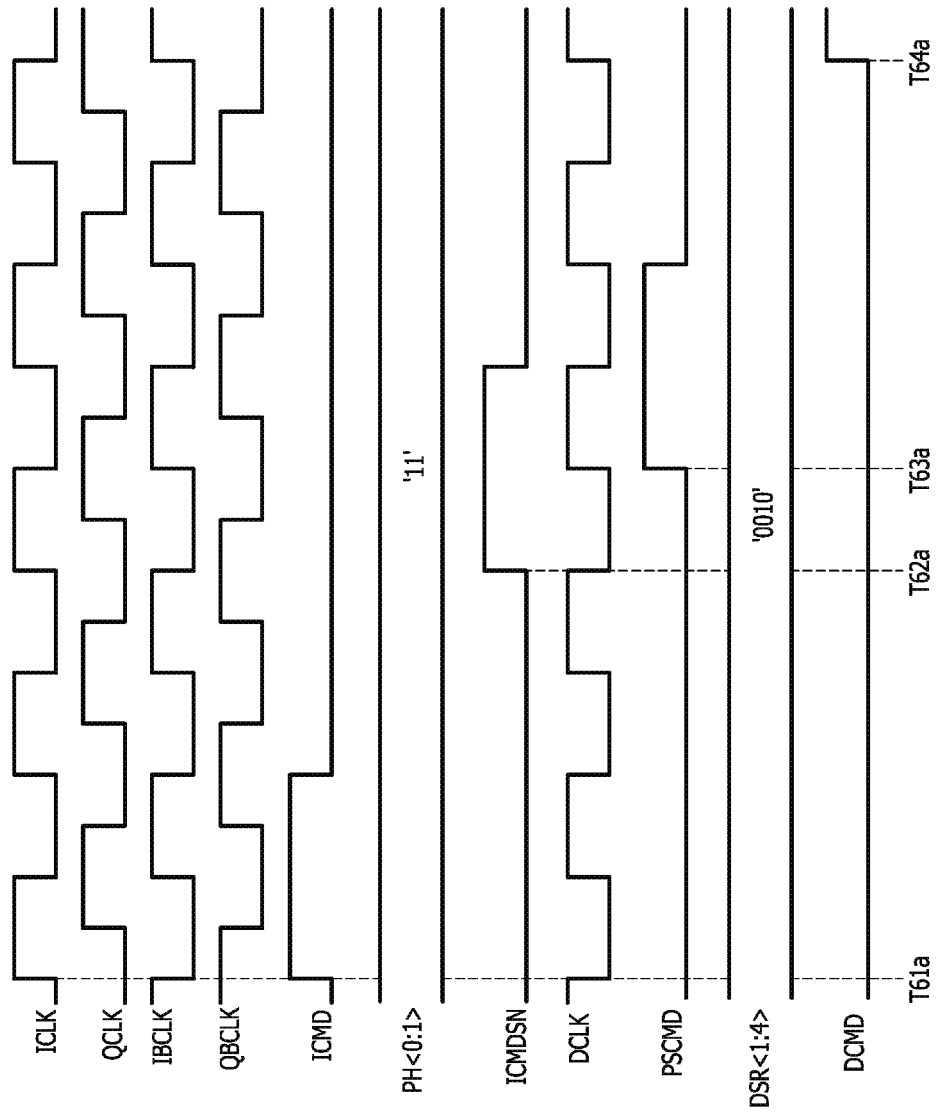

As shown in FIG. 36, in the case where the internal command ICMD is generated at a time T61a in a state in which the logic level combination of the phase control signal PH<0:1> is set to '11,' the selected command ICMDSN is generated in synchronization with the first internal clock ICLK at a time T62a. At a time T63a, the phase selection command PSCMD is outputted as the selected command ICMDSN and is latched in synchronization with the delay-locked clock DCLK. In a state in which the logic level combination of the correction code DSR<1:4> is set to '0010,' the delayed command DCMD is generated at a time T64a that is delayed by a period corresponding to two cycles of the delay-locked clock DCLK from the time T63a at which the phase selection command PSCMD is generated.

Figure 37:
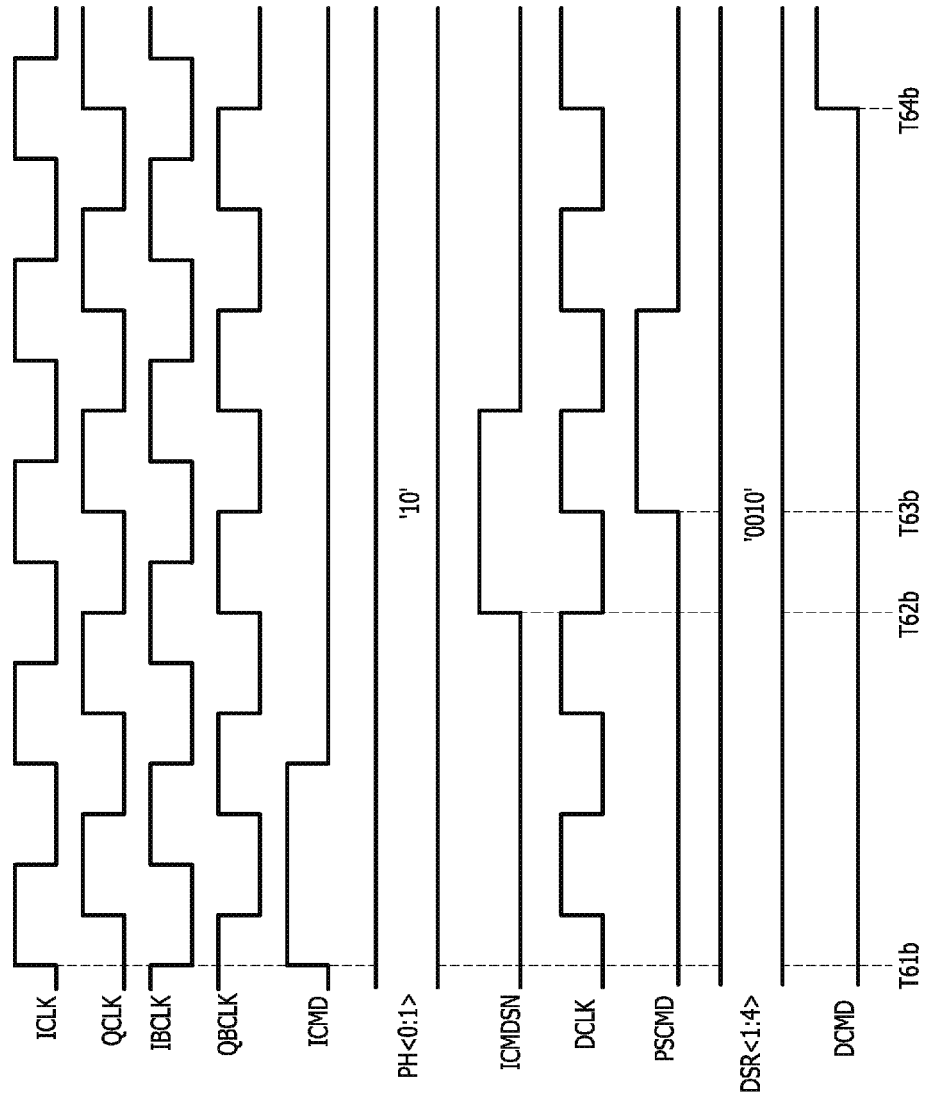

As shown in FIG. 37, in the case where the internal command ICMD is generated at a time T61b after the logic level combination of the phase control signal PH<0:1> changes from '11' to '10,' the selected command ICMDSN is generated in synchronization with the fourth internal clock QBCLK at a time T62b. At a time T63b, the phase selection command PSCMD is outputted as the selected command ICMDSN and is latched in synchronization with the delay-locked clock DCLK. In the state in which the logic level combination of the correction code DSR<1:4> is set to '0010,' the delayed command DCMD is generated at a time T64b that is delayed by a period corresponding to two cycles of the delay-locked clock DCLK from the time T63b at which the phase selection command PSCMD is generated.

Figure 38:
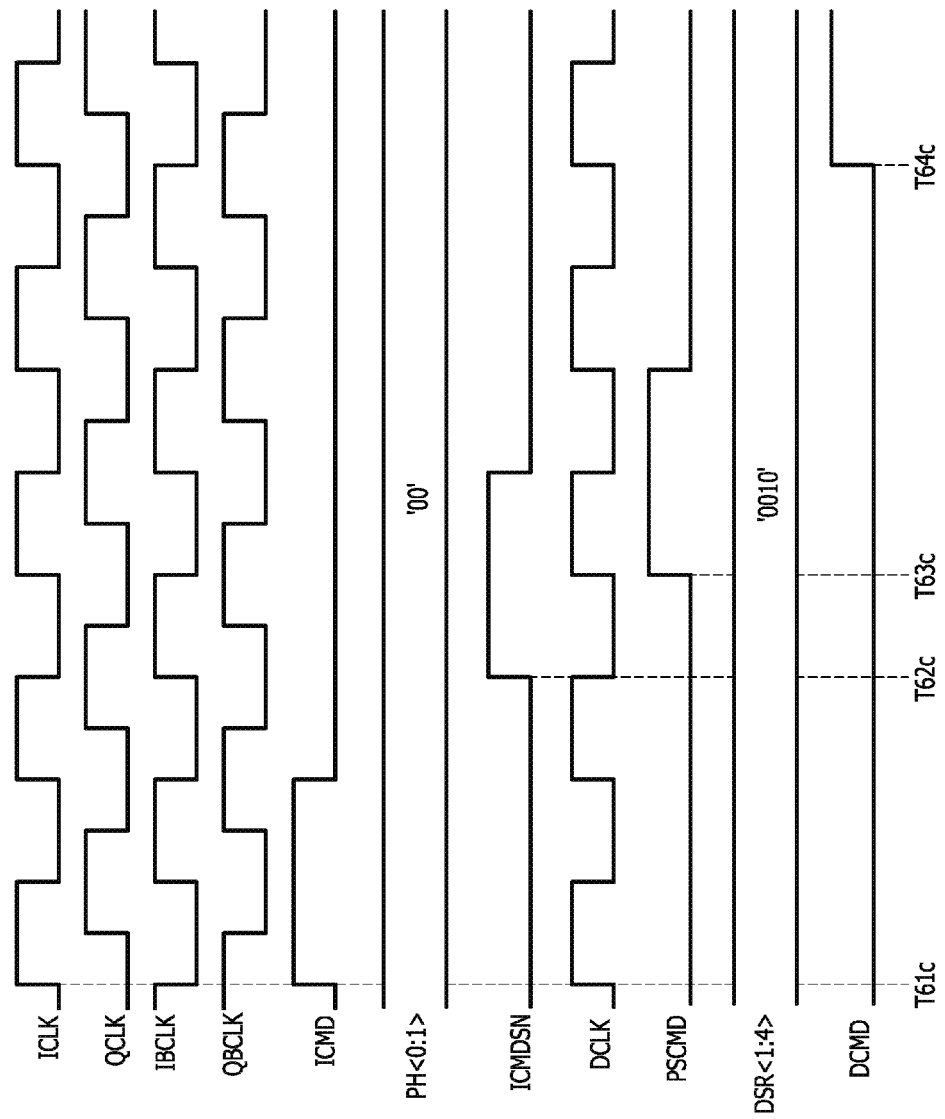

As shown in FIG. 38, in the case where the internal command ICMD is generated at a time T61c after the logic level combination of the phase control signal PH<0:1> changes from '10' to '00,' the selected command ICMDSN is generated in synchronization with the third internal clock IBCLK at a time T62c. At a time T63c, the phase selection command PSCMD is outputted as the selected command ICMDSN and is latched in synchronization with the delay-locked clock DCLK. In a state in which the logic level combination of the correction code DSR<1:4> is set to '0010,' the delayed command DCMD is generated at a time T64c that is delayed by a period corresponding to two cycles of the delay-locked clock DCLK from the time T63c at which the phase selection command PSCMD is generated.

Figure 39:
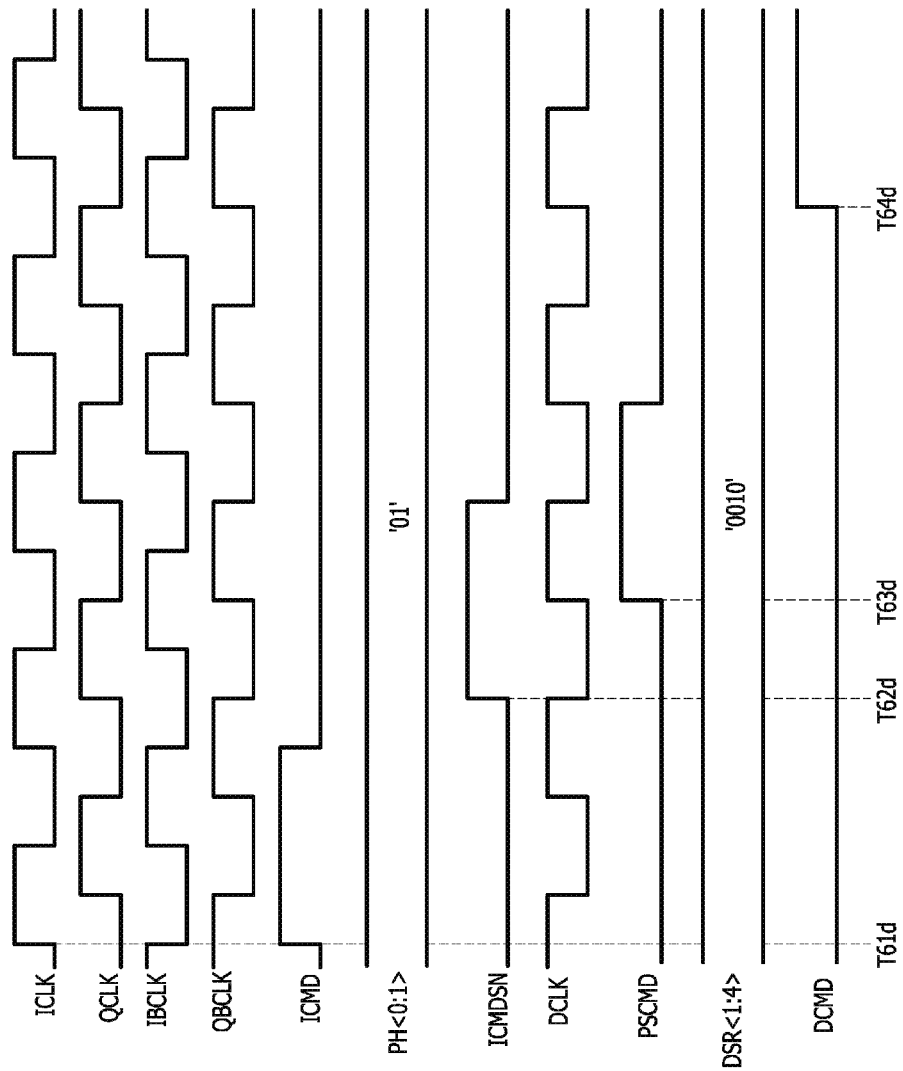

As shown in FIG. 39, in the case where the internal command ICMD is generated at a time T61d after the logic level combination of the phase control signal PH<0:1> changes from '00' to '01,' the selected command ICMDSN is generated in synchronization with the second internal clock QCLK at a time T62d. At a time T63d, the phase selection command PSCMD is outputted as the selected command ICMDSN and is latched in synchronization with the delay-locked clock DCLK. In the state in which the logic level combination of the correction code DSR<1:4> is set to '0010,' the delayed command DCMD is generated at a time T64d that is delayed by a period corresponding to two cycles of the delay-locked clock DCLK from the time T63d at which the phase selection command PSCMD is generated.

Figure 40:
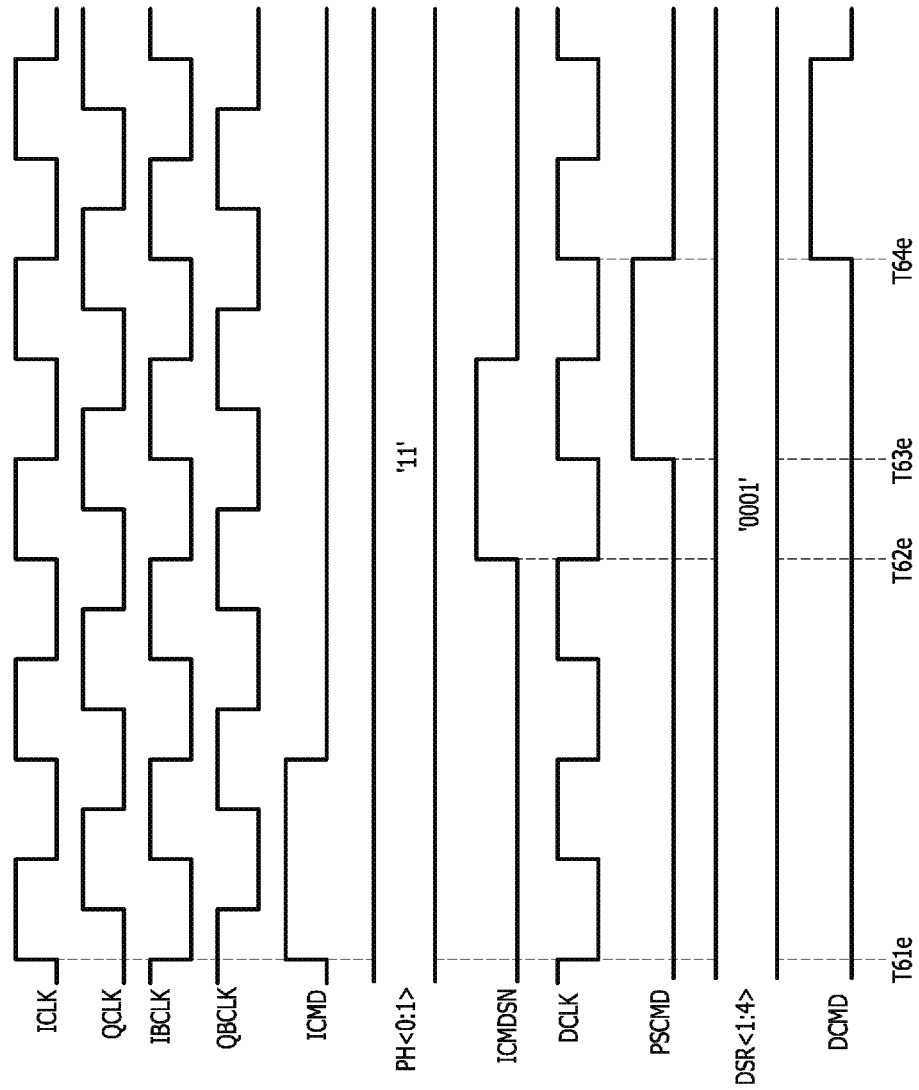

As shown in FIG. 40, in the case where the internal command ICMD is generated at a time T61e after the logic level combination of the phase control signal PH<0:1> changes from '01' to '11,' the selected command ICMDSN is generated in synchronization with the first internal clock ICLK at a time T62e. At a time T63e, the phase selection command PSCMD is outputted as the selected command ICMDSN and is latched in synchronization with the delay-locked clock DCLK. If the logic level combination of the phase control signal PH<0:1> changes from '01' to '11,' the logic level combination of the correction code DSR<1:4> is shifted from '0010' to '0001.' If the logic level combination of the correction code DSR<1:4> is shifted to '0001,' the delayed command DCMD is generated at a time T64e that is delayed by a period corresponding to one cycle of the delay-locked clock DCLK from the time T63e at which the phase selection command PSCMD is generated.

As is apparent from the above descriptions, in the semiconductor device 1 in accordance with an embodiment, when generating the delayed command DCMD, in the case where the logic level combination of the phase control signal PH<0:1> has a predetermined logic level combination, a period to be shifted is corrected by the correction code DSR<1:4>. In the semiconductor device 1 in accordance with an embodiment, when generating the delayed command DCMD in such a way as to latch the internal command ICMD sequentially by clocks selected from among the first internal clock ICLK, the second internal clock QCLK, the third internal clock IBCLK, and the fourth internal clock QBCLK depending on the logic level combination of the phase control signal PH<0:1>, in the case where the logic level combination of the phase control signal PH<0:1> has a predetermined logic level combination, the delayed command DCMD is shifted by the correction code DSR<1:4>, whereby it is possible to prevent a phenomenon in which the delayed command DCMD becomes later by only a period corresponding to one cycle of the delay-locked clock DCLK, from occurring. For example, in the case where the logic level combination of the phase control signal PH<0:1> changes from '01' to '11,' the delayed command DCMD is corrected by the correction code DSR<1:4> to be generated by being advanced by a period corresponding to one cycle of the delay-locked clock DCLK.

Figure 41:
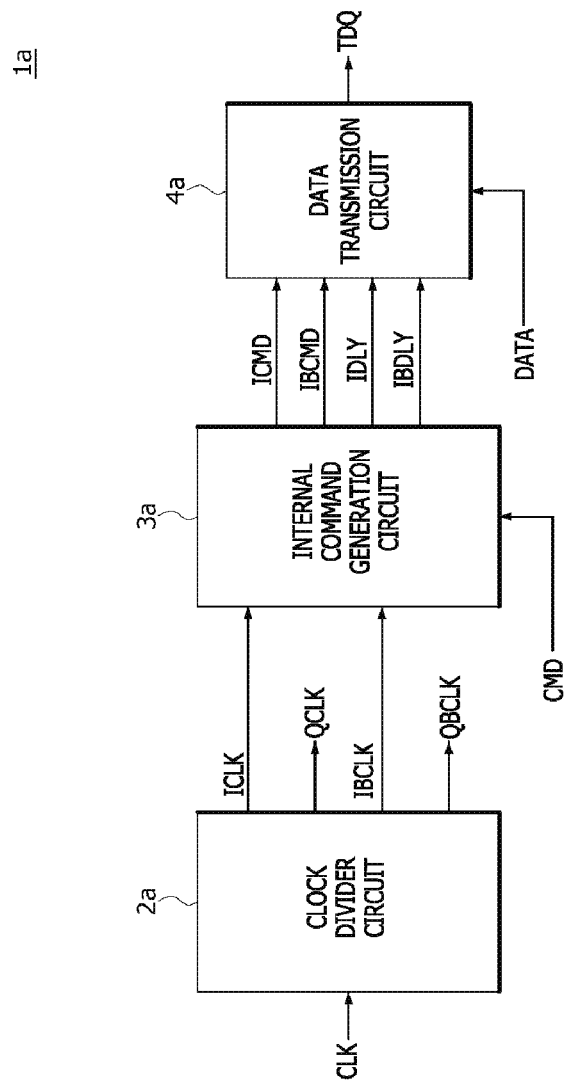
FIG. 41 is a block diagram illustrating an example of the configuration of a semiconductor device in accordance with another embodiment.

As illustrated in FIG. 41, a semiconductor device 1a in accordance with another embodiment of the disclosure may include a clock divider circuit 2a, an internal command generation circuit 3a, and a data transmission circuit 4a.

The clock divider circuit 2a may generate a first internal clock ICLK, a second internal clock QCLK, a third internal clock IBCLK and a fourth internal clock QBCLK by dividing a clock CLK. The cycle of each of the first internal clock ICLK, the second internal clock QCLK, the third internal clock IBCLK and the fourth internal clock QBCLK may be set to two times the cycle of the clock CLK. The second internal clock QCLK may be set to have a phase 90 degrees later than the first internal clock ICLK. The second internal clock QCLK may be generated by delaying the first internal clock ICLK by a period corresponding to half the cycle of the clock CLK. The third internal clock IBCLK may be set to have a phase 90 degrees later than the second internal clock QCLK. The third internal clock IBCLK may be generated by delaying the second internal clock QCLK by a period corresponding to half the cycle of the clock CLK. The fourth internal clock QBCLK may be set to have a phase 90 degrees later than the third internal clock IBCLK. The fourth internal clock QBCLK may be generated by delaying the third internal clock IBCLK by a period corresponding to half the cycle of the clock CLK.

The internal command generation circuit 3a may generate a first internal command ICMD and a second internal command IBCMD from a command CMD which is inputted in synchronization with any one of the first internal clock ICLK and the third internal clock IBCLK. The internal command generation circuit 3a may generate the first internal command ICMD from the command CMD which is inputted in synchronization with the first internal clock ICLK. The internal command generation circuit 3a may generate the second internal command IBCMD from the command CMD which is inputted in synchronization with the third internal clock IBCLK. The internal command generation circuit 3a may generate a first clock delay signal IDLY and a second clock delay signal IBDLY by delaying the first internal clock ICLK and the third internal clock IBCLK.

In the case where the first internal command ICMD is generated, the data transmission circuit 4a may generate transmission data TDQ from data DATA in synchronization with the first clock delay signal IDLY which is generated from the first internal clock ICLK. In the case where the second internal command IBCMD is generated, the data transmission circuit 4a may generate the transmission data TDQ from the data DATA in synchronization with the second clock delay signal IBDLY which is generated from the third internal clock IBCLK.

Figure 42:
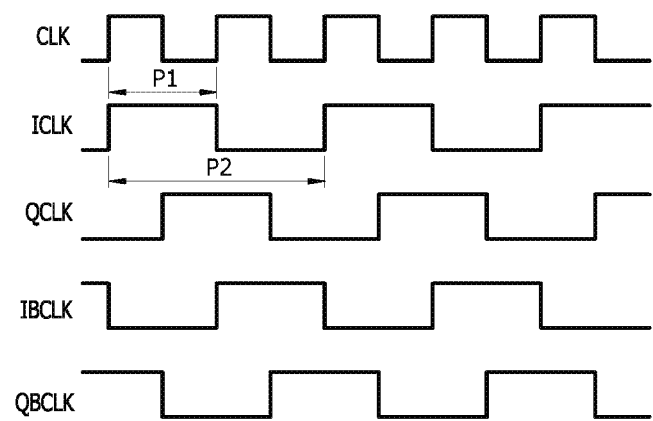
FIG. 42 is an example of a diagram to assist in the description of the operation of a clock divider circuit illustrated in FIG. 41.

The operation of the clock divider circuit 2a will be described below with reference to FIG. 42.

The clock divider circuit 2a may generate the first internal clock ICLK, the second internal clock QCLK, the third internal clock IBCLK and the fourth internal clock QBCLK by dividing the frequency of the clock CLK. The first internal clock ICLK may be generated to have one cycle P2 twice as long as one cycle P1 of the clock CLK. The second internal clock QCLK, the third internal clock IBCLK and the fourth internal clock QBCLK are generated to have the same one cycle P2 as the first internal clock ICLK. The second internal clock QCLK may be generated to have a phase half cycle later than the first internal clock ICLK. The third internal clock IBCLK may be generated to have a phase half cycle later than the second internal clock QCLK. The fourth internal clock QBCLK may be generated to have a phase half cycle later than the third internal clock IBCLK.

Figure 43:
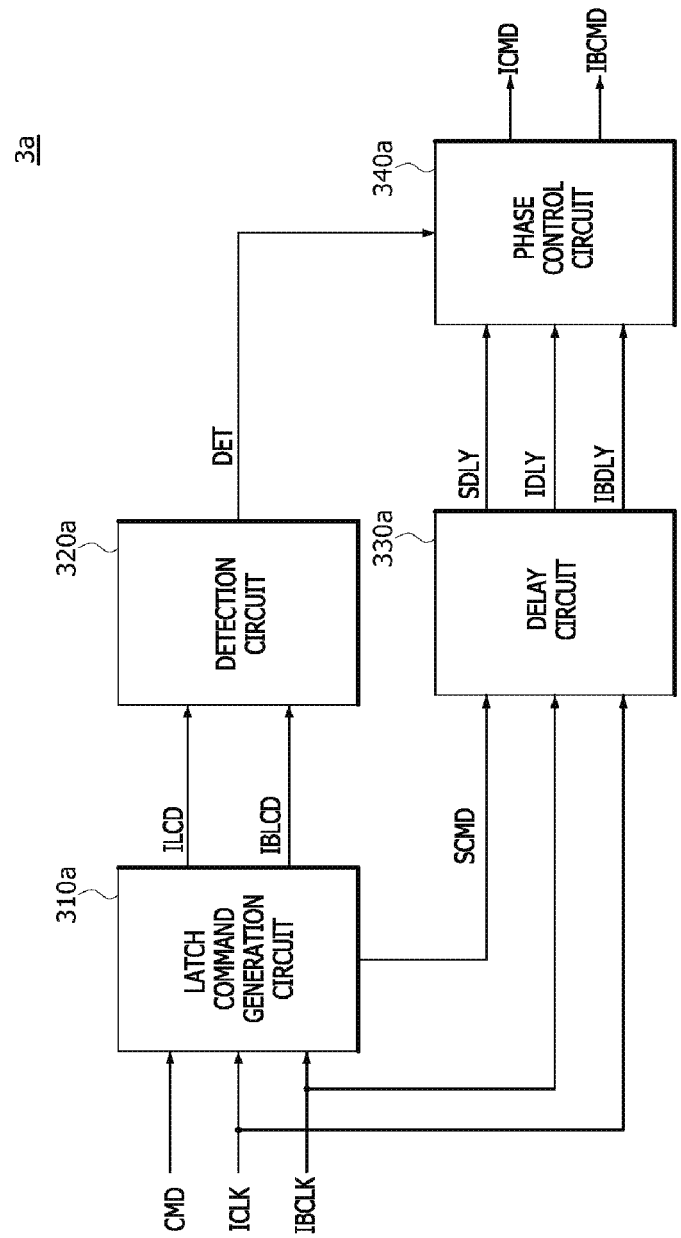
FIG. 43 is a block diagram illustrating an example of the configuration of an internal command generation circuit included in the semiconductor device illustrated in FIG. 41.

Referring to FIG. 43, the internal command generation circuit 3a in accordance with the embodiment of the disclosure may include a latch command generation circuit 310a, a detection circuit 320a, a delay circuit 330a, and a phase control circuit 340a.

The latch command generation circuit 310a may generate a first latch command ILCD and a second latch command IBLCD from the command CMD in synchronization with any one of the first internal clock ICLK and the third internal clock IBCLK. The latch command generation circuit 310a may generate the first latch command ILCD in the case where the command CMD is inputted in synchronization with the first internal clock ICLK. The latch command generation circuit 310a may generate the second latch command IBLCD in the case where the command CMD is inputted in synchronization with the third internal clock IBCLK. The latch command generation circuit 310a may generate a synthesized command SCMD by synthesizing the first latch command ILCD and the second latch command IBLCD. The latch command generation circuit 310a may generate the synthesized command SCMD in the case where any one of the first latch command ILCD and the second latch command IBLCD is generated.

The detection circuit 320a may generate a detection signal DET which is enabled depending on logic levels of the first latch command ILCD and the second latch command IBLCD. The detection circuit 320a may generate the detection signal DET which is enabled in the case where the first latch command ILCD is generated. The detection circuit 320a may generate the detection signal DET which is disabled in the case where the second latch command IBLCD is generated.

The delay circuit 330a may generate a synthesized delay signal SDLY, the first clock delay signal IDLY and the second clock delay signal IBDLY from the synthesized command SCMD, the first internal clock ICLK and the third internal clock IBCLK. The delay circuit 330a may generate the synthesized delay signal SDLY, the first clock delay signal IDLY and the second clock delay signal IBDLY by delaying the synthesized command SCMD, the first internal clock ICLK and the third internal clock IBCLK by the same delay amount.

The phase control circuit 340a may selectively generate the first internal command ICMD and the second internal command IBCMD from the synthesized delay signal SDLY depending on a logic level of the detection signal DET. The phase control circuit 340a may generate the first internal command ICMD from the synthesized delay signal SDLY in the case where the detection signal DET is enabled. The phase control circuit 340a may generate the first internal command ICMD from the synthesized delay signal SDLY in synchronization with the first clock delay signal IDLY in the case where the detection signal DET is enabled. The phase control circuit 340a may generate the second internal command IBCMD from the delay signal SDLY in the case where the detection signal DET is disabled. The phase control circuit 340a may generate the second internal command IBCMD from the synthesized delay signal SDLY in synchronization with the second clock delay signal IBDLY in the case where the detection signal DET is disabled.

Figure 44:
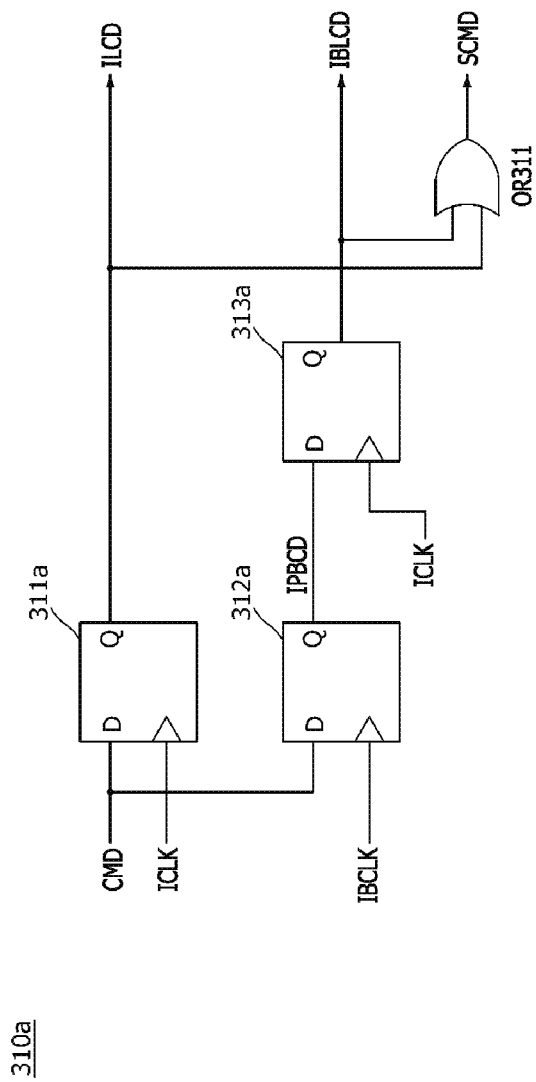
FIG. 44 is a circuit diagram illustrating an example of a latch command generation circuit included in the internal command generation circuit illustrated in FIG. 43.

Referring to FIG. 44, the latch command generation circuit 310a in accordance with the embodiment of the disclosure may include a first clock latch 311a, a second clock latch 312a, a third clock latch 313a, and an OR gate OR311.

The first clock latch 311a may latch the command CMD in synchronization with the first internal clock ICLK. The first clock latch 311a may output the latched command CMD as the first latch command ILCD.

The second clock latch 312a may latch the command CMD in synchronization with the third internal clock IBCLK. The second clock latch 312a may output the latched command CMD as an input command IPBCD.

The third clock latch 313a may latch the input command IPBCD in synchronization with the first internal clock ICLK. The third clock latch 313a may output the latched input command IPBCD as the second latch command IBLCD.

The OR gate OR311 may generate the synthesized command SCMD by synthesizing the first latch command ILCD and the second latch command IBLCD. The OR gate OR311 may generate the synthesized command SCMD by performing an OR logic operation on the first latch command ILCD and the second latch command IBLCD. The OR gate OR311 may generate the synthesized command SCMD of a logic high level in the case where any one of the first latch command ILCD and the second latch command IBLCD is inputted at a logic high level.

Figure 45:
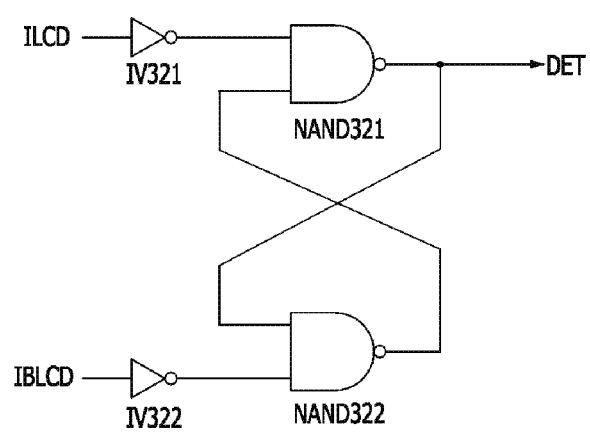
FIG. 45 is a circuit diagram illustrating an example of a detection circuit included in the internal command generation circuit illustrated in FIG. 43.

Referring to FIG. 45, the detection circuit 320a in accordance with the embodiment of the disclosure may include inverters IV321 and IV322 and NAND gates NAND321 and NAND322.

The detection circuit 320a may generate the detection signal DET which is enabled in the case where the first latch command ILCD is generated. The detection circuit 320a may generate the detection signal DET of a logic high level in the case where the first latch command ILCD is generated at a logic high level. The detection circuit 320a may generate the detection signal DET which is disabled in the case where the second latch command IBLCD is generated. The detection circuit 320a may generate the detection signal DET of a logic low level in the case where the second latch command IBLCD is generated at a logic high level.

Figure 46:
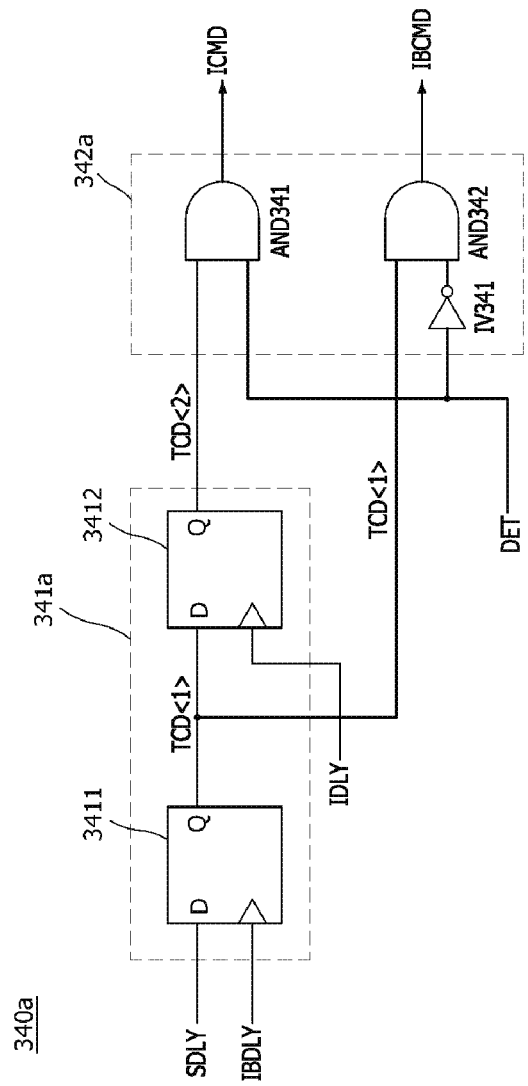
FIG. 46 is a circuit diagram illustrating an example of a phase control circuit included in the internal command generation circuit illustrated in FIG. 43.

Referring to FIG. 46, the phase control circuit 340a in accordance with the embodiment of the disclosure may include a transfer command generation circuit 341a and a logic circuit 342a.

The transfer command generation circuit 341a may include a fourth clock latch 3411 and a fifth clock latch 3412.

The fourth clock latch 3411 may latch the synthesized delay signal SDLY in synchronization with the second clock delay signal IBDLY. The fourth clock latch 3411 may output the latched synthesized delay signal SDLY as a first transfer command TCD<1>.

The fifth clock latch 3412 may latch the first transfer command TCD<1> in synchronization with the first clock delay signal IDLY. The fifth clock latch 3412 may output the latched first transfer command TCD<1> as a second transfer command TCD<2>.

The transfer command generation circuit 341a may generate the first transfer command TCD<1> from the synthesized delay signal SDLY in synchronization with the second clock delay signal IBDLY. The transfer command generation circuit 341a may generate the second transfer command TCD<2> from the synthesized delay signal SDLY in synchronization with the first clock delay signal IDLY. The transfer command generation circuit 341a may output the synthesized delay signal SDLY as the first transfer command TCD<1> in synchronization with the second clock delay signal IBDLY, and may output the first transfer command TCD<1> as the second transfer command TCD<2> in synchronization with the first clock delay signal IDLY.

The logic circuit 342a may include an inverter IV341 and AND gates AND341 and AND342.

The inverter IV341 may invert and buffer the detection signal DET and output an output signal.

The AND gate AND341 may generate the first internal command ICMD by buffering the second transfer command TCD<2> during a period in which the detection signal DET is a logic high level. The AND gate AND341 may block the input of the second transfer command TCD<2> during a period in which the detection signal DET is a logic low level.

The AND gate AND342 may generate the second internal command IBCMD by buffering the first transfer command TCD<1> during a period in which the output signal of the inverter IV341 is a logic high level. The AND gate AND342 may block the input of the first transfer command TCD<1> during a period in which the output signal of the inverter IV341 is a logic low level.

The logic circuit 342a may generate the first internal command ICMD and the second internal command IBCMD from the second transfer command TCD<2> and the first transfer command TCD<1> depending on a logic level of the detection signal DET. The logic circuit 342a may generate the first internal command ICMD from the second transfer command TCD<2> in the case where the detection signal DET is enabled. The logic circuit 342a may generate the second internal command IBCMD from the first transfer command TCD<1> in the case where the detection signal DET is disabled.

Figure 47:
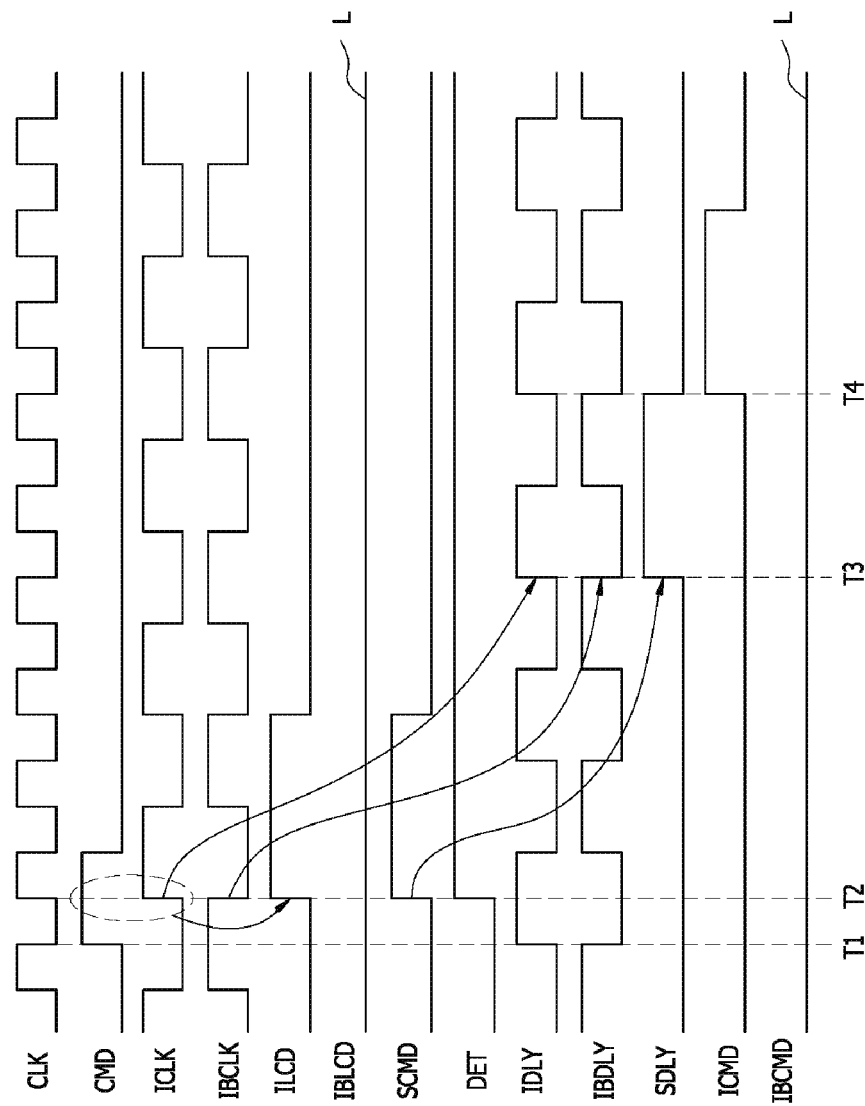
FIGS. 47 and 48 are examples of timing diagrams to assist in the description of the operation of the semiconductor device in accordance with the embodiment.

The operation of the semiconductor device 1a in accordance with the embodiment of the disclosure will be described below with reference to FIG. 47, by exemplifying an operation in which the command CMD is inputted in synchronization with the first internal clock ICLK.

Before describing the operation, it is assumed that the clock divider circuit 2a generates the first internal clock ICLK, the second internal clock QCLK, the third internal clock IBCLK, and the fourth internal clock QBCLK by dividing the clock CLK.

At a time T1, the command CMD is inputted at a logic high level.

At a time T2, because the command CMD is inputted in synchronization with the first internal clock ICLK, the latch command generation circuit 310a generates the first latch command ILCD of a logic high level. Because the command CMD is not inputted in synchronization with the third internal clock IBCLK, the latch command generation circuit 310a generates the second latch command IBLCD of a logic low level. The latch command generation circuit 310a generates the synthesized command SCMD of a logic high level by synthesizing the first latch command ILCD of a logic high level and the second latch command IBLCD of a logic low level.

The detection circuit 320a receives the first latch command ILCD of a logic high level and generates the detection signal DET which is enabled to a logic high level.

At a time T3, the delay circuit 330a generates the synthesized delay signal SDLY of a logic high level, the first clock delay signal IDLY, and the second clock delay signal IBDLY by delaying the synthesized command SCMD, the first internal clock ICLK, and the third internal clock IBCLK which are generated at the time T2.

At a time T4, the phase control circuit 340a generates the first internal command ICMD of a logic high level from the synthesized delay signal SDLY, generated at the time T3, by the detection signal DET of a logic high level in synchronization with the first clock delay signal IDLY. The phase control circuit 340a generates the second internal command IBCMD of a logic low level by the detection signal DET of a logic high level.

Because the first internal command ICMD is generated at a logic high level, the data transmission circuit 4a generates the transmission data TDQ from the data DATA in synchronization with the first clock delay signal IDLY.

Figure 48:
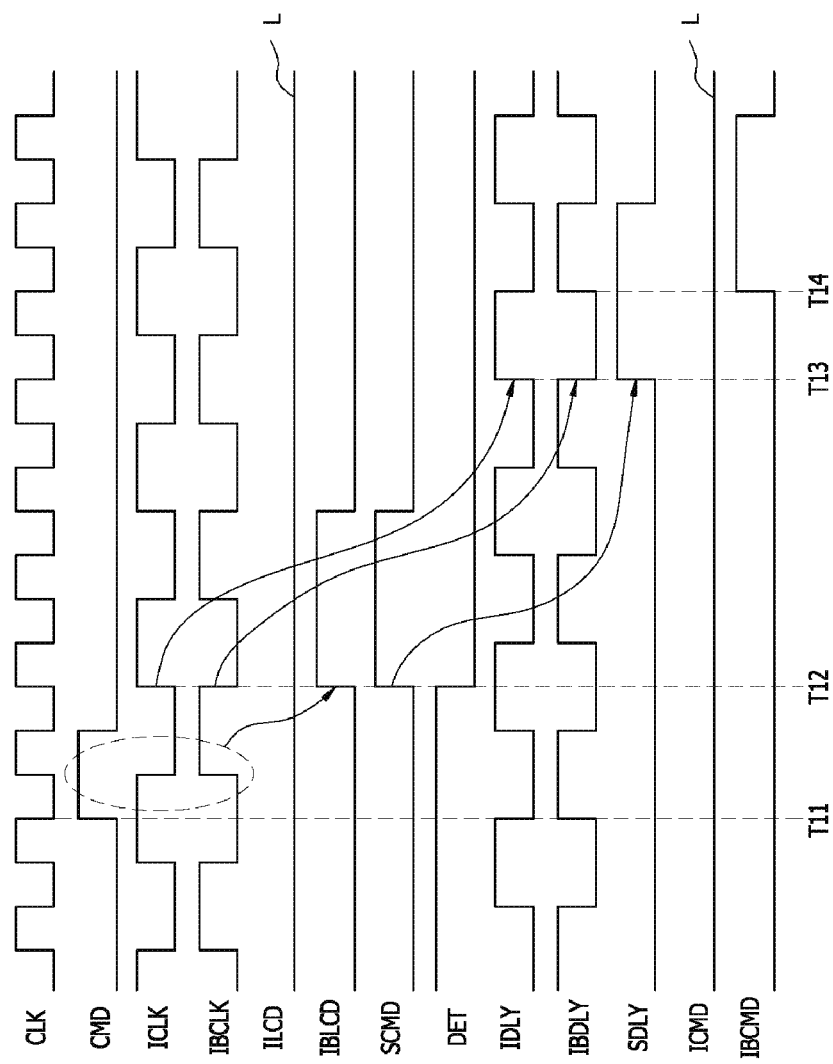

The operation of the semiconductor device 1a in accordance with the embodiment of the disclosure will be described below with reference to FIG. 48, by exemplifying an operation in which the command CMD is inputted in synchronization with the third internal clock IBCLK.

Before describing the operation, it is assumed that the clock divider circuit 2a generates the first internal clock ICLK, the second internal clock QCLK, the third internal clock IBCLK, and the fourth internal clock QBCLK by dividing the clock CLK.

At a time T11, the command CMD is inputted at a logic high level.

At a time T12, because the command CMD is inputted in synchronization with the third internal clock IBCLK, the latch command generation circuit 310a generates the second latch command IBLCD of a logic high level at a time when the first internal clock ICLK is generated. Because the command CMD is not inputted in synchronization with the first internal clock ICLK, the latch command generation circuit 310a generates the first latch command ILCD of a logic low level. The latch command generation circuit 310a generates the synthesized command SCMD of a logic high level by synthesizing the first latch command ILCD of a logic low level and the second latch command IBLCD of a logic high level.

The detection circuit 320a receives the second latch command IBLCD of a logic high level and generates the detection signal DET which is disabled to a logic low level.

At a time T13, the delay circuit 330a generates the synthesized delay signal SDLY of a logic high level, the first clock delay signal IDLY, and the second clock delay signal IBDLY by delaying the synthesized command SCMD, the first internal clock ICLK, and the third internal clock IBCLK which are generated at the time T12.

At a time T14, the phase control circuit 340a generates the second internal command IBCMD of a logic high level from the synthesized delay signal SDLY, generated at the time T13, by the detection signal DET of a logic low level in synchronization with the second clock delay signal IBDLY. The phase control circuit 340a generates the first internal command ICMD of a logic low level by the detection signal DET of a logic low level.

Because the second internal command IBCMD is generated at a logic high level, the data transmission circuit 4a generates the transmission data TDQ from the data DATA in synchronization with the second clock delay signal IBDLY.

In the semiconductor device 1a in accordance with the embodiment of the disclosure, a synthesized command is generated by synthesizing first and second latch commands which are selectively generated depending on an input time of a command, and first and second internal commands are generated by delaying the synthesized command through one delay circuit. As a consequence, because delay circuits for delaying the first and second internal commands are merged, an area may be reduced. Also, in the semiconductor device 1a in accordance with the embodiment of the disclosure, data is inputted and outputted by detecting an input time of the command and selectively generating the first and second internal commands depending on a detection result. As a consequence, the reliability of data input/output operations may be secured.

Figure 49:
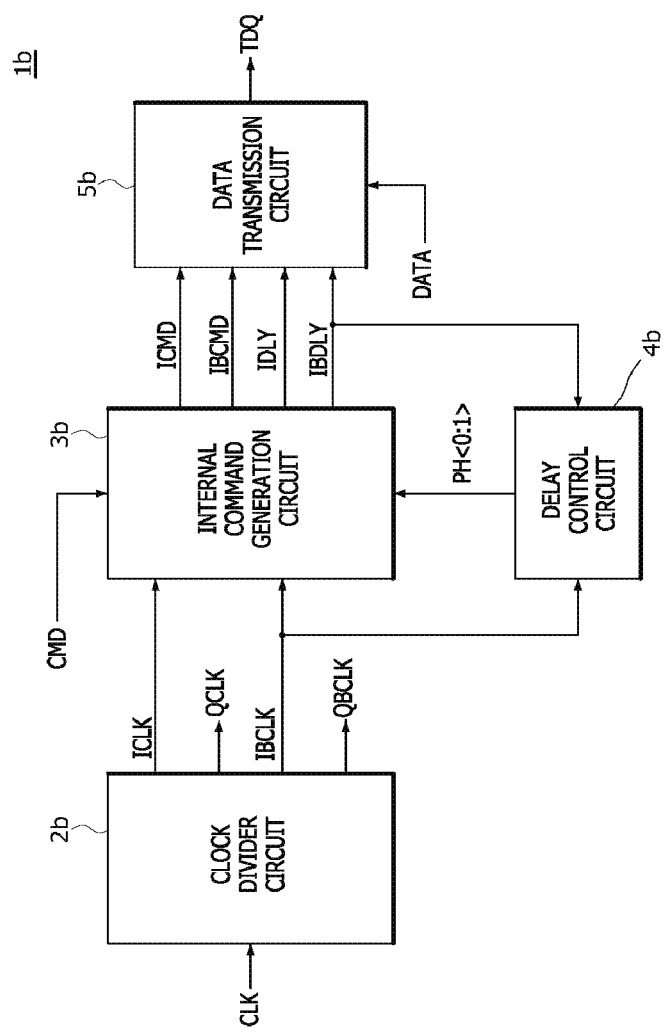
FIG. 49 is a block diagram illustrating an example of the configuration of a semiconductor device in accordance with still another embodiment.

As illustrated in FIG. 49, a semiconductor device 1b in accordance with still another embodiment of the disclosure may include a clock divider circuit 2b, an internal command generation circuit 3b, a delay control circuit 4b, and a data transmission circuit 5b.

Because the clock divider circuit 2b is implemented by the same circuit and performs the same operation as the clock divider circuit 2a illustrated in FIG. 41, detailed description thereof will be omitted herein. The clock divider circuit 2b may be replaced with the clock divider circuit 2a illustrated in FIG. 41.

The internal command generation circuit 3b may generate a first internal command ICMD and a second internal command IBCMD from a command CMD which is inputted in synchronization with any one of a first internal clock ICLK and a third internal clock IBCLK. The internal command generation circuit 3b may generate the first internal command ICMD from the command CMD which is inputted in synchronization with the first internal clock ICLK. The internal command generation circuit 3b may generate the second internal command IBCMD from the command CMD which is inputted in synchronization with the third internal clock IBCLK. The internal command generation circuit 3b may generate a first clock delay signal IDLY and a second clock delay signal IBDLY by delaying the first internal clock ICLK and the third internal clock IBCLK depending on a delay amount controlled by a phase control signal PH<0:1>.

The delay control circuit 4b may generate the phase control signal PH<0:1> by comparing the phase of the third internal clock IBCLK and the phase of the second clock delay signal IBDLY. The delay control circuit 4b may generate the phase control signal PH<0:1> of which the logic level combination is changed in the case where the phase of the third internal clock IBCLK and the phase of the second clock delay signal IBDLY are different from each other. The phase control signal PH<0:1> is set as a 2-bit signal, but may be set to include various numbers of bits depending on an embodiment. For example, in the case where a phase control signal is set to 2 bits, the delay amount of the internal command generation circuit 3b may be controlled to four delay amounts, and in the case where a phase control signal is set as a 4-bit signal, the delay amount of the internal command generation circuit 3b may be controlled to 16 delay amounts. Because the data transmission circuit 5b is implemented by the same circuit and performs the same operation as the data transmission circuit 4a illustrated in FIG. 41, detailed description thereof will be omitted herein. The data transmission circuit 5b may be replaced with the data transmission circuit 4a illustrated in FIG. 41.

Figure 50:
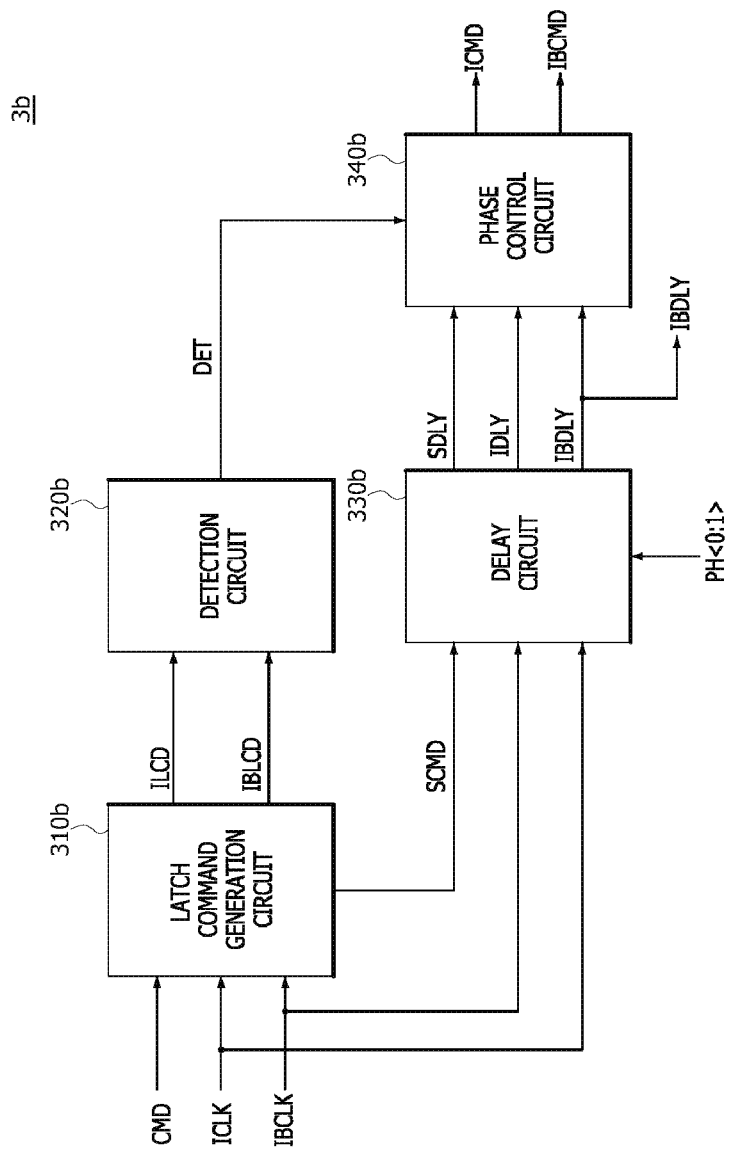
FIG. 50 is a block diagram illustrating an example of the configuration of an internal command generation circuit included in the semiconductor device illustrated in FIG. 49.

Referring to FIG. 50, the internal command generation circuit 3b in accordance with the embodiment of the disclosure may include a latch command generation circuit 310b, a detection circuit 320b, a delay circuit 330b, and a phase control circuit 340b.

Because the latch command generation circuit 310b is implemented by the same circuit and performs the same operation as the latch command generation circuit 310a illustrated in FIG. 43, detailed description thereof will be omitted herein. The latch command generation circuit 310b may be replaced with the latch command generation circuit 310a illustrated in FIG. 43.

Because the detection circuit 320b is implemented by the same circuit and performs the same operation as the detection circuit 320a illustrated in FIG. 43, detailed description thereof will be omitted herein. The detection circuit 320b may be replaced with the detection circuit 320a illustrated in FIG. 43.

The delay circuit 330b may generate a synthesized delay signal SDLY, the first clock delay signal IDLY and the second clock delay signal IBDLY from a synthesized command SCMD, the first internal clock ICLK and the third internal clock IBCLK. The delay circuit 330b may generate the synthesized delay signal SDLY, the first clock delay signal IDLY and the second clock delay signal IBDLY by delaying the synthesized command SCMD, the first internal clock ICLK and the third internal clock IBCLK by a delay amount controlled by the phase control signal PH<0:1>. The delay amount of the delay circuit 330b controlled by the phase control signal PH<0:1> will be described later in detail with reference to FIG. 52.

Because the phase control circuit 340b is implemented by the same circuit and performs the same operation as the phase control circuit 340a illustrated in FIG. 43, detailed description thereof will be omitted herein. The phase control circuit 340b may be replaced with the phase control circuit 340a illustrated in FIG. 43.

Figure 51:
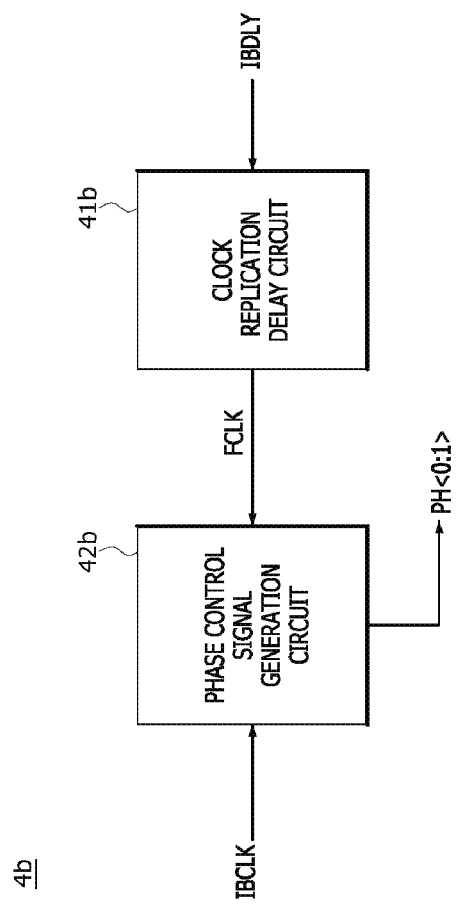
FIG. 51 is a block diagram illustrating an example of the configuration of a delay control circuit included in the semiconductor device illustrated in FIG. 49.

Referring to FIG. 51, the delay control circuit 4b in accordance with the embodiment of the disclosure may include a clock replication delay circuit 41b and a phase control signal generation circuit 42b.

The clock replication delay circuit 41b may delay the second clock delay signal IBDLY and generate a feedback clock FCLK. The delay amount of the clock replication delay circuit 41b may be set to a value obtained by modeling a time required for the second clock delay signal IBDLY generated by delaying the third internal clock IBCLK to reach the data transmission circuit 5b.

The phase control signal generation circuit 42b may generate the phase control signal PH<0:1> by comparing the feedback clock FCLK and the third internal clock IBCLK. The phase control signal generation circuit 42b may control the phase control signal PH<0:1> to increase the delay amount of the delay circuit 330b in the case where the phase of the third internal clock IBCLK is earlier than the phase of the feedback clock FCLK. In the present embodiment, as the logic level combination of the phase control signal PH<0:1> is changed in the order of '00,' '10,' '11,' '01' and '00,' the delay amount of the delay circuit 330b may be increased. For example, as the logic level combination of the phase control signal PH<0:1> is controlled from '00' to '10,' the delay amount of the delay circuit 330b is increased by a period corresponding to half the cycle of the clock CLK, and as the logic level combination of the phase control signal PH<0:1> is controlled from '00' to '11,' the delay amount of the delay circuit 330b is increased by a period corresponding to one cycle of the clock CLK.

While the delay control circuit 4b is implemented to generate the phase control signal PH<0:1> by comparing the phase of the third internal clock IBCLK and the phase of the second clock delay signal IBDLY, the delay control circuit 4b may be implemented to generate the phase control signal PH<0:1> by comparing the phase of the first internal clock ICLK and the phase of the first clock delay signal IDLY.

The delay amount of the delay circuit 330b controlled depending on the phase control signal PH<0:1> will be described below with reference to FIG. 52.

When the logic level combination of the phase control signal PH<0:1> is '00,' the delay circuit 330b may be set to have a first delay amount. The first delay amount may be set to an internal delay amount of the delay circuit 330b.

When the logic level combination of the phase control signal PH<0:1> is '10,' the delay circuit 330b may be set to have a second delay amount. The second delay amount may be set to a delay amount that is increased by a period corresponding to half the cycle of the clock CLK as compared to the first delay amount.

When the logic level combination of the phase control signal PH<0:1> is '11,' the delay circuit 330b may be set to a third delay amount. The third delay amount may be set to a delay amount that is increased by a period corresponding to half the cycle of the clock CLK as compared to the second delay amount.

When the logic level combination of the phase control signal PH<0:1> is '01,' the delay circuit 330b may be set to a fourth delay amount. The fourth delay amount may be set to a delay amount that is increased by a period corresponding to half the cycle of the clock CLK as compared to the third delay amount.

In the semiconductor device 1b in accordance with the embodiment of the disclosure, a synthesized command is generated by synthesizing first and second latch commands which are selectively generated depending on an input time of a command, and first and second internal commands are generated by delaying the synthesized command through one delay circuit. As a consequence, because delay circuits for delaying the first and second internal commands are merged, an area may be reduced. Also, in the semiconductor device 1b in accordance with the embodiment of the disclosure, data is inputted and outputted by detecting an input time of the command and selectively generating the first and second internal commands depending on a detection result. As a consequence, the reliability of data input/output operations may be secured. Further, in the semiconductor device 1b in accordance with the embodiment of the disclosure, a delay amount by which a command and internal clocks are delayed may be continuously controlled, and data is inputted and outputted by internal commands generated from the command with a controlled delay amount. As a consequence, the reliability of data input/output operations may be secured.

While various embodiments have been described above, it will be understood by those skilled in the art that the described embodiments serve as examples only. Accordingly, the semiconductor device described herein should not be limited based on the described embodiments.

What is claimed is:

1. A semiconductor device comprising:
an internal command generation circuit configured to generate a first latch command from a command which is inputted in synchronization with a first internal clock, to generate a second latch command from the command which is inputted in synchronization with a third internal clock, the internal command generation circuit configured to generate a synthesized command by synthesizing the first latch command and the second latch command, and the internal command generation circuit configured to generate a first internal command by delaying the synthesized command when the command is inputted in synchronization with the first internal clock and generate a second internal command by delaying the synthesized command when the command is inputted in synchronization with the third internal clock; and
a data transmission circuit configured to generate transmission data from data in synchronization with the first internal command when the command is inputted in synchronization with the first internal clock and generate the transmission data from the data in synchronization with the second internal command when the command is inputted in synchronization with the third internal clock.

2. The semiconductor device according to claim 1, wherein:
the first internal clock and the third internal clock, are generated as a frequency of a clock is divided;
phases of the first internal clock and the third internal clock are opposite to each other; and
a phase difference between the first internal clock and the third internal clock is set to a period corresponding to one cycle of the clock.

3. The semiconductor device according to claim 1, wherein the internal command generation circuit comprises:
a latch command generation circuit configured to generate the first latch command from the command in synchronization with the first internal clock, to generate the second latch command from the command in synchronization with the third internal clock and generate the synthesized command by synthesizing the first latch command and the second latch command;
a detection circuit configured to generate a detection signal which is enabled depending on logic levels of the first latch command and the second latch command;
a delay circuit configured to generate a synthesized delay signal by delaying the synthesized command, to generate a first clock delay signal by delaying the first internal clock, and to generate a second clock delay signal by delaying the third internal clock; and
a phase control circuit configured to generate the first internal command and the second internal command, which are selectively generated, from the synthesized command by the detection signal.

4. The semiconductor device according to claim 3, wherein the second latch command is generated in synchronization with the first internal clock after the command is inputted in synchronization with the third internal clock.

5. The semiconductor device according to claim 3, wherein:
the detection signal is enabled when the first latch command is inputted; and
the detection signal is disabled when the second latch command is inputted.

6. The semiconductor device according to claim 3, wherein delay amounts of the delay circuit for delaying the synthesized command, the first internal clock, and the third internal clock are set to be the same with one another.

7. The semiconductor device according to claim 3, wherein the phase control circuit comprises:
a transfer command generation circuit configured to output the synthesized delay signal as a first transfer command in synchronization with the second clock delay signal, and output the first transfer command as a second transfer command in synchronization with the first clock delay signal; and a logic circuit configured to generate the first internal command and the second internal command from the first transfer command and the second transfer command depending on a logic level of the detection signal.

8. A semiconductor device comprising:

an internal command generation circuit configured to generate a first latch command from a command in synchronization a first internal clock, to generate a second latch command from the command, in synchronization with a third internal clock, the internal command generation circuit configured to generate a synthesized command by synthesizing the first latch command and the second latch command, the internal command generation circuit configured to delay the synthesized command by a delay amount set by a phase control signal generated by comparing a feedback clock generated by delaying the third internal clock and the third internal clock, and the internal command generation circuit configured to generate a first internal command from the delayed synthesized command when the command is inputted in synchronization with the first internal clock and generate a second internal command from the delayed synthesized command when the command is inputted in synchronization with the third internal clock; and a data transmission circuit configured to generate transmission data from data in synchronization with the first internal command when the command is inputted in synchronization with the first internal clock and generate the transmission data from the data in synchronization with the second internal command when the command is inputted in synchronization with the third internal clock.

9. The semiconductor device according to claim 8, further comprising:

a clock divider circuit configured to generate the first internal clock, a second internal clock, the third internal clock, and a fourth internal clock by dividing a phase of a clock inputted from outside the semiconductor device.

10. The semiconductor device according to claim 9, wherein:

the second internal clock is generated by delaying the first internal clock by one half cycle of the clock;

the third internal clock is generated by delaying the second internal clock by one half cycle of the clock; and the fourth internal clock is generated by delaying the third internal clock by one half cycle of the clock.

11. The semiconductor device according to claim 9, wherein:

the first internal clock and the third internal clock have opposite phases to each other; and the second internal clock and the fourth internal clock have opposite phases to each other.

12. The semiconductor device according to claim 9, wherein the internal command generation circuit comprises:

a latch command generation circuit configured to generate the first latch command from the command in synchronization with the first internal clock, to generate the second latch command from the command in synchronization with the third internal clock, and generate the synthesized command by synthesizing the first latch command and the second latch command;

a detection circuit configured to generate a detection signal which is enabled depending on logic levels of the first latch command and the second latch command;

a delay circuit configured to generate a synthesized delay signal by delaying the synthesized command, to generate a first clock delay signal by delaying the first internal clock and to generate a second clock delay signal by delaying the third internal clock, by the delay amount set by the phase control signal; and a phase control circuit configured to generate the first internal command and the second internal command, which are selectively generated, from the synthesized command by the detection signal.

13. The semiconductor device according to claim 12, wherein the second latch command is generated in synchronization with the first internal clock after the command is inputted in synchronization with the third internal clock.

14. The semiconductor device according to claim 12, wherein:

the detection signal is enabled when the first latch command is inputted; and the detection signal is disabled when the second latch command is inputted.

15. The semiconductor device according to claim 12, wherein:

the delay circuit is set to a first delay amount when the phase control signal is at a first logic level combination; and the delay circuit is set to a second delay amount when the phase control signal is at a second logic level combination.

16. The semiconductor device according to claim 15, wherein the second delay amount is greater than the first delay amount.

17. The semiconductor device according to claim 12, wherein the phase control circuit comprises:

a transfer command generation circuit configured to output the synthesized delay signal as a first transfer command in synchronization with the second clock delay signal, and output the first transfer command as a second transfer command in synchronization with the first clock delay signal; and a logic circuit configured to generate the first internal command and the second internal command from the first transfer command and the second transfer command depending on a logic level of the detection signal.

* * * * *